United States Patent
Wang et al.

(10) Patent No.: US 11,592,722 B2
(45) Date of Patent: *Feb. 28, 2023

(54) ELECTROCHROMIC DEVICES

(71) Applicant: View, Inc., Milpitas, CA (US)

(72) Inventors: Zhongchun Wang, Milpitas, CA (US); Anshu A. Pradhan, Collierville, TN (US); Robert T. Rozbicki, Los Gatos, CA (US)

(73) Assignee: View, Inc., Milpitas, CA (US)

( * ) Notice: Subject to any disclaimer, the term of this patent is extended or adjusted under 35 U.S.C. 154(b) by 242 days.

This patent is subject to a terminal disclaimer.

(21) Appl. No.: 16/782,543

(22) Filed: Feb. 5, 2020

(65) Prior Publication Data

US 2020/0174335 A1  Jun. 4, 2020

Related U.S. Application Data

(60) Continuation of application No. 15/612,928, filed on Jun. 2, 2017, now Pat. No. 10,599,001, which is a (Continued)

(51) Int. Cl.
*G02F 1/1523* (2019.01)
*G02F 1/155* (2006.01)
(Continued)

(52) U.S. Cl.
CPC ........ *G02F 1/1525* (2013.01); *C23C 14/0036* (2013.01); *C23C 14/083* (2013.01); (Continued)

(58) Field of Classification Search
CPC ........ G02F 1/1525; G02F 1/153; G02F 1/155; G02F 1/1508; G02F 2001/1555; (Continued)

(56) References Cited

U.S. PATENT DOCUMENTS 3,840,286 A   10/1974  Kiss
3,971,624 A    7/1976  Bruesch et al.
(Continued)

FOREIGN PATENT DOCUMENTS

AU   2014210572 B2   1/2017
AU   2019229399 B2  12/2020
(Continued)

OTHER PUBLICATIONS

AU Examination report dated Jul. 5, 2022, in Application No. AU2020294239.
(Continued)

*Primary Examiner* — Tuyen Tra
(74) *Attorney, Agent, or Firm* — Weaver Austin Vileneuve & Sampson LLP; Brian D. Griedel

(57) ABSTRACT

Conventional electrochromic devices frequently suffer from poor reliability and poor performance. Improvements are made using entirely solid and inorganic materials. Electrochromic devices are fabricated by forming an ion conducting electronically-insulating interfacial region that serves as an IC layer. In some methods, the interfacial region is formed after formation of an electrochromic and a counter electrode layer. The interfacial region contains an ion conducting electronically-insulating material along with components of the electrochromic and/or the counter electrode layer. Materials and microstructure of the electrochromic devices provide improvements in performance and reliability over conventional devices. In various embodiments, a counter electrode is fabricated to include a base anodically coloring material and one or more additives.

9 Claims, 21 Drawing Sheets

Related U.S. Application Data continuation of application No. 15/004,794, filed on Jan. 22, 2016, now Pat. No. 9,759,975, which is a continuation-in-part of application No. 14/841,511, filed on Aug. 31, 2015, now Pat. No. 9,720,298, and a continuation of application No. PCT/US2015/028899, filed on May 1, 2015, said application No. 14/841,511 is a division of application No. 14/209,993, filed on Mar. 13, 2014, now Pat. No. 9,164,346, which is a continuation of application No. 13/610,684, filed on Sep. 11, 2012, now Pat. No. 8,749,868, which is a continuation of application No. 12/772,075, filed on Apr. 30, 2010, now Pat. No. 8,582,193.

(60) Provisional application No. 61/988,107, filed on May 2, 2014.

(51) Int. Cl.
*C23C 14/08* (2006.01)
*C23C 14/58* (2006.01)
*G02F 1/153* (2006.01)
*H01J 37/34* (2006.01)
*C23C 14/00* (2006.01)
*G02F 1/1506* (2019.01)

(52) U.S. Cl.
CPC .......... *C23C 14/5806* (2013.01); *G02F 1/153* (2013.01); *G02F 1/155* (2013.01); *H01J 37/3405* (2013.01); *H01J 37/347* (2013.01); *H01J 37/3408* (2013.01); *H01J 37/3417* (2013.01); *H01J 37/3423* (2013.01); *H01J 37/3429* (2013.01); *H01J 37/3435* (2013.01); *G02F 1/1508* (2013.01); *G02F 2001/1555* (2013.01)

(58) Field of Classification Search
CPC ............... H01J 37/3405; H01J 37/3408; H01J 37/3417; H01J 37/3423; H01J 37/3429; H01J 37/3435; H01J 37/347
USPC .................................................. 359/265–275
See application file for complete search history.

(56) References Cited

U.S. PATENT DOCUMENTS

| | | |
|---|---|---|
| 4,009,935 A | 3/1977 | Faughnan et al. |
| 4,193,670 A | 3/1980 | Giglia et al. |
| 4,264,150 A | 4/1981 | Yano et al. |
| 4,293,194 A | 10/1981 | Takahashi |
| 4,297,006 A | 10/1981 | Bissar |
| 4,396,253 A | 8/1983 | Kuwagaki et al. |
| 4,482,216 A | 11/1984 | Hashimoto |
| 4,561,729 A | 12/1985 | Heinz et al. |
| 4,832,463 A | 5/1989 | Goldner et al. |
| 4,851,095 A | 7/1989 | Scobey et al. |
| 4,923,289 A | 5/1990 | Demiryont |
| 4,938,571 A | 7/1990 | Cogan et al. |
| 5,019,420 A | 5/1991 | Rauh |
| 5,124,832 A | 6/1992 | Greenberg et al. |
| 5,130,841 A | 7/1992 | Demiryont |
| 5,138,481 A | 8/1992 | Demiryont |
| 5,142,406 A | 8/1992 | Lampert et al. |
| 5,168,003 A | 12/1992 | Proscia |
| 5,209,980 A | 5/1993 | Spindler |
| 5,216,536 A | 6/1993 | Agrawal et al. |
| 5,657,150 A | 8/1997 | Kailman et al. |
| 5,659,417 A | 8/1997 | Van Dine et al. |
| 5,666,771 A | 9/1997 | Macquart et al. |
| 5,668,663 A | 9/1997 | Varaprasad et al. |
| 5,699,192 A | 12/1997 | Van Dine et al. |
| 5,724,175 A | 3/1998 | Hichwa et al. |
| 5,724,177 A | 3/1998 | Ellis, Jr. et al. |
| 5,754,329 A | 5/1998 | Coleman |
| 5,757,537 A | 5/1998 | Ellis, Jr. et al. |
| 5,814,195 A | 9/1998 | Lehan et al. |
| 5,831,760 A | 11/1998 | Hashimoto et al. |
| 5,847,858 A | 12/1998 | Krings et al. |
| 5,859,723 A | 1/1999 | Jodicke et al. |
| 5,910,854 A | 6/1999 | Varaprasad |
| 6,020,987 A | 2/2000 | Baumann et al. |
| 6,178,034 B1 | 1/2001 | Allemand |
| 6,185,034 B1 | 2/2001 | Nakamura et al. |
| 6,211,995 B1 | 4/2001 | Azens et al. |
| 6,266,177 B1 | 7/2001 | Allemand et al. |
| 6,277,523 B1 | 8/2001 | Giron |
| 6,337,758 B1 | 1/2002 | Beteille et al. |
| 6,515,787 B1 | 2/2003 | Westfall et al. |
| 6,529,308 B2 | 3/2003 | Beteille et al. |
| 6,559,411 B2 | 5/2003 | Borgeson et al. |
| 6,791,737 B2 | 9/2004 | Giron |
| 6,791,738 B2 | 9/2004 | Reynolds et al. |
| 6,822,778 B2 | 11/2004 | Westfall et al. |
| 6,856,444 B2 | 2/2005 | Ingalls et al. |
| 6,859,297 B2 | 2/2005 | Lee et al. |
| 6,919,530 B2 | 7/2005 | Borgeson et al. |
| 6,940,628 B2 | 9/2005 | Giron |
| 7,099,062 B2 | 8/2006 | Azens et al. |
| 7,193,763 B2 | 3/2007 | Beteille et al. |
| 7,230,748 B2 | 6/2007 | Giron et al. |
| 7,265,891 B1 | 9/2007 | Demiryont |
| 7,277,215 B2 | 10/2007 | Greer |
| 7,372,610 B2 | 5/2008 | Burdis et al. |
| 7,531,101 B2 | 5/2009 | Beteille |
| 7,564,611 B2 | 7/2009 | Jang et al. |
| 7,593,154 B2 | 9/2009 | Burdis et al. |
| 7,604,717 B2 | 10/2009 | Beteille et al. |
| 7,646,526 B1 | 1/2010 | Wang et al. |
| 7,704,555 B2 | 4/2010 | Demiryont |
| 7,830,585 B2 | 11/2010 | Widjaja et al. |
| 7,869,114 B2 | 1/2011 | Valentin et al. |
| 7,894,120 B2 | 2/2011 | Valentin et al. |
| 8,004,744 B2 | 8/2011 | Burdis et al. |
| 8,031,389 B2 | 10/2011 | Wang et al. |
| 8,168,265 B2 | 5/2012 | Kwak et al. |
| 8,228,592 B2 | 7/2012 | Wang et al. |
| 8,300,298 B2 | 10/2012 | Wang et al. |
| 8,432,603 B2 | 4/2013 | Wang et al. |
| 8,582,193 B2 | 11/2013 | Wang et al. |
| 8,638,487 B2 | 1/2014 | Veerasamy |
| 8,687,261 B2 | 4/2014 | Gillaspie et al. |
| 8,749,868 B2 | 6/2014 | Wang et al. |
| 8,758,575 B2 | 6/2014 | Wang et al. |
| 8,764,950 B2 | 7/2014 | Wang et al. |
| 8,764,951 B2 | 7/2014 | Wang et al. |
| 8,773,747 B2 | 7/2014 | Ferreira et al. |
| 9,007,674 B2 | 4/2015 | Kailasam et al. |
| 9,116,409 B1 | 8/2015 | Sun et al. |
| 9,140,951 B2 | 9/2015 | Wang et al. |
| 9,164,346 B2 | 10/2015 | Wang et al. |
| 9,261,751 B2 | 2/2016 | Pradhan et al. |
| 9,334,557 B2 | 5/2016 | Neudecker et al. |
| 9,454,053 B2 | 9/2016 | Strong et al. |
| 9,477,129 B2 | 10/2016 | Kozlowski et al. |
| 9,664,974 B2 | 5/2017 | Kozlowski et al. |
| 9,671,664 B2 | 6/2017 | Pradhan et al. |
| 9,720,298 B2 | 8/2017 | Wang et al. |
| 9,759,975 B2 | 9/2017 | Wang et al. |
| 9,904,138 B2 | 2/2018 | Kailasam et al. |
| 10,054,833 B2 | 8/2018 | Kailasam et al. |
| 10,088,729 B2 | 10/2018 | Wang et al. |
| 10,156,762 B2 | 12/2018 | Gillaspie et al. |
| 10,185,197 B2 | 1/2019 | Pradhan et al. |
| 10,228,601 B2 | 3/2019 | Gillaspie et al. |
| 10,254,615 B2 | 4/2019 | Kailasam et al. |
| 10,261,381 B2 | 4/2019 | Pradhan et al. |
| 10,288,969 B2 | 5/2019 | Kailasam et al. |
| 10,345,671 B2 | 7/2019 | Gillaspie et al. |
| 10,585,321 B2 | 3/2020 | Gillaspie et al. |
| 10,591,795 B2 | 3/2020 | Gillaspie et al. |
| 10,591,797 B2 | 3/2020 | Wang et al. |

(56) References Cited

U.S. PATENT DOCUMENTS

| | | |
|---|---|---|
| 10,599,001 B2 | 3/2020 | Wang et al. |
| 10,663,830 B2 | 5/2020 | Pradhan et al. |
| 10,684,523 B2 | 6/2020 | Gillaspie et al. |
| 10,690,987 B2 | 6/2020 | Gillaspie et al. |
| 10,852,613 B2 | 12/2020 | Pradhan et al. |
| 10,877,348 B2 | 12/2020 | Kang et al. |
| 10,996,533 B2 | 5/2021 | Pradhan et al. |
| 11,187,954 B2 | 11/2021 | Rozbicki et al. |
| 11,327,382 B2 | 5/2022 | Gillaspie et al. |
| 11,370,699 B2 | 6/2022 | Gillaspie et al. |
| 11,409,177 B2 | 8/2022 | Gillaspie et al. |
| 11,422,426 B2 | 8/2022 | Gillaspie et al. |
| 11,440,838 B2 | 9/2022 | Pradhan et al. |
| 2003/0010957 A1 | 1/2003 | Haering et al. |
| 2003/0156313 A1 | 8/2003 | Serra et al. |
| 2004/0150867 A1 | 8/2004 | Lee et al. |
| 2005/0147825 A1 | 7/2005 | Arnaud et al. |
| 2005/0259310 A1 | 11/2005 | Giri et al. |
| 2006/0209383 A1 | 9/2006 | Burdis et al. |
| 2007/0008603 A1 | 1/2007 | Sotzing et al. |
| 2007/0008605 A1 | 1/2007 | Garg et al. |
| 2007/0097481 A1 | 5/2007 | Burdis et al. |
| 2007/0292606 A1 | 12/2007 | Demiryont |
| 2008/0304130 A1 | 12/2008 | Nguyen |
| 2008/0304131 A1 | 12/2008 | Nguyen |
| 2009/0057137 A1 | 3/2009 | Pitts et al. |
| 2009/0285978 A1 | 11/2009 | Burdis et al. |
| 2009/0304912 A1 | 12/2009 | Kwak et al. |
| 2009/0323156 A1 | 12/2009 | Shin et al. |
| 2009/0323158 A1 | 12/2009 | Wang et al. |
| 2010/0007937 A1 | 1/2010 | Widjaja et al. |
| 2010/0079844 A1 | 4/2010 | Kurman et al. |
| 2010/0103496 A1 | 4/2010 | Schwendeman et al. |
| 2010/0165440 A1 | 7/2010 | Nguyen et al. |
| 2010/0243427 A1 | 9/2010 | Kozlowski et al. |
| 2010/0245973 A1 | 9/2010 | Wang et al. |
| 2011/0043885 A1 | 2/2011 | Lamine et al. |
| 2011/0043886 A1 | 2/2011 | Jeon et al. |
| 2011/0051220 A1 | 3/2011 | Lee |
| 2011/0151283 A1 | 6/2011 | Gillaspie et al. |
| 2011/0211247 A1 | 9/2011 | Kozlowski et al. |
| 2011/0249314 A1 | 10/2011 | Wang et al. |
| 2011/0266137 A1 | 11/2011 | Wang et al. |
| 2011/0266138 A1 | 11/2011 | Wang et al. |
| 2011/0267674 A1 | 11/2011 | Wang et al. |
| 2011/0267675 A1 | 11/2011 | Wang et al. |
| 2011/0297535 A1 | 12/2011 | Higdon et al. |
| 2011/0299149 A1 | 12/2011 | Park et al. |
| 2012/0181167 A1 | 7/2012 | Jiang et al. |
| 2012/0200908 A1 | 8/2012 | Bergh et al. |
| 2012/0218621 A1 | 8/2012 | Kwak et al. |
| 2012/0275008 A1 | 11/2012 | Pradhan et al. |
| 2012/0276734 A1 | 11/2012 | Van Mol et al. |
| 2013/0003157 A1 | 1/2013 | Wang et al. |
| 2013/0016417 A1 | 1/2013 | Veerasamy |
| 2013/0101751 A1 | 4/2013 | Berland et al. |
| 2013/0182307 A1 | 7/2013 | Gillaspie et al. |
| 2013/0270105 A1 | 10/2013 | Wang et al. |
| 2013/0286459 A1 | 10/2013 | Burdis et al. |
| 2014/0022621 A1 | 1/2014 | Kailasam et al. |
| 2014/0177027 A1 | 6/2014 | Wang et al. |
| 2014/0204444 A1 | 7/2014 | Choi et al. |
| 2014/0204445 A1 | 7/2014 | Choi et al. |
| 2014/0204446 A1 | 7/2014 | Choi et al. |
| 2014/0204447 A1 | 7/2014 | Choi et al. |
| 2014/0204448 A1 | 7/2014 | Bergh et al. |
| 2014/0205746 A1 | 7/2014 | Choi et al. |
| 2014/0205748 A1 | 7/2014 | Choi et al. |
| 2014/0313561 A1 | 10/2014 | Wang et al. |
| 2014/0329006 A1 | 11/2014 | Bhatnagar et al. |
| 2015/0131140 A1 | 5/2015 | Kailasam et al. |
| 2015/0362763 A1 | 12/2015 | Wheeler et al. |
| 2015/0370139 A1 | 12/2015 | Wang et al. |
| 2016/0011480 A1 | 1/2016 | Pradhan et al. |
| 2016/0026055 A1 | 1/2016 | Choi et al. |
| 2016/0209722 A1 | 7/2016 | Wang et al. |
| 2017/0003564 A1 | 1/2017 | Gillaspie et al. |
| 2017/0097552 A1 | 4/2017 | Pradhan et al. |
| 2017/0176832 A1 | 6/2017 | Pradhan et al. |
| 2017/0184937 A1 | 6/2017 | Wang et al. |
| 2017/0255076 A1 | 9/2017 | Gillaspie et al. |
| 2017/0299933 A1 | 10/2017 | Kailasam et al. |
| 2017/0329200 A1 | 11/2017 | Wang et al. |
| 2017/0357135 A1 | 12/2017 | Gillaspie et al. |
| 2017/0371221 A1 | 12/2017 | Gillaspie et al. |
| 2018/0052374 A1 | 2/2018 | Wang et al. |
| 2018/0173071 A1 | 6/2018 | Mathew et al. |
| 2018/0203320 A1 | 7/2018 | Kailasam et al. |
| 2018/0231858 A1 | 8/2018 | Kailasam et al. |
| 2019/0064623 A1 | 2/2019 | Gillaspie et al. |
| 2019/0107763 A1 | 4/2019 | Gillaspie et al. |
| 2019/0113819 A1 | 4/2019 | Pradhan et al. |
| 2019/0171078 A1 | 6/2019 | Pradhan et al. |
| 2019/0171079 A1 | 6/2019 | Gillaspie et al. |
| 2019/0187531 A1 | 6/2019 | Pradhan et al. |
| 2019/0302561 A1 | 10/2019 | Rozbicki et al. |
| 2020/0050072 A1 | 2/2020 | Kozlowski et al. |
| 2020/0096830 A1 | 3/2020 | Sarrach et al. |
| 2020/0124933 A1 | 4/2020 | Kozlowski et al. |
| 2020/0133088 A1 | 4/2020 | Gillaspie et al. |
| 2020/0166817 A1 | 5/2020 | Wang et al. |
| 2020/0174332 A1 | 6/2020 | Gillaspie et al. |
| 2020/0257178 A1 | 8/2020 | Pradhan et al. |
| 2020/0272014 A1 | 8/2020 | Gillaspie et al. |
| 2020/0278588 A1 | 9/2020 | Gillaspie et al. |
| 2021/0055618 A1 | 2/2021 | Pradhan et al. |
| 2021/0191215 A1 | 6/2021 | Pradhan et al. |
| 2021/0247654 A1 | 8/2021 | Mogensen et al. |
| 2021/0269706 A1 | 9/2021 | Meshcheryakov et al. |
| 2021/0373401 A1 | 12/2021 | Wang et al. |
| 2022/0055943 A1 | 2/2022 | Kozlowski et al. |
| 2022/0066274 A1 | 3/2022 | Rozbicki |
| 2022/0204398 A1 | 6/2022 | Gillaspie et al. |
| 2022/0260885 A1 | 8/2022 | Gillaspie et al. |
| 2022/0308416 A1 | 9/2022 | Rozbicki et al. |
| 2022/0334442 A1 | 10/2022 | Gillaspie et al. |
| 2022/0350217 A1 | 11/2022 | Gillaspie et al. |
| 2022/0388900 A1 | 12/2022 | Pradhan et al. |

FOREIGN PATENT DOCUMENTS

| | | |
|---|---|---|
| AU | 2015353823 B2 | 2/2021 |
| CN | 1207182 A | 2/1999 |
| CN | 1245540 A | 2/2000 |
| CN | 1350048 A | 5/2002 |
| CN | 1476548 A | 2/2004 |
| CN | 1492274 A | 4/2004 |
| CN | 101188886 A | 5/2005 |
| CN | 1688923 A | 10/2005 |
| CN | 1710481 A | 12/2005 |
| CN | 1738885 A | 2/2006 |
| CN | 1739057 A | 2/2006 |
| CN | 101310217 A | 11/2008 |
| CN | 101322069 A | 12/2008 |
| CN | 100462830 C | 2/2009 |
| CN | 101377599 A | 3/2009 |
| CN | 101419374 A | 4/2009 |
| CN | 101634790 A | 1/2010 |
| CN | 101833932 A | 9/2010 |
| CN | 101930142 A | 12/2010 |
| CN | 102099736 A | 6/2011 |
| CN | 102230172 A | 11/2011 |
| CN | 102376379 A | 3/2012 |
| CN | 102388340 A | 3/2012 |
| CN | 102388341 A | 3/2012 |
| CN | 102414610 A | 4/2012 |
| CN | 102455560 A | 5/2012 |
| CN | 102478739 A | 5/2012 |
| CN | 102576818 A | 7/2012 |
| CN | 102666778 A | 9/2012 |
| CN | 102934009 A | 2/2013 |
| CN | 102998870 A | 3/2013 |
| CN | 103135306 A | 6/2013 |
| CN | 103168269 A | 6/2013 |

(56) References Cited

FOREIGN PATENT DOCUMENTS

| | | |
|---|---|---|
| CN | 104040417 A | 9/2014 |
| CN | 104321497 A | 1/2015 |
| CN | 104364707 A | 2/2015 |
| CN | 1928685 A | 3/2017 |
| EP | 0497616 A2 | 5/1992 |
| EP | 0497616 B1 | 7/1999 |
| EP | 1918412 A1 | 5/2008 |
| JP | S5050892 A | 5/1975 |
| JP | S55-124440 U | 9/1980 |
| JP | S57-81242 A | 5/1982 |
| JP | S58-33223 A | 2/1983 |
| JP | S58-139128 A | 8/1983 |
| JP | S58-163921 A | 9/1983 |
| JP | S59-040625 A | 3/1984 |
| JP | S60-066238 A | 4/1985 |
| JP | S60-078423 A | 5/1985 |
| JP | S60-078424 A | 5/1985 |
| JP | S60-202429 A | 10/1985 |
| JP | H03-500096 A | 1/1991 |
| JP | H04-211227 A | 8/1992 |
| JP | H05-182512 A | 7/1993 |
| JP | H09152634 A | 6/1997 |
| JP | H10-501847 A | 2/1998 |
| JP | H1193827 A | 4/1999 |
| JP | 2004205628 A | 7/2004 |
| JP | 2004-309926 A | 11/2004 |
| JP | 2005091788 A | 4/2005 |
| JP | 10-2006-0092362 | 8/2006 |
| JP | 2006-235632 A | 9/2006 |
| JP | 2007/108750 A | 4/2007 |
| JP | 2008-026605 A | 2/2008 |
| JP | 2008/197679 A | 8/2008 |
| JP | 2008216744 A | 9/2008 |
| JP | 2009009145 A | 1/2009 |
| JP | 2010-509720 A | 3/2010 |
| JP | 2012-523018 A | 9/2012 |
| JP | 2012523019 A | 9/2012 |
| JP | 2013-525860 A | 6/2013 |
| JP | 2014052510 A | 3/2014 |
| KR | 10-2008-0051280 | 6/2008 |
| KR | 20110100457 A | 9/2011 |
| KR | 10-2014-0068026 A | 6/2014 |
| KR | 101535100 B1 | 7/2015 |
| KR | 10-2010733 B1 | 8/2019 |
| KR | 10-2010755 B1 | 8/2019 |
| RU | 2117972 C1 | 8/1998 |
| TW | 490391 B | 6/2002 |
| TW | 200417280 A | 9/2004 |
| TW | M338359 | 8/2008 |
| TW | 200839402 A | 10/2008 |
| TW | 2014/35464 A | 9/2014 |
| TW | 2014/39371 A | 10/2014 |
| WO | WO98/47613 A1 | 10/1998 |
| WO | WO2004/087985 A2 | 10/2004 |
| WO | WO2008/055824 | 5/2008 |
| WO | WO2008/154517 A2 | 12/2008 |
| WO | WO2009/000547 A2 | 12/2008 |
| WO | WO2009/029111 A1 | 3/2009 |
| WO | WO-2009108184 A1 | 9/2009 |
| WO | WO-2009115424 A1 | 9/2009 |
| WO | WO2009/148861 | 12/2009 |
| WO | WO2010/120537 A2 | 10/2010 |
| WO | WO2010/147494 A1 | 12/2010 |
| WO | WO2012/138281 | 10/2012 |
| WO | WO2013/054367 A1 | 4/2013 |
| WO | WO2014/025876 A2 | 2/2014 |
| WO | WO2014/025900 | 2/2014 |
| WO | WO2014/113795 A1 | 7/2014 |
| WO | WO2014/113796 A1 | 7/2014 |
| WO | WO2014/113801 A1 | 7/2014 |
| WO | WO-2014201287 A1 | 12/2014 |
| WO | WO2015/168166 A1 | 11/2015 |
| WO | WO-2017011272 A1 | 1/2017 |
| WO | WO-2020247831 A1 | 12/2020 |

OTHER PUBLICATIONS

AU Office Action dated Jun. 23, 2022 in Application No. AU20210202495.
CA Office Action dated Jun. 9, 2022, in Application No. CA2992423.
Co-pending U.S. Appl. No. 17/596,266, filed on Dec. 6, 2021.
EP Office Action dated Mar. 16, 2022, in Application No. EP15862207.6.
JP Office Action dated Mar. 1, 2022, in Application No. JP2021-013861.
TW Office Action dated Mar. 29, 2022, in Application No. TW110125561 with English translation.
TW Office Action dated Mar. 29, 2022, in Application No. TW110134875 with English translation.
U.S. Notice of Allowance dated Jul. 11, 2022 in U.S. Appl. No. 16/774,621.
U.S. Corrected Notice of Allowance dated May 11, 2022 in U.S. Appl. No. 16/879,255.
U.S Non-Final Office Action dated Jun. 10, 2022, in U.S. Appl. No. 16/660,660.
U.S. Notice of Allowance dated Apr. 11, 2022 in U.S. Appl. No. 16/785,547.
U.S. Notice of Allowance dated Apr. 15, 2022 in U.S. Appl. No. 16/879,255.
U.S. Notice of Allowance dated Apr. 5, 2022, in U.S. Appl. No. 15/931,359.
U.S. Notice of Allowance dated May 13, 2022 in U.S. Appl. No. 16/859,856.
U.S. Office Action dated Mar. 16, 2022, in U.S. Appl. No. 16/719,700.
U.S. Appl. No. 17/656,367, filed Mar. 24, 2022.
U.S. Appl. No. 17/696,783, filed Mar. 16, 2022.
U.S. Appl. No. 17/804,515, inventors Gillaspie et al., filed on May 27, 2022.
Wikipedia webpage "Doping (semiconductors)" (Year: 2008).
Wikipedia webpage "Non-stoichiometric compound" (Year: 2008).
US Office Action, dated Apr. 26, 2012, issued in U.S. Appl. No. 12/772,055.
US Notice of Allowance, dated Sep. 18, 2012, issued in U.S. Appl. No. 12/772,055.
US Office Action dated Jan. 20, 2012 issued in U.S. Appl. No. 12/772,075.
US Office Action dated Aug. 16, 2012 issued in U.S. Appl. No. 12/772,075.
US Office Action dated Dec. 26, 2012 in U.S. Appl. No. 12/772,075.
US Notice of Allowance dated Jul. 10, 2013 in U.S. Appl. No. 12/772,075.
US Office Action dated Jun. 25, 2013 in U.S. Appl. No. 13/610,684.
US Notice of Allowance dated Jan. 21, 2014 in U.S. Appl. No. 13/610,684.
US Office Action dated Aug. 6, 2014 in U.S. Appl. No. 14/052,455.
US Notice of Allowance dated Jan. 22, 2015 in U.S. Appl. No. 14/052,455.
US Notice of Allowance dated May 11, 2015 in U.S. Appl. No. 14/052,455.
US Notice of Allowance dated May 28, 2015 in U.S. Appl. No. 14/209,993.
US Notice of Allowance dated Aug. 4, 2015 in U.S. Appl. No. 14/209,993.
US Office Action dated Jul. 28, 2016 in U.S. Appl. No. 14/841,511.
US Notice of Allowance dated Jan. 11, 2017 in U.S. Appl. No. 14/841,511.
US Notice of Allowance dated May 22, 2018 in U.S. Appl. No. 15/457,609.
US Office Action dated Dec. 31, 2018 in U.S. Appl. No. 15/795,843.
US Notice of Allowance dated Jul. 17, 2019 in U.S. Appl. No. 15/795,843.
US Notice of Allowance dated Dec. 3, 2019 in U.S. Appl. No. 15/795,843.
US Office Action dated Oct. 25, 2011 issued in U.S. Appl. No. 13/166,537.
US Office Action dated Feb. 16, 2012 issued in U.S. Appl. No. 13/166,537.

(56) References Cited

OTHER PUBLICATIONS

US Notice of Allowance dated May 31, 2012 issued in U.S. Appl. No. 13/166,537.
US Notice of Allowance dated Feb. 14, 2014 for U.S. Appl. No. 13/627,798.
US Office Action dated 20, 2012 in U.S. Appl. No. 12/814,277.
US Final Office Action dated Jun. 27, 2013 in U.S. Appl. No. 12/814,277.
US Notice of Allowance dated Mar. 12, 2014 in U.S. Appl. No. 12/814,277.
US Office Action dated Nov. 20, 2012 in U.S. Appl. No. 12/814,279.
US Final Office Action dated Jun. 27, 2013 in U.S. Appl. No. 12/814,279.
US Notice of Allowance dated Mar. 17, 2014 in U.S. Appl. No. 12/814,279.
US Office Action dated Jan. 14, 2015 in U.S. Appl. No. 13/462,725.
US Final Office Action dated Jul. 23, 2015 in U.S. Appl. No. 13/462,725.
US Notice of Allowance dated Nov. 25, 2015 in U.S. Appl. No. 13/462,725.
US Office Action dated Aug. 12, 2016 in U.S. Appl. No. 14/683,541.
US Notice of Allowance dated Jan. 27, 2017 in U.S. Appl. No. 14/683,541.
US Notice of Allowance (corrected) dated Feb. 27, 2017 in U.S. Appl. No. 14/683,541.
US Office Action dated Apr. 5, 2018 in U.S. Appl. No. 15/441,130.
US Notice of Allowance dated Oct. 31, 2018 in U.S. Appl. No. 15/441,130.
US Office Action dated Dec. 30, 2016 in U.S. Appl. No. 15/004,794.
US Office Action dated Jun. 27, 2018 in U.S. Appl. No. 15/612,928.
US Office Action dated Jan. 23, 2019 in U.S. Appl. No. 15/612,928.
US Notice of Allowance dated Jul. 26, 2019 in U.S. Appl. No. 15/612,928.
US Notice of Allowance dated Dec. 19, 2019 in U.S. Appl. No. 15/612,928.
US Notice of Allowance dated Apr. 12, 2017 in U.S. Appl. No. 15/004,794.
US Notice of Allowance dated Aug. 9, 2017 in U.S. Appl. No. 15/004,794.
Australian Examination Report dated Jan. 6, 2014 in AU Application No. 2011245431.
Australian Examination Report dated Apr. 19, 2016 in AU Application No. 2014210572.
Australian Examination Report dated Jun. 7, 2018 in AU Application No. 2017202249.
Australian Examination Report dated Dec. 17, 2018 in AU Application No. 2017202249.
Australian Examination Report dated Mar. 18, 2019 in AU Application No. 2017202249.
Chinese Office Action mailed Jan. 8, 2015 in CN Application No. CN201180027892.9.
Chinese Office Action dated Aug. 31, 2015 in CN Application No. CN201180027892.9.
Chinese Office Action dated Mar. 31, 2016 in CN Application No. CN201180027892.9.
Chinese Office Action dated Aug. 28, 2018 in CN Application No. CN201610412630.9.
Chinese Office Action dated Mar. 22, 2019 in CN Application No. CN201610412630.9.
Chinese Office Action dated Sep. 28, 2016 in CN Application No. 2013800319082.
Mexican Office Action dated Jun. 6, 2013 in MX Application No. MX/a/2012/012573.
Indian Office Action dated Jun. 19, 2018 in IN Application No. 3663/KOLNP/2012.
Japanese Office Action dated Jan. 6, 2015 in JP Application No. JP2013-508130.
Japanese Office Action dated Mar. 8, 2016 in JP Application No. JP2015-118553.
Japanese Office Action dated Nov. 21, 2017 in JP Application No. JP2016-215029.
Japanese Office Action dated Mar. 5, 2019 in JP Application No. JP2018-028971.
Korean Office Action dated Feb. 28, 2017 in KR Application No. 10-2012-7031407.
Korean Office Action dated Feb. 8, 2018 in KR Application No. 10-2018-7002491.
Korean Office Action dated Oct. 30, 2018 in KR Application No. 10-2018-7030647.
European Search Report dated May 13, 2014 in EP Application No. 11775488.7.
European Office Action dated Feb. 10, 2017 in EP Application No. 11775488.7.
European Search Report dated Oct. 16, 2017 in EP Application No. 11775488.7.
European Search Report (Partial Supplementary) dated Jan. 8, 2016 in EP Application No. 13785049.1.
European Search Report dated (Extended) dated Apr. 6, 2016 in EP Application No. 13785049.1.
European Search Report dated May 7, 2019 in EP Application No. 13785049.1.
European Search Report (Extended) dated Nov. 28, 2017 in EP Application No. 15785437.3.
European Search Report dated Oct. 23, 2018 in EP Application No. 15785437.3.
Russian Office Action dated Feb. 25, 2015 in RU Application No. 2012151304.
Russian Office Action dated Mar. 12, 2019 in RU Application No. 2015148673.
Singapore Examination Report dated Nov. 5, 2013 in SG Application No. 201208018-0.
Taiwanese Office Action dated May 26, 2016 in TW Application No. 100115201.
Taiwanese Decision of Rejection dated Feb. 24, 2017 in TW Application No. 100115201.
Taiwanese Office Action dated Dec. 7, 2018 in TW Application No. 106128807.
Taiwanese Office Action dated Mar. 25, 2019 in TW Application No. 106128807.
Taiwanese Office Action dated Jul. 22, 2015 in TW Application No. 100115190.
Taiwanese Office Action dated Jun. 1, 2016 in TW Application No. 104144317.
Taiwanese Decision of Rejection dated Nov. 29, 2016 in TW Application No. 104144317.
Taiwanese Office Action dated Oct. 12, 2018 in TW Application No. 104144317.
Taiwanese Search Report dated Oct. 11, 2018 in TW Application No. 106118525.
International Search Report and Written Opinion, dated Sep. 14, 2011, issued in PCT/US2011/033906.
International Preliminary Report on Patentability dated Nov. 15, 2012 in PCT/US2011/033906.
International Search Report and Written Opinion, dated Jul. 7, 2011, issued in PCT/US2011/033822.
International Preliminary Report on Patentability, dated Nov. 15, 2012 in PCT/US2011/033822.
International Search Report and Written Opinion dated Aug. 14, 2013 in PCT/US2013/038481.
International Preliminary Report on Patentability dated Nov. 17, 2016 in PCT/US15/028899.
Chinese Office Action dated Dec. 26, 2018 in CN Application No. 201580032579.2.
Chinese Office Action dated Jul. 2, 2019 in CN Application No. 201580032579.2.
Brazilian Office Action dated Sep. 24, 2019 in BR Application No. 1120120278916.
Taiwanese Office Action dated Aug. 26, 2019 in TW Application No. 108106923.
International Search Report and Written Opinion dated Jul. 9, 2019 in PCT/US19/027931.

(56) References Cited

OTHER PUBLICATIONS

Burdis, et al., "Technology Advancements to Lower Costs of Electrochromic Window Glazings", SAGE Electronics, Inc., DE-PS26-06NT42764, Final Report, dated Apr. 2, 2010.
Velux SageGlass Flyer, 2007, 4 pages.
Hersh, H.N., "Mechanism of Electrochromism in WO3," Applied Physics Letters, vol. 27, No. 12, Dec. 15, 1975, pp. 646-648.
Yoshimura, et al., "Electrochromism in a Thin-Film Device Using $Li_2WO_4$ as an Li-Electrolyte", Japanese Journal of Applied Physics, vol. 22, No. 1, Jan. 1983, pp. 152-156
Vink, et al., "Lithium Trapping at Excess Oxygen in Sputter-Deposited a-WO3 Films", Japanese Journal of Applied Physics, vol. 8, No. 3, Feb. 1, 1999, pp. 1540-1544.
Arvizu, M.A. et al., "Electrochromic W1—X—yTixMoyO3 thin films made by sputter deposition: Large optical modulation, good cycling durability, and approximate color neutrality," Chemistry of Materials [online, just accepted manuscript], Feb. 23, 2017, [retrieved on Feb. 24, 2017]. Retrieved from the internet: <http://pubs.acs.org> <DOI: 10.1021/acs.chemmater.6b05198>.
Preliminary Amendment filed Aug. 3, 2018 in U.S. Appli. No. 15/916,142.
US Office Action dated Aug. 12, 2019 in U.S. Appl. No. 15/916,142.
US Final Office Action dated Jan. 31, 2020 in U.S. Appl. No. 15/916,142.
US Notice of Allowance dated Dec. 4, 2017 for U.S. Appl. No. 15/587,114.
US Notice of Allowance dated Mar. 26, 2018 for U.S. Appl. No. 15/587,114.
US Office Action dated Sep. 11, 2017 for U.S. Appl. No. 15/587,114.
US Notice of Allowance dated Nov. 28, 2018 for U.S. Appl. No. 15/953,327.
US Office Action dated Jul. 10, 2018 for U.S. Appl. No. 15/953,327.
US Notice of Allowance dated Jan. 3, 2019 for U.S. Appl. No. 15/340,853.
US Office Action dated Sep. 20, 2018 for U.S. Appl. No. 15/340,853.
US Notice of Allowance dated Sep. 25, 2018 for U.S. Appl. No. 15/507,734.
US Office Action dated May 15, 2018 for U.S. Appl. No. 15/507,734.
US Notice of Allowance dated Mar. 11, 2019 for U.S. Appl. No. 15/507,734.
US Notice of Allowance dated Sep. 24, 2018 for U.S Appl. No. 15/527,194.
US Office Action dated May 15, 2018 for U.S. Appl. No. 15/527,194.
US Office Action dated Jul. 25, 2019 for U.S. Appl. No. 16/168,587.
US Notice of Allowance dated Oct. 18, 2018 for U.S. Appl. No. 15/526,969.
US Notice of Allowance dated (Corrected) dated Nov. 28, 2018 for U.S. Appl. No. 15/526,969.
US Office Action dated May 25, 2018 for U.S. Appl. No. 15/526,969.
US Office Action dated Feb. 25, 2019 for U.S. Appl. No. 15/204,868.
US Notice of Allowance dated Nov. 21, 2019 for U.S. Appl. No. 15/204,868.
US Office Action dated Jul. 25, 2019 in U.S. Appl. No. 16/284,876.
US Notice of Allowance dated Jan. 23, 2020 for U.S. Appl. No. 16/284,876.
US Office Action dated Jul. 25, 2019 in U.S. Appl. No. 16/088,024.
US Final Office Action dated Jan. 6, 2020 in U.S. Appl. No. 16/088,024.
US Office Action dated Jul. 25, 2019 in U.S. Appl. No. 16/204,540.
US Office Action dated Jul. 10, 2019 in U.S. Appl. No. 16/250,738.
US Notice of Allowance dated Nov. 6, 2019 in U.S. Appl. No. 16/250,738.
US Notice of Allowance dated (corrected) dated Jan. 8, 2020 in U.S. Appl. No. 16/250,738.
International Search Report and Written Opinion dated Aug. 26, 2015 in PCT/US15/28067.
International Preliminary Report on Patentability dated Nov. 17, 2016 in PCT/US15/28067.
International Search Report and Written Opinion (ISA/KR) dated Jul. 7, 2017 in PCT/US17/24120.
International Preliminary Report on Patentability dated Oct. 4, 2018 in PCT/US17/24120.
Chinese Office Action dated Jan. 22, 2020 in CN Application No. 201580053092.2.
European Search Report (Extended) dated Jan. 29, 2018 in EP Application No. 15837472.8.
International Search Report and Written Opinion dated Mar. 18, 2016 in PCT/US15/47891.
International Preliminary Report on Patentability dated Mar. 16, 2017 in PCT/US15/47891.
International Search Report and Written Opinion dated Mar. 7, 2016 in PCT/US15/61995.
International Preliminary Report on Patentability dated Jun. 8, 2017 in PCT/US15/61668.
International Search Report and Written Opinion dated Oct. 18, 2016 in PCT/US16/41375.
International Preliminary Report on Patentability dated Jan. 25, 2018 in PCT/US16/41375.
European Search Report (Extended) dated Dec. 1, 2017 in EP Application No. 15785891.1.
European Search Report (Extended) dated May 2, 2018 in EP Application No. 15862207.6.
European Search Report (Extended) dated May 24, 2018 in EP Application No. 15863517.7.
European Search Report (Extended) dated Dec. 14, 2018 in EP Application No. 16824923.3.
Chinese Office Action dated Dec. 27, 2018 in CN Application No. 201580029451.0.
Chinese Office Action dated Jul. 17, 2019 in CN Application No. 201580029451.0.
European Office Action dated Oct. 10, 2019 in EP Application No. 15785891.1.
Japanese Office Action dated Sep. 24, 2019 in JP Application No. 2017-527761.
Russian Office Action dated Apr. 11, 2019 in RU Application No. 2017120233.
Taiwanese Office Action dated Sep. 20, 2019 in TW Application No. 104139219, with translated search report only.
Taiwanese Office Action dated Sep. 20, 2019 in TW Application No. 104139219, with summary translation.
Russian Search Report dated Nov. 1, 2019 in RU Application No. 2018105193.
Avendano, E. et al., "Electrochromic Nickel-Oxide-Based Films with Minimized Bleached-State Absorptance," I 203rd Meeting of the Electrochemical Society, Electrochemical Society Proceedings vol. 2003-17, 2003, pp. 80-90.
Hutchins, M.G. et al, "The electrochromic behavior of tin-nickel oxide," Solar Energy Materials and Solar Cells, vol. 54, 1998, p. 75-84.
Green, Sara, "Electrochromic nickel-tungsten oxides: optical, electrochemical and structural characterization of sputter-deposited thin films in the whole composition range," Dissertation, Digital Comprehensive Summaries of Uppsala Dissertations from the Faculty of Science and Technology 963, Uppsala University, Sweden, 2012.
U.S. Appl. No. 16/168,587, filed Oct. 23, 2018, Pradhan et al.
U.S. Appl. No. 16/205,084, filed Nov. 29, 2018, Pradhan et al.
U.S. Appl. No. 16/660,660, filed Oct. 22, 2019, Kozlowski et al.
U.S. Appl. No. 16/719,700, filed Dec. 18, 2019, Kozlowski et al.
U.S. Appl. No. 16/721,655, filed Dec. 19, 2019, Gillaspie et al.
U.S. Appl. No. 16/774,621, filed Jan. 28, 2020, Rozbicki et al.
Preliminary Amendment filed Dec. 23, 2019 for U.S. Appl. No. 16/721,655.
AU Examination report dated Feb. 21, 2022, in Application No. AU2020294239.
Australian Examination Report dated May 15, 2020 in AU Application No. 2019229399.
Australian Examination Report dated Sep. 17, 2020 in AU Application No. 2019229399.
Australian Office Action dated Dec. 8, 2020 in AU Application No. 2016294343.
Australian Office Action dated Feb. 19, 2021 in AU Application No. 2016294343.

(56) References Cited

OTHER PUBLICATIONS

Australian Office Action dated Oct. 28, 2020 in AU Application No. 2015353823.
CA Office Action dated Nov. 10, 2021, in Application No. CA2968832.
Chinese Allowance with Search Report dated May 8, 2021 in CN Application No. 201610832436.6—No Translation.
Chinese Decision of Rejection dated Jun. 2, 2021 in CN Application No. 201580072326.8.
Chinese Notice of Allowance with Search Report dated Mar. 17, 2021 in CN Application No. 201680047325.2.
Chinese Office Action dated Apr. 1, 2020 in CN Application No. CN201610832436.6.
Chinese Office Action dated Apr. 7, 2021 in CN Application No. 201810154035.9.
Chinese Office Action dated Aug. 24, 2020 in CN Application No. 201810154035.9.
Chinese Office Action dated Dec. 21, 2020 in CN Application No. 201680047325.2.
Chinese Office Action dated Dec. 3, 2020 in CN Application No. CN201610832436.6.
Chinese Office Action dated Feb. 10, 2021 in CN Application No. 201580072326.8.
Chinese Office Action dated Feb. 19, 2021 in CN Application No. 201580069923.5.
Chinese Office Action dated Jan. 2, 2020 in CN Application No. 201580069923.5.
Chinese Office Action dated Jun. 2, 2020 in CN Application No. 201680047325.2.
Chinese Office Action dated Mar. 17, 2021 in CN Application No. 201680047325.2.
Chinese Office Action dated Mar. 5, 2020 in CN Application No. 201580029451.0.
Chinese Office Action dated Mar. 5, 2020 in CN Application No. 201580032579.2.
Chinese Office Action dated Nov. 4, 2020 in CN Application No. 201580029451.0.
Chinese Office Action dated Sep. 27, 2020 in CN Application No. 201580069923.5.
Chinese Office Action dated Sep. 27, 2020 in CN Application No. 201580072326.8.
Chinese Reexamination dated May 21, 2021 in CN Application No. 201580032579.2.
CN Office Action dated Aug. 3, 2021, in CN Application No. 201810154035.9.
CN Office Action dated Aug. 30, 2021, in CN Application No. 201580032579.2 with English translation.
EP Office Action dated Feb. 11, 2022, in Application No. EP15863517.7.
EP Summons to Attend Oral Proceedings dated Apr. 28, 2020 in EP Application No. 13785049.1.
EP Summons to attend Oral Proceedings dated Oct. 18, 2021 in Application No. 15785891.1.
European Extended Search Report dated Aug. 2, 2021 in EP Application No. 3872563.
European Office Action dated Mar. 12, 2020 in EP Application No. 15862207.6.
European Office Action dated Mar. 13, 2020 in EP Application No. 15863517.7.
European Office Action dated May 11, 2021 in EP Application No. 20153706.5.
European Office Action dated May 3, 2021 in EP Application No. 16824923.3.
European Search Report (Extended) dated Apr. 17, 2020 in EP Application No. 20156430.9.
European Search Report (Extended) dated Mar. 30, 2020 in EP Application No. 20153706.5.
European Search Report (Extended) dated May 26, 2020 in EP Application No. 19206961.5.
Extended European Search Report dated Aug. 2, 2021 for EP Application No. 21169812.1.
IN Examination Report dated Oct. 12, 2021, in application No. IN201838043541.
IN First Examination report dated on Aug. 26, 2021, in application No. IN201717044876.
Indian Hearing Notice dated Oct. 20, 2020 in IN Application No. 3663/KOLNP/2012.
Indian Office Action dated Jun. 30, 2021 in IN Application No. 201737018863.
International Preliminary Report on Patentability dated Dec. 16, 2021, in application No. PCT/US2020/036440.
International Preliminary Report on Patentability dated Novembers, 2020 in PCT/US19/027931.
International Search Report and Written Opinion dated Sep. 21, 2020 in PCT/US2020/036440.
Japanese Decision to Grant dated Mar. 16, 2021 in JP Application No. 2020-067107.
Japanese Office Action dated Apr. 21, 2021 in JP Application No. 2017-527761.
Japanese Office Action dated May 7, 2020 in JP Application No. 2017-564044.
Japanese Office Action dated Sep. 23, 2020 in JP Application No. 2017-527761.
JP Office Action dated Aug. 3, 2021, in Application No. JP2017527761.
JP Office Action dated Dec. 7, 2021, in Application No. JP20200207808.
Kondrachova, L. et al., "Cathodic Electrodeposition of Mixed Molybdenum Tungsten Oxides From Peroxo-polymolybdotungstate Solutions", Langmuir 2006, vol. 22, No. 25, Aug. 31, 2006, pp. 10490-10498.
Korean Notice of Allowance & Search Reported dated May 26, 2021 in KR Application No. 10-2021-7006423.
Korean Office Action dated Sep. 28, 2020 in KR Application No. 10-2019-7024032.
Korean Office Action dated Mar. 24, 2021 in KR Application No. 10-2021-7006423.
KR Office Action dated Jan. 14, 2022, in Application No. KR1020217042357 with English translation.
KR Office Action dated Nov. 25, 2021, in Application No. KR1020177017239 with English translation.
Pennisi, A. et al., "Electrochromic Properties of Tungsten-molybdenum Oxide Electrodes", Solar Energy Materials and Solar Cells, vol. 28, No. 3, Dec. 1, 1992, pp. 233-247, XP000328508.
Preliminary Amendment filed Jul. 13, 2020 for U.S. Appl. No. 15/931,359.
Preliminary Amendment filed Jul. 29, 2020 for U.S. Appl. No. 16/879,255.
Preliminary Amendment filed Jul. 6, 2020 for U.S. Appl. No. 16/859,856.
Taiwanese Allowance with Search Report dated Mar. 12, 2021 in TW Application No. 109123760—No Translation.
Taiwanese Decision of Rejection dated Jul. 7, 2020 in TW Application No. 104139219.
Taiwanese Office Action dated Feb. 18, 2020 in TW Application No. 105122100.
Taiwanese Office Action dated Mar. 12, 2021 in TW Application No. 108135570.
Taiwanese Office Action dated Oct. 15, 2020 in TW Application No. 105122100.
TW Office Action dated Nov. 24, 2021, in Application No. TW105122100 with English translation.
TW Office Action dated Nov. 24, 2021 in Application No. TW110121767 with English translation.
U.S. Corrected Notice of Allowability dated Jan. 25, 2022, in U.S. Appl. No. 16/785,547.
US Final Office Action dated Dec. 14, 2020 in U.S. Appl. No. 15/916,142.
U.S. Final Office Action dated Mar. 7, 2022, in U.S. Appl. No. 15/916,142.
U.S. Non Final Office Action dated Jan. 13, 2022 in U.S. Appl. No. 16/879,255.
US Non-Final Office action dated Oct. 4, 2021, in U.S. Appl. No. 16/721,655.
US Non-Final Office action dated Oct. 4, 2021, in U.S. Appl. No. 16/859,856.

(56) References Cited

OTHER PUBLICATIONS

U.S. Non-Final Office Action dated Oct. 15, 2021 in U.S. Appl. No. 15/931,359.
US Notice of Allowance dated Aug. 19, 2020 U.S. Appl. No. 16/088,024.
US Notice of Allowance dated Dec. 10, 2020 in U.S. Appl. No. 16/205,084.
U.S Notice of Allowance dated Dec. 24, 2021 in U.S. Appl. No. 16/785,547.
US Notice of Allowance dated Feb. 12, 2020 in U.S. Appl. No. 16/168,587.
U.S. Notice of Allowance dated Feb. 23, 2022, in U.S. Appl. No. 16/721,655.
US Notice of Allowance dated Feb. 5, 2020 in U.S. Appl. No. 16/204,540.
U.S. Notice of Allowance dated Jan. 26, 2022, in U.S. Appl. No. 16/859,856.
US Notice of Allowance dated Jul. 22, 2021 in U.S. Appl. No. 16/384,822.
US Office Action dated Aug. 2, 2021 in U.S. Appl. No. 16/785,547.
US Office Action dated Jul. 23, 2021 in U.S. Appl. No. 15/916,142.
US Office Action dated Jun. 16, 2020 in U.S. Appl. No. 15/916,142.
U.S. Appl. No. 17/445,245, Inventors Wang et al., filed on Aug. 17, 2021.
U.S. Restriction Requirement dated Feb. 17, 2022 in U.S. Appl. No. 16/774,621.
AU Examination report dated Aug. 17, 2022, in Application No. AU2020294239.
IN Office Action dated Aug. 26, 2022, in Application No. IN202037048424.
JP Office Action dated Sep. 13, 2022, in Application No. JP2021-013861.
TW Office Action dated Aug. 29, 2022, in Application No. TW110134875 with English translation.
U.S. Corrected Notice of Allowance dated Sep. 21, 2022 in U.S. Appl. No. 16/774,621.
U.S. Non-Final office Action dated Sep. 8, 2022 in U.S. Appl. No. 15/916,142.
U.S Non-Final Office Action dated Jul. 28, 2022, in U.S. Appl. No. 16/949,463.
U.S. Notice of Allowance dated Sep. 6, 2022 in U.S. Appl. No. 16/774,621.
U.S. Appl. No. 17/810,656, inventors Gillaspie et al., filed on Jul. 5, 2022.
U.S. Appl. No. 17/812,734, inventors Gillaspie et al., filed on Jul. 15, 2022.
Extended European search report dated Oct. 31, 2022, in Application No. EP22190639.9.
U.S. Corrected Notice of Allowance dated Nov. 15, 2022 in U.S. Appl. No. 16/774,621.
U.S. Non-Final Office Action dated Oct. 20, 2022, in U.S. Appl. No. 17/452,387.
U.S. Appl. No. 17/816,364, inventors Pradhan et al., filed Jul. 29, 2022.
U.S. Appl. No. 18/050,918, inventors Wang et al., filed Oct. 28, 2022.
KR Office Action dated Dec. 15, 2022, in Application No. KR10-2018-7002665 with English translation.
U.S. Corrected Notice of Allowance dated Dec. 23, 2022 in U.S. Appl. No. 16/949,463.
U.S. Final Office Action dated Dec. 23, 2022 in U.S. Appl. No. 16/660,660.
U.S. Final Office Action dated Dec. 27, 2022 in U.S. Appl. No. 16/719,700.
U.S. Notice of Allowance dated Dec. 5, 2022 in U.S. Appl. No. 16/949,463.
U.S. Appl. No. 18/055,825, inventors Kozlowski et al., filed Nov. 15, 2022.
U.S. Appl. No. 18/153,090, inventors Wang et al., filed Jan. 11, 2023.

ELECTROCHROMIC DEVICES

INCORPORATION BY REFERENCE

An Application Data Sheet is filed concurrently with this specification as part of the present application. Each application that the present application claims benefit of or priority to as identified in the concurrently filed Application Data Sheet is incorporated by reference herein in its entirety and for all purposes.

FIELD

This disclosure relates to electrochromic devices, methods of fabrication, associated apparatus and the like.

BACKGROUND

Electrochromism is a phenomenon in which a material exhibits a reversible electrochemically-mediated change in an optical property when placed in a different electronic state, typically by being subjected to a voltage change. The optical property is typically one or more of color, transmittance, absorbance, and reflectance. One well known electrochromic material, for example, is tungsten oxide ($WO_3$). Tungsten oxide is a cathodic electrochromic material in which a coloration transition, transparent to blue, occurs by electrochemical reduction.

Electrochromic materials may be incorporated into, for example, windows and mirrors. The color, transmittance, absorbance, and/or reflectance of such windows and mirrors may be changed by inducing a change in the electrochromic material. One well known application of electrochromic materials, for example, is the rear view mirror in some cars. In these electrochromic rear view mirrors, the reflectivity of the mirror changes at night so that the headlights of other vehicles are not distracting to the driver.

While electrochromism was discovered in the 1960's, electrochromic devices still unfortunately suffer various problems and have not begun to realize their full commercial potential. Advancements in electrochromic technology, apparatus and related methods of making and/or using them, are needed.

SUMMARY

A typical electrochromic device includes an electrochromic ("EC") electrode layer and a counter electrode ("CE") layer, separated by an ionically conductive ("IC") layer that is highly conductive to ions and highly resistive to electrons. In other words, the ionically conductive layer permits transport of ions but blocks electronic current. As conventionally understood, the ionically conductive layer therefore prevents shorting between the electrochromic layer and the counter electrode layer. The ionically conductive layer allows the electrochromic and counter electrodes to hold a charge and thereby maintain their bleached or colored states. In conventional electrochromic devices, the components form a stack with the ion conducting layer sandwiched between the electrochromic electrode and the counter electrode. The boundaries between these three stack components are defined by abrupt changes in composition and/or microstructure. Thus, the devices have three distinct layers with two abrupt interfaces.

Quite surprisingly, the inventors have discovered that high quality electrochromic devices can be fabricated without depositing an ionically-conducting electronically-insulating layer. In accordance with certain embodiments, the counter electrode and electrochromic electrodes are formed immediately adjacent one another, often in direct contact, without separately depositing an ionically-conducting layer. It is believed that various fabrication processes and/or physical or chemical mechanisms produce an interfacial region between contacting electrochromic and counter electrode layers, and this interfacial region serves at least some functions of an ionically conductive electronically-insulating layer in conventional devices. Certain mechanisms that may be key to forming the interfacial region are described below.

The interfacial region typically, though not necessarily, has a heterogeneous structure that includes at least two discrete components represented by different phases and/or compositions. Further, the interfacial region may include a gradient in these two or more discrete components. The gradient may provide, for example, a variable composition, microstructure, resistivity, dopant concentration (for example, oxygen concentration), and/or stoichiometry.

In addition to the above discoveries, the inventors have observed that in order to improve device reliability, two layers of an electrochromic device, the electrochromic (EC) layer and the counter electrode (CE) layer, can each be fabricated to include defined amounts of lithium. Additionally, careful choice of materials and morphology and/or microstructure of some components of the electrochromic device provide improvements in performance and reliability. In some embodiments, all layers of the device are entirely solid and inorganic.

Consistent with above observations and discoveries, the inventors have discovered that formation of the EC-IC-CE stack need not be done in the conventional sequence, EC→IC→CE or CE→IC→EC, but rather an ion conducting electronically-insulating region, serving as an IC layer, can be formed after formation of the electrochromic layer and the counter electrode layer. That is, the EC-CE (or CE-EC) stack is formed first, then an interfacial region serving some purposes of an IC layer is formed between the EC and CE layers using components of one or both of the EC and CE layers at the interface of the layers. Methods described herein not only reduce fabrication complexity and expense by eliminating one or more process steps, but provide devices showing improved performance characteristics.

In various cases, the counter electrode includes a base anodically coloring electrochromic material (often referred to as a base anodically coloring material) and at least one other additive. In some cases the additive may be one that is a component in a cathodically coloring or electrochromically neutral material. The base anodically coloring electrochromic material may include, for example, cobalt oxide, chromium oxide, iron oxide, iridium oxide, manganese oxide, nickel oxide, rhodium oxide, ruthenium oxide, vanadium oxide, and combinations thereof. The additive may include one or more of silver (Ag), aluminum (Al), arsenic (As), gold (Au), boron (B), barium (Ba), beryllium (Be), bismuth (Bi), calcium (Ca), cadmium (Cd), cerium (Ce), cesium (Cs), copper (Cu), europium (Eu), gallium, (Ga), gadolinium (Gd), germanium (Ge), hafnium (Hf), mercury (Hg), indium (In), potassium (K), lithium (Li), lanthanum (La), magnesium (Mg) molybdenum (Mo), sodium (Na), niobium (Nb), neodymium (Nd), osmium (Os), protactinium (Pa), lead (Pb), palladium (Pd), polonium (Po), promethium (Pm), praseodymium (Pr), platinum (Pt), radium (Ra), rubidium (Rb), rhenium (Re), antimony (Sb), scandium (Sc), selenium (Se), silicon (Si), samarium (Sm), tin (Sn), strontium (Sr), tantalum (Ta), terbium (Tb), technetium (Tc), tellurium (Te), thorium (Th), titanium (Ti), thallium (Tl), uranium (U), tungsten (W), yttrium (Y), zinc (Zn), zirconium (Zr), and combinations thereof. An electrochromic device having such an anodically coloring counter electrode layer may be fabricated such that it is in physical contact with a cathodically coloring electrochromic layer.

In one aspect of the disclosed embodiments, a method of fabricating an electrochromic device is provided, the method including: (a) forming a cathodically coloring layer including a cathodically coloring electrochromic material; (b) forming an anodically coloring layer including an anodically coloring electrochromic material and one or more additives, where the cathodically coloring layer and the anodically coloring layer are in contact with one another and form a stack; and (c) exposing at least one of the cathodically coloring layer and the anodically coloring layer to lithium.

The anodically coloring electrochromic material may in various cases include one or more of the materials selected from the group consisting of: cobalt oxide, chromium oxide, iron oxide, iridium oxide, manganese oxide, nickel oxide, rhodium oxide, ruthenium oxide, vanadium oxide, and combinations thereof. In these or other embodiments, the additive may be selected from the group consisting of: silver (Ag), aluminum (Al), arsenic (As), gold (Au), boron (B), barium (Ba), beryllium (Be), bismuth (Bi), calcium (Ca), cadmium (Cd), cerium (Ce), cesium (Cs), copper (Cu), europium (Eu), gallium, (Ga), gadolinium (Gd), germanium (Ge), hafnium (Hf), mercury (Hg), indium (In), potassium (K), lithium (Li), lanthanum (La), magnesium (Mg), molybdenum (Mo), sodium (Na), niobium (Nb), neodymium (Nd), osmium (Os), protactinium (Pa), lead (Pb), palladium (Pd), promethium (Pm), polonium (Po), praseodymium (Pr), platinum (Pt), radium (Ra), rubidium (Rb), rhenium (Re), antimony (Sb), scandium (Sc), selenium (Se), silicon (Si), samarium (Sm), tin (Sn), strontium (Sr), tantalum (Ta), terbium (Tb), technetium (Tc), tellurium (Te), thorium (Th), titanium (Ti), thallium (Tl), uranium (U), tungsten (W), yttrium (Y), zinc (Zn), and zirconium (Zr), and combinations thereof.

In some cases one or more of the additives may be selected from a particular subset of the additives listed above. In one example at least one additive in the anodically coloring layer is selected from the group consisting of: Al, As, Au, B, Ba, Be, Bi, Ca, Cd, Ce, Cs, Cu, Eu, Ga, Gd, Ge, Hf, Hg, In, K, Li, La, Mg, Mo, Na, Nb, Nd, Os, Pa, Pb, Pd, Po, Pm, Pr, Pt, Rb, Ra, Re, Sb, Sc, Se, Si, Sm, Sn, Sr, Ta, Tb, Tc, Te, Th, Ti, U, W, Y, Zn, Zr, and combinations thereof. In another example, at least one additive is selected from the group consisting of: Ag, As, Au, B, Cd, Cs, Cu, Eu, Ga, Gd, Ge, Hg, Os, Pb, Pd, Pm, Po, Pt, Ra, Rb, Tb, Tc, Th, Ti, and combinations thereof. In a particular example the anodically coloring electrochromic material is nickel oxide. In another example at least one additive is selected from the group consisting of: Ga, Gd, Ge, and combinations thereof. For instance, the additive may include Ga. In another case the additive includes Gd. In another case the additive includes Ge.

In a number of embodiments at least one of the cathodically coloring layer and the anodically coloring layer include a superstoichiometric oxygen portion and a non-superstoichiometric oxygen portion. In some such cases at least one of the cathodically coloring layer and the anodically coloring layer is formed through sputtering with a sputter gas having an oxygen concentration, where the concentration of oxygen in the sputter gas is higher during deposition of the superstoichiometric oxygen portion than during deposition of the non-superstoichiometric oxygen portion. In one example the sputter gas includes between about 40-80% $O_2$ during deposition of the non-superstoichiometric oxygen portion, and where the sputter gas includes between about 70-100% $O_2$ during deposition of the superstoichiometric oxygen portion. The superstoichiometric oxygen portion and the non-superstoichiometric oxygen portion may form a bilayer or graded layer within the cathodically coloring layer and/or within the anodically coloring layer. In these or other embodiments, the electrochromic device may be fabricated without depositing a material that is electronically-insulating and ionically-conducting, as deposited.

The counter electrode may have a particular morphology in some cases. For example, the additive may form a substantially amorphous matrix in the anodically coloring layer, and domains of the anodically coloring electrochromic material may be positioned in the substantially amorphous matrix. In some cases the domains of the anodically coloring electrochromic material may be substantially crystalline.

In a number of embodiments, the method may further include (d) converting at least a portion of the stack to an ion conducting region including an electronically-insulating, ionically-conducting material.

In a further aspect of the disclosed embodiments, an electrochromic device or electrochromic device precursor is provided, the device or device precursor including: (a) a layer of cathodically coloring material; and (b) a layer of anodically coloring material including an anodically coloring electrochromic material and one or more additives, where the layer of cathodically coloring material and the layer of anodically coloring material are in physical contact with one another.

The anodically coloring electrochromic material may include one or more materials selected from the group consisting of: cobalt oxide, chromium oxide, iron oxide, iridium oxide, manganese oxide, nickel oxide, rhodium oxide, ruthenium oxide, vanadium oxide, and mixtures thereof. The additive may be selected from the group consisting of: silver (Ag), aluminum (Al), arsenic (As), gold (Au), boron (B), barium (Ba), beryllium (Be), bismuth (Bi), calcium (Ca), cadmium (Cd), cerium (Ce), cesium (Cs), copper (Cu), europium (Eu), gallium, (Ga), gadolinium (Gd), germanium (Ge), hafnium (Hf), mercury (Hg), indium (In), potassium (K), lithium (Li), lanthanum (La), magnesium (Mg), molybdenum (Mo), sodium (Na), niobium (Nb), neodymium (Nd), osmium (Os), protactinium (Pa), lead (Pb), palladium (Pd), polonium (Po), promethium (Pm), praseodymium (Pr), platinum (Pt), radium (Ra), rubidium (Rb), rhenium (Re), antimony (Sb), scandium (Sc), selenium (Se), silicon (Si), samarium (Sm), tin (Sn), strontium (Sr), tantalum (Ta), terbium (Tb), technetium (Tc), tellurium (Te), thorium (Th), titanium (Ti), thallium (Tl), uranium (U), tungsten (W), yttrium (Y), zinc (Zn), zirconium (Zr), and combinations thereof.

In certain embodiments at least one of the cathodically coloring layer and the anodically coloring layer may include a superstoichiometric oxygen portion and a non-superstoichiometric oxygen portion that form a bilayer or graded layer within the cathodically coloring layer and/or within the anodically coloring layer.

As noted above, in certain cases the counter electrode may have a particular morphology. In some cases, the additive may form a substantially amorphous matrix in the anodically coloring layer, and domains of the anodically coloring electrochromic material may be positioned in the substantially amorphous matrix.

In a number of cases at least one of the additives may be selected from a particular subset of the additives listed above. In one example at least one additive may be selected from the group consisting of: Al, As, Au, B, Ba, Be, Bi, Ca, Cd, Ce, Cs, Cu, Eu, Ga, Gd, Ge, Hf, Hg, In, K, Li, La, Mg, Mo, Na, Nb, Nd, Os, Pa, Pb, Pd, Po, Pm, Pr, Pt, Rb, Ra, Re, Sb, Sc, Se, Si, Sm, Sn, Sr, Ta, Tb, Tc, Te, Th, Ti, U, W, Y, Zn, Zr, and combinations thereof. In another example at least one additive may be selected from the group consisting of: Al, Au, Ga, Gd, Ge, Mg, Nb, Si, Ta, Zr, and combinations thereof. In a further example, at least one additive may be selected from the group consisting of: Al, Au, Ge, Mg, Nb, Si, Ta, Zr, and combinations thereof. For instance, at least one additive may be selected from the group consisting of: Al, Mg, Nb, Si, Ta, Zr, and combinations thereof. In another embodiment, at least one additive may be selected from the group consisting of: Al, Mg, Ta, and combinations thereof. In some cases, at least one additive may be selected from the group consisting of: Bi, In, Mo, Re, Sn, W, and combinations thereof. In these or other cases, at least one additive may be selected from the group consisting of: Al, Be, Ca, Mg, Sb, Si, Ta, U, Y, Zn, Zr, and combinations thereof. In another example, at least one additive may be selected from the group consisting of: Cs, Li, K, Na, Rb, and combinations thereof. In a particular embodiment the anodically coloring electrochromic material may be nickel oxide. In certain implementations, at least one additive may be selected from the group consisting of: Ga, Gd, Ge, and combinations thereof. In one example the additive includes Ga. In these or other cases the additive may include Gd. In further cases the additive may include Ge.

29. The electrochromic device of any of claims 19-28, where the anodically coloring electrochromic material includes a metal selected from the group consisting of: Ir, Ru, Rh, and combinations thereof.

38. The electrochromic device of any of claims 19-37, where the additive includes lithium and one or more third materials selected from the group consisting of: silver (Ag), aluminum (Al), arsenic (As), gold (Au), boron (B), barium (Ba), beryllium (Be), bismuth (Bi), calcium (Ca), cadmium (Cd), cerium (Ce), cesium (Cs), copper (Cu), europium (Eu), gallium, (Ga), gadolinium (Gd), germanium (Ge), hafnium (Hf), mercury (Hg), indium (In), potassium (K), lanthanum (La), magnesium (Mg), molybdenum (Mo), sodium (Na), niobium (Nb), neodymium (Nd), osmium (Os), protactinium (Pa), lead (Pb), palladium (Pd), polonium (Po), promethium (Pm), praseodymium (Pr), platinum (Pt), radium (Ra), rubidium (Rb), rhenium (Re), antimony (Sb), scandium (Sc), selenium (Se), silicon (Si), samarium (Sm), tin (Sn), strontium (Sr), tantalum (Ta), terbium (Tb), technetium (Tc), tellurium (Te), thorium (Th), thallium (Tl), titanium (Ti), uranium (U), tungsten (W), yttrium (Y), zinc (Zn), and zirconium (Zr).

The one or more third material may include a material selected from the group consisting of: La, Mo, Ta, W, Zr, and combinations thereof. In one example, the third material includes Zr and another element selected from the group consisting of: La, Mo, Ta, and combinations thereof. In a number of embodiments, the one or more additives may be present in the counter electrode in oxide form.

In a further aspect of the disclosed embodiments, an apparatus for fabricating an electrochromic device is provided, the apparatus including: (a) an integrated deposition system including: (i) a first deposition station containing a first target including a first material for depositing a layer of a cathodically coloring electrochromic material on the substrate when a substrate is positioned in the first deposition station, and (ii) a second deposition station containing a second target including a second material for depositing a layer of an anodically coloring counter electrode material on the substrate when a substrate is positioned in the second deposition station, where the anodically coloring counter electrode material includes an anodically coloring electrochromic material and one or more additives, the anodically coloring electrochromic material selected from the group consisting of: cobalt oxide, chromium oxide, iron oxide, iridium oxide, manganese oxide, nickel oxide, rhodium oxide, ruthenium oxide, vanadium oxide, and combinations thereof, and where the additive is selected from the group consisting of: silver (Ag), aluminum (Al), arsenic (As), gold (Au), boron (B), barium (Ba), beryllium (Be), bismuth (Bi), calcium (Ca), cadmium (Cd), cerium (Ce), cesium (Cs), copper (Cu), europium (Eu), gallium, (Ga), gadolinium (Gd), germanium (Ge), hafnium (Hf), mercury (Hg), indium (In), potassium (K), lithium (Li), lanthanum (La), magnesium (Mg), molybdenum (Mo), sodium (Na), niobium (Nb), neodymium (Nd), osmium (Os), protactinium (Pa), lead (Pb), palladium (Pd), polonium (Po), promethium (Pm), praseodymium (Pr), platinum (Pt), radium (Ra), rubidium (Rb), rhenium (Re), antimony (Sb), scandium (Sc), selenium (Se), silicon (Si), samarium (Sm), tin (Sn), strontium (Sr), tantalum (Ta), terbium (Tb), technetium (Tc), tellurium (Te), thorium (Th), titanium (Ti), thallium (Tl) uranium (U), tungsten (W), yttrium (Y), zinc (Zn), and zirconium (Zr); and (b) a controller containing program instructions for passing the substrate through the first and second deposition stations in a manner that sequentially deposits a stack on the substrate, the stack including the layer of cathodically coloring electrochromic material in physical contact with the layer of anodically coloring counter electrode material.

In some embodiments the anodically coloring electrochromic material and the one or more additives are each provided on the second target. In some implementations, the anodically coloring electrochromic material may be provided on the second target and the additive may be provided on a third target. In certain embodiments, the anodically coloring electrochromic material may include nickel oxide, and the additive may be selected from the group consisting of Ga, Gd, Ge, and combinations thereof.

These and other features and advantages will be described in further detail below, with reference to the associated drawings.

BRIEF DESCRIPTION OF THE DRAWINGS

The following detailed description can be more fully understood when considered in conjunction with the drawings in which.

DETAILED DESCRIPTION

Figure 1A:
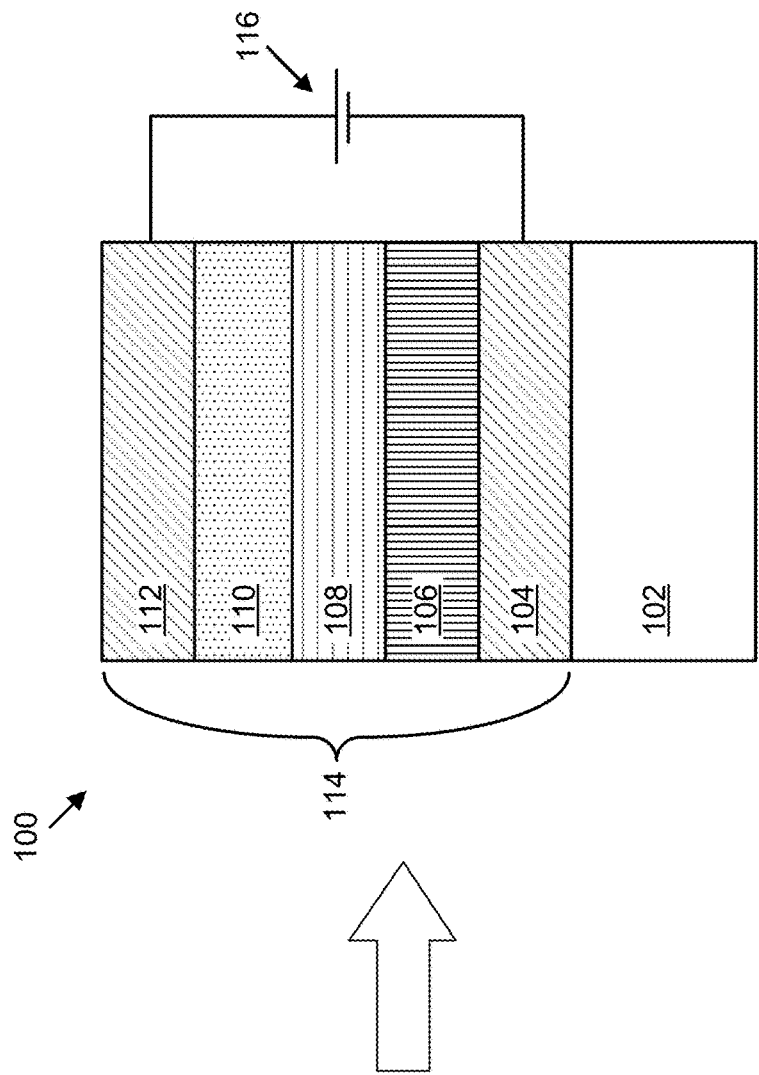
FIG. 1A is a schematic cross-section depicting conventional formation of an electrochromic device stack.

FIG. 1A is a schematic cross-section depicting a conventional electrochromic device stack, 100. Electrochromic device 100 includes a substrate 102, a conductive layer (CL) 104, an electrochromic (EC) layer 106, an ion conducting (IC) layer 108, a counter electrode (CE) layer 110, and a conductive layer (CL) 112. Elements 104, 106, 108, 110, and 112 are collectively referred to as an electrochromic stack 114. Typically, the CL layers are made of a transparent conductive oxide, and are commonly referred to as "TCO" layers. Since the TCO layers are transparent, the coloring behavior of the EC-IC-CE stack is observable through the TCO layers, for example, allowing use of such devices on a window for reversible shading. A voltage source 116, operable to apply an electric potential across electrochromic stack 114, effects the transition of the electrochromic device from, for example, a bleached state (i.e., transparent) to a colored state. The order of the layers may be reversed with respect to the substrate. That is, the layers can be in the following order: substrate, transparent conductive layer, counter electrode layer, ion conducting layer, electrochromic material layer and (another) transparent conductive layer.

Again referring to FIG. 1A, in conventional methods of fabricating an electrochromic stack, the individual layers are deposited one atop the other in a sequential format as depicted in the schematic on the left side of FIG. 1A. That is, TCO layer 104 is deposited on substrate 102. Then EC layer 106 is deposited on TCO 104. Then IC layer 108 is deposited on EC layer 106, followed by deposition of CE layer 110 on IC layer 108, and finally TCO layer 112 on CE layer 110 to form electrochromic device 100. Of course, the order of steps can be reversed to make an "inverted" stack, but the point is that in conventional methods the IC layer is necessarily deposited on the EC layer followed by deposition of the CE layer on the IC layer, or the IC layer is deposited on the CE layer followed by deposition of the EC layer on the IC layer. The transitions between the layers of material in the stack are abrupt.

One notable challenge with above procedure is the processing required to form the IC layer. In some prior approaches it is formed by a sol gel process which is difficult to integrate into a CVD or PVD process employed to form the EC and CE layers. Further, IC layers produced by sol gel and other liquid-based processes are prone to defects that reduce the quality of the device and may need to be removed by, for example, scribing. In other approaches, the IC layer is deposited by PVD from a ceramic target, which can be difficult to fabricate and use.

Figure 1B:
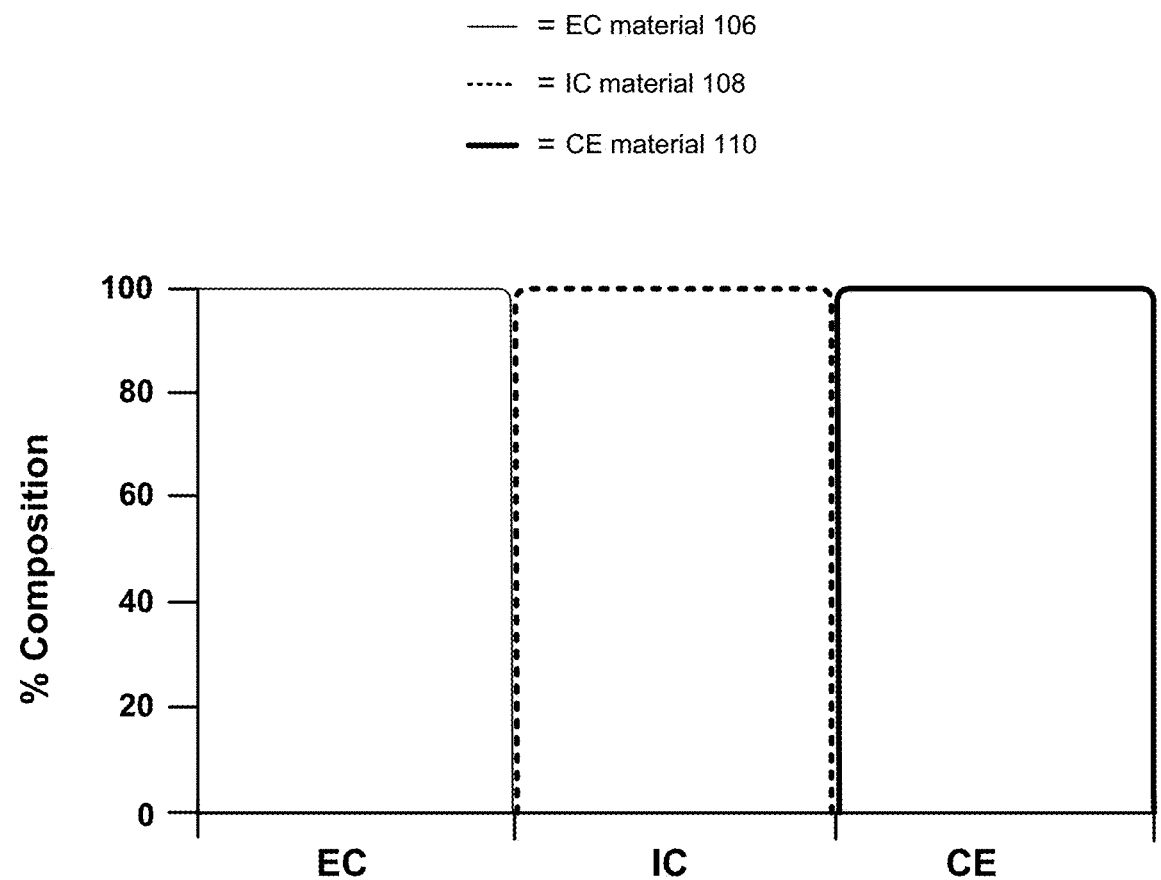
FIG. 1B is a graph showing composition of EC, IC and CE layers in a conventional electrochromic stack.

FIG. 1B is a graph depicting material % composition versus position in the electrochromic stack of FIG. 1A, namely layers 106, 108 and 110, that is, the EC, IC and CE layers. As mentioned, in conventional electrochromic stacks, the transitions between the layers of material in the stack are abrupt. For example, EC material 106 is deposited as a distinct layer with little or no compositional bleed over to the adjacent IC layer. Similarly, IC material 108 and CE material 110 are compositionally distinct with little or no bleed over to adjacent layers. Thus, the materials are substantially homogeneous (except for certain compositions of CE material described below) with abrupt interfaces. Conventional wisdom was that each of the three layers should be laid down as distinct, uniformly deposited and smooth layers to form a stack. The interface between each layer should be "clean" where there is little intermixing of materials from each layer at the interface.

One of ordinary skill in the art would recognize that FIG. 1B is an idealized depiction, and that in a practical sense there is inevitably some degree of material mixing at layer interfaces. The point is, in conventional fabrication methods any such mixing is unintentional and minimal. The inventors have found that interfacial regions serving as IC layers can be formed where the interfacial region includes significant quantities of one or more electrochromic and/or counter electrode materials by design. This is a radical departure from conventional fabrication methods. In certain embodiments, there are no distinct layers as in conventional EC devices, that is, the conventional EC device is replaced with an EC element, that is, a single layer of graded materials that serves the function of an EC device. Various methods of forming these novel constructs are described in more detail below.

For the purposes of this disclosure, an EC device is an electrochromic stack construct, i.e., having more than one layer. An EC element is a single layer graded composition that serves the function of an EC device. It its most basic form, an EC element includes an EC region, an IC region and a CE region, in the form of a single layer graded composition. Thus supplied with, e.g, appropriate ions and when a field is applied across it, an EC element would color or bleach as an EC device would. If such an EC element is sandwiched between two electrode layers, then this would, collectively, constitute an EC device. However, if the EC element itself comprises not only EC, IC and CE regions, but also, e.g., transparent electrode regions, then it is not an EC device, it is an EC element because it is a single layer graded composition serving the function of an EC device. Certain embodiments described herein relate to EC devices, where there are at least two distinct layers in a stack format, while other embodiments relate to EC elements where there is only a single layer graded composition that serves the function of an EC device.

As mentioned above, the inventors have discovered that formation of the EC-IC-CE stack need not be conducted in the conventional sequence, EC→IC→CE or CE→IC→EC, but rather an interfacial region serving as the ion conducting layer can be formed after deposition of the electrochromic layer and the counter electrode layer. That is, the EC-CE (or CE-EC) stack is formed first, then an interfacial region, which may possess at least some functions of an IC layer, is formed between the EC and CE layers using components of one or both of the layers (and or another electrochromic or counter electrode material in some embodiments) at the interface of the layers. In some embodiments, the EC or CE is formed, including a superstoichiometric portion which may include an upper layer, and then exposed to lithium and heat to form an ionically-conducting substantially electronically-insulating region, followed by formation of the other of the EC and the CE. The ionically-conducting substantially electronically-insulating region then serves as the interfacial region between the EC and CE. In other embodiments, the EC or the CE is formed, including a superstoichiometric portion or upper layer, and then exposed to lithium, for example, via sputtering lithium. The other of the EC and CE is then formed thereon. It is believed that formation of the second electrode drives a lithium flux from the first formed electrode toward the second electrode. In turn, this flux of lithium drives formation of an ionically-conducting substantially electronically-insulating interfacial region between the EC and CE layers. In other embodiments a single layer graded composition, an EC element, is fabricated. The EC element includes an EC region, an IC region (the interfacial region) and a CE region (an ion storage region that may or may not also be electrochromic). The interfacial region serves at least some function of a conventional IC layer because it is substantially ion conducting and substantially electronically-insulating. It should be noted, however, that interfacial regions as described can have higher than conventionally accepted leakage currents but the devices show good performance nonetheless.

In one embodiment the electrochromic layer is formed with an oxygen rich region which is converted to the interfacial region or layer serving as an IC layer upon subsequent processing after the counter electrode layer is deposited. In some embodiments, a distinct layer which includes an oxygen rich version of an electrochromic material is used to (ultimately) form an interfacial layer serving as an IC layer between the EC and CE layers. In other embodiments, a distinct layer which includes an oxygen rich version of a counter electrode material is used to (ultimately) form an interfacial region serving as an IC layer between the EC and CE layers. All or a portion of the oxygen rich CE layer is converted to the interfacial region. In yet other embodiments, a distinct layer which includes an oxygen rich version of a counter electrode material and an oxygen rich form of an electrochromic material is used to (ultimately) form an interfacial region serving as an IC layer between the EC and CE layers. In other words, some or all of oxygen rich material serves as a precursor to the interfacial region that serves as an IC layer. Methods described herein can not only reduce process steps, but produce electrochromic devices showing improved performance characteristics.

As mentioned, it is believed that some of the EC and/or CE layer in an interfacial region is converted to a material that provides one or more functions of an IC layer, notably high conductivity for ions and high resistivity for electrons. The IC functional material in the interfacial region may be, for example, a salt of the conductive cations; for example, a lithium salt.

Figure 2A:
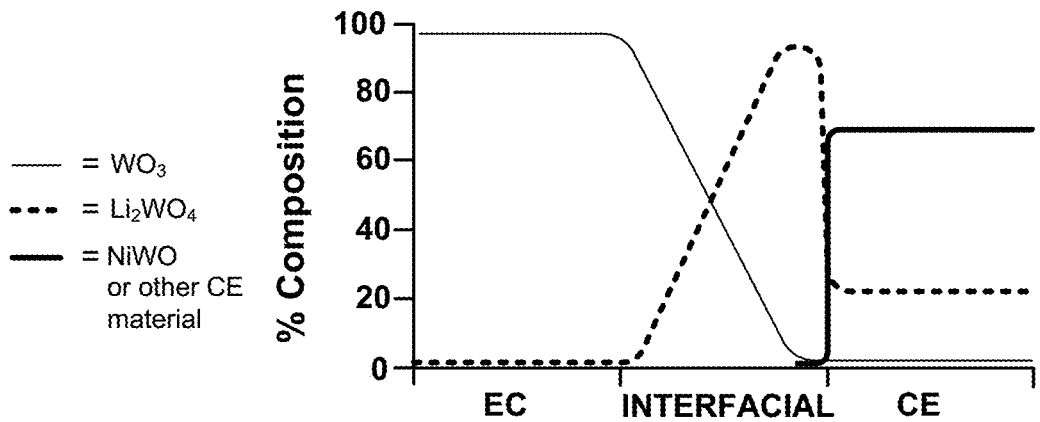
FIGS. 2A-2F are graphs showing representative component compositions for electrochromic devices.
Figure 2B:
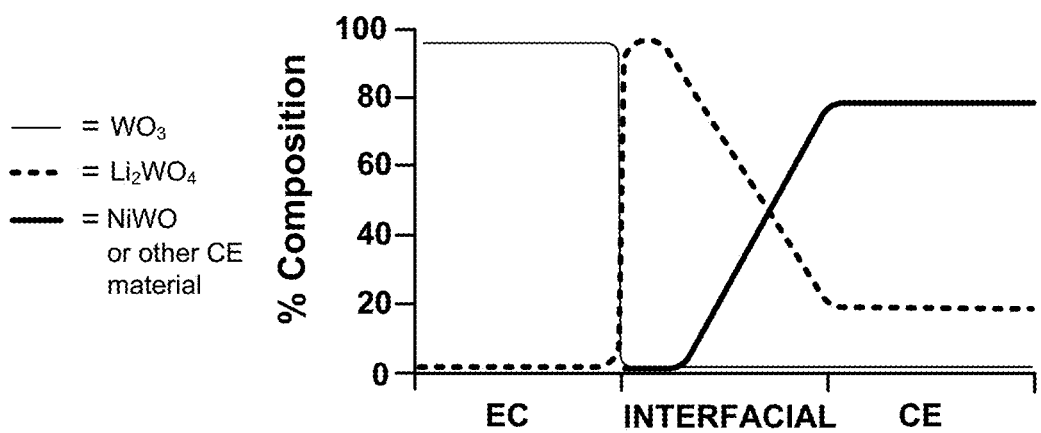
Figure 2C:
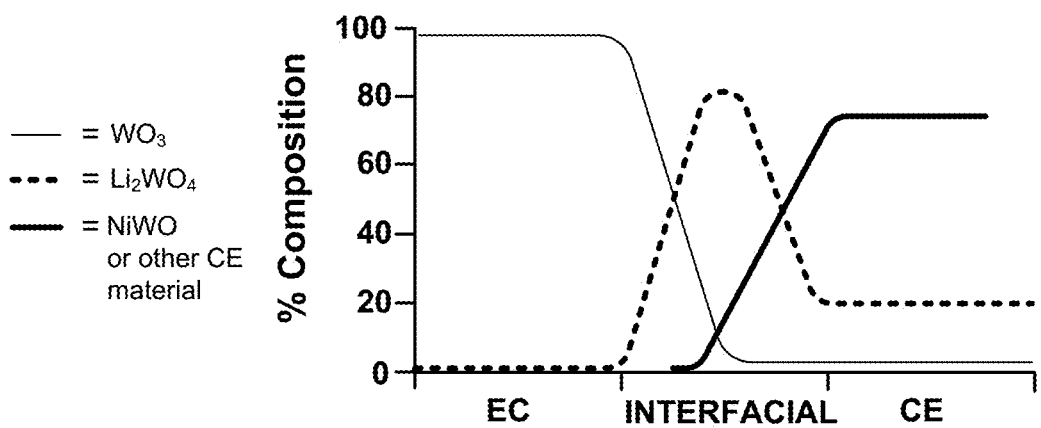

FIGS. 2A, 2B and 2C show composition graphs of three possible examples of electrochromic device stacks (each containing an EC layer, a CE layer and an interfacial region serving as an IC layer), where the EC material is tungsten oxide (denoted here as $WO_3$, but meant to include $WO_N$, where x is between about 2.7 and about 3.5, in one embodiment x is between about 2.7 and about 2.9), the CE material is nickel tungsten oxide (NiWO) and the interfacial region primarily comprises lithium tungstate (denoted here as $Li_2WO_4$, in another embodiment, the interfacial region is a nanocomposite of between about 0.5 and about 50 (atomic) % $Li_2O$, between about 5 and about 95% $Li_2WO_4$, and about 5 and about 70% $WO_3$) with some amount of the EC and/or the CE material. In related embodiments, the CE material may be one that includes a base anodically coloring material and one or more additives as described herein. In other words, the trends shown in FIGS. 2A-2C may apply to electrochromic device stacks that use CE materials other than NiWO.

In general terms, the interfacial region typically, though not necessarily, has a heterogeneous structure that includes at least two discrete components represented by different phases and/or compositions, which phases or compositions vary in concentration over the width of the interfacial region. Because of this the interfacial region that serves as an IC layer is sometimes referred to herein as a "gradient region," a "heterogeneous IC layer" or a "dispersed IC layer." The illustrations in FIGS. 2A, 2B and 2C, although described in terms of specific materials, are more generally representative of composition variations of any suitable materials for electrochromic devices described herein.

FIG. 2A depicts an electrochromic stack where the EC material is a significant component of the interfacial region that functions as an IC layer, while the CE material is not a significant component. Referring to FIG. 2A, starting at the origin and moving from left to right along the x-axis, one can see that a portion the EC material, $WO_3$, which is substantially all tungsten oxide, serves as the EC layer. There is a transition into the interfacial region where there is gradually less tungsten oxide and correspondingly gradually more of lithium tungstate, up to and including near the end of the interfacial region where there is a portion that is substantially all lithium tungstate with some minor amounts of tungsten oxide. Although the transition from the EC layer to the interfacial region is demarked at a composition of substantially all tungsten oxide and de minimus amounts of lithium tungstate, it is clear that the transition is not abrupt as in conventional devices. In this example, effectively the transition begins to occur where the composition has sufficient quantity of lithium tungstate to enable the material to serve at least some functions of an IC layer, for example, ion conduction and electronic insulation. Certainly the composition much closer to the CE layer, where the composition is substantially lithium tungstate, serves the function of an IC layer, as lithium tungstate is known to exhibit these properties. But there is also some IC layer function in other parts of interfacial region. The inventors have found that such "heterogeneous IC layers" improve switching characteristics and perhaps thermal cycling stability of electrochromic devices as compared to conventional devices with abrupt transitions. The CE layer in this example contains primarily nickel tungsten oxide as the active material, and has a relatively abrupt transition to the nickel tungsten oxide composition at the edge of the interfacial region. As noted, other CE materials as described herein may also be used and may follow the trend shown in FIG. 2A. Methods for making stacks with such interfacial regions are described in more detail below.

It should be noted that, for example, that the nickel tungsten oxide CE layer in FIG. 2A is depicted as having about 20% lithium tungstate. Without wishing to be bound by theory, it is believed that the nickel tungsten oxide CE layer exists as nickel oxide cores or particles surrounded by a shell or matrix of lithium tungstate which imparts moderately good ionic conductivity to the CE layer, and thereby aids in the electrochromic transition of the CE layer during operation of the electrochromic stack. The exact stoichiometry of lithium tungstate in the CE layer may vary significantly from embodiment to embodiment. In some embodiments, there may also be some tungsten oxide in the CE layer. Also, because lithium ions travel to and from the EC and CE layers via the interfacial region serving as the IC layer, there may be significant amounts of lithium tungstate in the EC layer, for example as depicted in FIG. 2A.

FIG. 2B depicts an electrochromic stack where the CE material is a significant component of the interfacial region that functions as an IC layer, while the EC material is not a significant component. Referring to FIG. 2B, starting at the origin and moving from left to right along the x-axis, one can see that in this case, the EC material, which is substantially all tungsten oxide, serves as the EC layer. There is an abrupt transition into the interfacial region where there is little if any tungsten oxide, but there is a large amount of lithium tungstate and at least some nickel tungsten oxide (or other CE material). The composition of the interfacial region changes along the x-axis with progressively less and less lithium tungstate and correspondingly more and more nickel tungsten oxide (or other CE material). The transition from the interfacial region to the CE layer is demarked arbitrarily at a composition of about 80% nickel tungsten oxide and about 20% of lithium tungstate, but this is merely an example of where the transition occurs in a graded composition. The interfacial region may be viewed as ending when no, or little, additional change in composition occurs when progressing further through the stack. In addition, the transition effectively ends where the composition has sufficient quantity of nickel tungsten oxide such that the material no longer serves at least some function that a distinct IC layer would serve. Certainly the composition much closer to the CE layer as demarked, where the composition is 80% nickel tungsten oxide (or other CE material), serves the function of a CE layer. Likewise, the composition of the interfacial region much closer to the EC layer, where lithium tungstate is the substantial component, serves as an ion conducting electronically-insulating material.

FIG. 2C depicts an electrochromic stack where both the EC material and the CE material are significant components of the interfacial region that functions as an IC layer. Referring to FIG. 2C, starting at the origin and moving from left to right along the x-axis, one can see that a portion the EC material, $WO_3$, which is substantially all tungsten oxide, serves as the EC layer. There is a transition into the interfacial region where there is gradually less tungsten oxide and correspondingly gradually more lithium tungstate. In this example, about a third of the way through what is (arbitrarily) demarked as the interfacial region, there is also a growing amount of nickel tungsten oxide counter electrode material (or other CE material). At about midway through what is demarked as the interfacial region, there is about 10% each of tungsten oxide and nickel tungsten oxide and 80% lithium tungstate. In this example there is no abrupt transition between an EC layer and an IC layer or between an IC layer and a CE layer, but rather an interfacial region which has a continuous graded composition of both the CE and EC materials. In fact, there is no abrupt boundary or distinct layer present, so this example is not actually a stack of materials, but rather a single graded layer comprising an EC region, and IC region and a CE region. This is an example of an EC element. In this example, the lithium tungstate component peaks at about half way through the interfacial region, and so this region is likely the strongest electronically-insulating portion of the interfacial region.

As mentioned above in the Summary section, the EC and CE layers may include material components that impart some electrical resistivity to the EC and CE layers; the lithium tungstate in described in FIGS. 2A-2C that spans all three regions, at least in some quantity, is an example of such materials that impart electrical resistivity to the EC and CE layers.

FIGS. 2A-2C represent only three non-limiting examples of graded compositions of interfacial regions that serve as IC layers in electrochromic devices described herein. One of ordinary skill in the art would appreciate that many variations are possible without escaping the scope of the description. In each of the examples in FIGS. 2A-2C there is at least one layer where there are only two material components and one of the components not present or present only at a level that is de minimus. The embodiments are not limited in this way. Thus, one embodiment is an electrochromic device including a electrochromic layer, an interfacial region serving as an IC layer, and a counter electrode layer, where at least one material component of each of the aforementioned two layers and one region of the device is present in each of the electrochromic layer, the interfacial region and the counter electrode layer in a concentration of at least about 25% by weight, in another embodiment at least about 15% by weight, in another embodiment at least about 10% by weight, in another embodiment at least about 5% by weight, in yet another embodiment at least about 2% by weight. In another embodiment, the material component is present at any of these concentration ranges in only two of the three layers and region. In the depicted embodiments, the interface between at least two of the three component layers/regions is not abrupt but exhibits substantial variation in composition over a region of, for example, at least about 20 nm and/or at least about 2% of the total thickness of the EC element.

The amount of electrochromic and/or counter electrode material in the interfacial region can be significant, in one embodiment as much as 50% by weight of the interfacial region. However, in many embodiments, the ion-conducting electronically-insulating material is typically the majority component, while the remainder of the interfacial region is electrochromic and/or counter electrode material. In one embodiment, the interfacial region includes between about 60% by weight and about 95% by weight of the ion-conducting electronically-insulating material while the remainder of the interfacial region is electrochromic and/or counter electrode material. In one embodiment, the interfacial region includes between about 70% by weight and about 95% by weight of the ion-conducting electronically-insulating material while the remainder of the interfacial region is electrochromic and/or counter electrode material. In one embodiment, the interfacial region includes between about 80% by weight and about 95% by weight of the ion-conducting electronically-insulating material while the remainder of the interfacial region is electrochromic and/or counter electrode material.

In some embodiments, interfacial regions in devices described herein may be relatively distinct, that is, when analyzed, for example by microscopy, there are relatively distinguishable boundaries at adjoining layers, even though the interfacial region contains amounts of the electrochromic and/or counter electrode material. In such embodiments the interfacial region's thickness can be measured. In embodiments where the interfacial region is formed from an oxygen-rich (super-stoichiometric) region of an EC and/or CE layer, the ratio of the thickness of the interfacial region as compared to the layer or layers it is formed from is one metric for characterizing the interfacial region. For example, an electrochromic layer is deposited with an oxygen-rich upper layer. The EC layer may include a single metal oxide or two or more metal oxides mixed homogenously or heterogeneously in layers or more diffuse regions. The EC layer is 550 nm thick, including the oxygen-rich layer (or region). If about 150 nm of the EC layer is converted to interfacial region, then about 27% of the EC is converted to interfacial region, that is, 150 nm divided by 550 nm. In another example, the EC layer includes a first metal oxide region (or layer) and a second metal oxide layer (or region) that is oxygen-rich. If all or a portion of the oxygen-rich metal oxide layer is converted to interfacial region, then the thickness of the interfacial region divided by the total thickness of the first and second metal oxide layers (prior to formation of the interfacial region) is a metric for the interfacial region. In one embodiment, the interfacial region includes between about 0.5% and about 50% by thickness of a precursor region (EC and/or CE, including oxygen-rich portion) used to form it, in another embodiment, between about 1% and about 30%, in yet another embodiment, between about 2% and about 10%, and in another embodiment between about 3% and about 7%.

The inventors have discovered that graded compositions serving as the IC layer have many benefits. While not wishing to be bound by theory, it is believed that by having such graded regions, the efficiency of the electrochromic transitions is improved dramatically. There are other benefits as described in more detail below.

While not wishing to be bound to theory, it is believed that one or more of the following mechanisms may affect the transformation of EC and/or CE material to an IC functioning material in the interfacial region. However, the performance or application of embodiments described herein is not limited to any of these mechanisms. Each of these mechanisms is consistent with a process in which IC layer material is never deposited during fabrication of the stack. As is made clear elsewhere herein, apparatus described herein need not have a separate target comprising material for an IC layer.

In a first mechanism, the direct lithiation of the electrochromic material or the counter electrode material produces an IC material (for example, a lithium tungstate) in the interfacial region. As explained more fully below various embodiments employ direct lithiation of one of the active layers at a point in the fabrication process between the formation of the EC and CE layers. This operation involves exposure of the EC or CE layer (whichever is formed first) to lithium. According to this mechanism, a flux of lithium passing through the EC or CE layer produces an ionically conductive, electronically resistive material such as a lithium salt. Heating or other energy can be applied to drive this flux of lithium. This described mechanism converts the top or exposed portion of the first formed layer (EC or CE layer) prior to formation of the second layer (CE or EC layer).

Thus, one embodiment is a method of fabricating an electrochromic device including: (a) forming either an electrochromic layer including an electrochromic material or a counter electrode layer including a counter electrode material; (b) forming an intermediate layer over the electrochromic layer or the counter electrode layer, where the intermediate layer includes an oxygen rich form of at least one of the electrochromic material, the counter electrode material and an additional material, where the additional material includes distinct electrochromic or counter electrode material, the intermediate layer not substantially electronically-insulating; (c) exposing the intermediate layer to lithium; and (d) heating the stack formed in order to convert at least part of the intermediate layer to a region, coextensive with the area of the intermediate layer, including an electronically-insulating ionically-conducting material and the material of the intermediate layer. The region can include a heterogeneous mixture of the electronically-insulating ionically-conductive material and the material of the intermediate layer. The additional material mentioned relates to the fact that sometimes it is desirable to use mixed metal oxides in an electrochromic and/or a counter electrode layer, rather than a single metal oxide, for example. The nature of mixed metal oxides in accord with methods and devices described herein is described in more detail below.

In another example, a cathodically coloring electrochromic layer and/or an anodically coloring counter electrode layer may be deposited as at least two distinct sub-layers optionally having different compositions, although both sub-layers may have compositions (e.g., compositions that include electrochromic materials or compositions that include counter electrode materials) as generally described herein. Certain processing steps (e.g., lithiation) may occur between depositing the sub-layers. In a particular embodiment, counter electrode material is deposited in two sub-layers having different compositions. The first sub-layer (closer to the cathodically coloring electrochromic layer) may be anodically coloring, while the second sub-layer (farther away from the cathodically coloring electrochromic layer) may or may not be anodically coloring or may be more weakly anodically coloring than the first sub-layer. Between deposition of the first and second sub-layers, the partially fabricated device may be subject to a lithiation operation. The second sub-layer may reduce the risk of forming defects. In some cases the second sub-layer acts as a defect-mitigating layer, and may be more electronically insulating than the first sub-layer. A further discussion of defect-mitigating layers and their properties is provided in U.S. patent application Ser. No. 13/763,505, filed Feb. 8, 2013, and titled "DEFECT-MITIGATION LAYERS IN ELECTROCHROMIC DEVICES," which is incorporated herein by reference in its entirety.

In one embodiment, the electrochromic layer is formed first. In one embodiment, the electrochromic layer is deposited tungsten oxide. In one embodiment, depositing tungsten oxide includes sputtering using a tungsten target and a first sputter gas including between about 40% and about 80% $O_2$ and between about 20% Ar and about 60% Ar, to reach a thickness of between about 350 nm and about 450 nm, and heating, at least intermittently, to between about 150° C. and about 450° C. during formation of the electrochromic layer. In one embodiment, the electrochromic layer is substantially polycrystalline $WO_3$.

In one embodiment, the intermediate layer is a superstoichiometric oxygen form of $WO_3$. In one embodiment, the superstoichiometric tungsten oxide is deposited via sputtering a tungsten target and a second sputter gas including between about 70% and 100% $O_2$ and between 0% Ar and about 30% Ar, to reach a thickness of between about 10 nm and about 200 nm, without heating.

In one embodiment, (c) includes sputtering lithium onto the intermediate layer until the blind charge is satisfied and (d) includes heating the stack to between about 100° C. and about 450° C. In another embodiment, (d) includes heating the stack to between about 200° C. and about 350° C., for between about 2 minutes and about 30 minutes. In either of the former two embodiments, (d) can be performed under an inert atmosphere and/or an oxidizing atmosphere. Examples of inert atmospheres include argon, nitrogen and the like; oxidizing atmospheres include oxygen and other oxidizing agents.

In some embodiments, rather than two layers of EC or CE material, one near or at stoichiometric oxygen, a single layer is used, where the layer has at least a portion that is superstoichiometric in oxygen. In one embodiment, a graded layer is used where the layer has a gradually varying composition with at least a superstoichiometric oxygen upper portion. Thus, another embodiment is a method of fabricating an electrochromic device including: (a) forming either an electrochromic layer including an electrochromic material or a counter electrode layer including a counter electrode material, where the layer formed includes a superstoichiometric oxygen portion in an upper region of, and coextensive with, the area of the layer; (b) exposing the superstoichiometric oxygen portion to lithium; and (c) heating to convert at least part of the superstoichiometric oxygen portion to a region, coextensive with the area of the superstoichiometric oxygen portion and including an electronically-insulating ionically-conducting material and the material of the superstoichiometric oxygen portion. In one embodiment, the region includes a non-homogeneous mixture of the electronically-insulating ionically-conducting material and the material of the superstoichiometric oxygen portion.

In one embodiment, (a) includes forming the electrochromic layer by depositing tungsten oxide. In one embodiment, depositing tungsten oxide includes sputtering using a tungsten target and a sputter gas, where the sputter gas includes between about 40% and about 80% $O_2$ and between about 20% and about 60% Ar at the start of sputtering the electrochromic layer, and the sputter gas includes between about 70% and 100% $O_2$ and between 0% and about 30% Ar at the end of sputtering the electrochromic layer, and heating, at least intermittently, to between about 200° C. and about 350° C. at the beginning of formation of the electrochromic layer but not heated during deposition of at least a final portion of the electrochromic layer.

In one embodiment, (b) includes sputtering, or otherwise delivering, lithium onto the intermediate layer until the blind charge is satisfied and (c) includes heating the stack to between about 100° C. and about 450° C. In another embodiment, (c) includes heating the stack to between about 200° C. and about 350° C., for between about 2 minutes and about 30 minutes. In either of the former two embodiments, (c) can be performed under an inert atmosphere and/or an oxidizing atmosphere. Examples of inert atmospheres include argon, nitrogen and the like; oxidizing atmospheres include oxygen and other oxidizing agents.

In either of the two aforementioned methods, that is, using an electrochromic material having either an intermediate superstoichiometric oxygen layer or a single layer with a superstoichiometric oxygen upper region, further processing include forming the counter electrode layer on the region. In various embodiments, the counter electrode layer includes a base anodically coloring material and one or more additives as described herein. In one embodiment, the counter electrode layer is between about 150 nm and about 300 nm thick. In one embodiment, the material of the counter electrode layer is substantially amorphous. Further processing can include sputtering, or otherwise delivering, lithium onto the counter electrode layer until the counter electrode layer is substantially bleached and sputtering an additional amount of lithium onto the counter electrode layer, between about 5% and about 15% excess based on the quantity required to bleach the counter electrode layer. A transparent conducting oxide layer, such as indium tin oxide, can be deposited on top of the counter electrode layer.

In one embodiment, stacks formed in this way are heated, before or after depositing the transparent conducting oxide, at between about 150° C. and about 450° C., for between about 10 minutes and about 30 minutes under Ar, and then for between about 1 minute and about 15 minutes under $O_2$. After this processing, the stack is processed further by heating the stack in air at between about 250° C. and about 350° C., for between about 20 minutes and about 40 minutes. Flowing a current between the electrochromic layer and the counter electrode layer, as part of an initial activation cycle of the electrochromic device, can also be performed.

Referring again to the interfacial region formation mechanisms, in a second mechanism, lithium diffusing from one of the EC or CE to the other layer, after both layers have formed and/or during formation of a second layer upon a lithiated first layer, causes conversion of part of one of the EC and/or CE at their interface to the interfacial region having the IC functioning material. The lithium diffusion may take place after all the second layer has formed or after only some fraction of the second layer has formed. Further, the diffusion of lithium and consequent conversion to IC functional material take place in either the first or second deposited layers and in either the EC or CE layer. In one example, the EC layer is formed first and then lithiated. As the CE layer is subsequently deposited on top of the EC layer, some lithium diffuses from the underlying EC layer toward and/or into the CE layer causing a transformation to an interfacial region which contains an IC functioning material. In another example, the EC layer formed first (optionally with an oxygen rich upper region), then the CE layer is formed and lithiated. Subsequently some lithium from the CE layer diffuses into the EC layer where it forms the interfacial region having the IC functioning material. In yet another example, the EC layer is deposited first and then lithiated to produce some IC functioning material according to first the mechanism described above. Then, when the CE layer is formed, some lithium diffuses from the underlying EC layer toward the CE layer to produce some IC material in an interfacial region of the CE layer. In this manner, the IC functioning material nominally resides in both the CE and EC layers proximate their interface.

Thus, another embodiment is a method of fabricating an electrochromic device including: (a) forming either an electrochromic layer including an electrochromic material or a counter electrode layer including a counter electrode material; (b) forming an intermediate layer over the electrochromic layer or the counter electrode layer, where the intermediate layer includes an oxygen rich form of at least one of the electrochromic material, the counter electrode material and an additional material, where the additional material includes distinct electrochromic or counter electrode material, the intermediate layer not substantially electronically-insulating; (c) exposing the intermediate layer to lithium; and (d) depositing the other of the electrochromic layer and the counter electrode layer on the intermediate layer thereby converting at least part of the intermediate layer to a region, coextensive with the area of the intermediate layer and including an electronically-insulating ionically-conducting material and the intermediate layer material. In one embodiment, the region includes a non-homogeneous mixture of the electronically-insulating ionically-conducting material and the intermediate layer material.

In one embodiment, the electrochromic layer is formed first and includes depositing tungsten oxide. In one embodiment, depositing tungsten oxide includes sputtering using a tungsten target and a first sputter gas including between about 40% and about 80% $O_2$ and between about 20% Ar and about 60% Ar, to reach a thickness of between about 350 nm and about 450 nm, and heating, at least intermittently, to between about 150° C. and about 450° C. during formation of the electrochromic layer. In one embodiment, the electrochromic layer is substantially polycrystalline $WO_3$. In this embodiment, the intermediate layer is a superstoichiometric oxygen form of $WO_3$, for example, in one embodiment, (b) includes sputtering $WO_3$ using a tungsten target and a second sputter gas including between about 70% and 100% $O_2$ and between 0% Ar and about 30% Ar, to reach a thickness of between about 10 nm and about 200 nm, without heating.

In some embodiments, rather than two layers of EC or CE material, one near or at stoichiometric oxygen, a single layer is used, where the layer has at least a portion that is superstoichiometric in oxygen. In one embodiment, a graded layer is used where the layer has at least a superstoichiometric oxygen upper portion. Thus, another embodiment is a method of fabricating an electrochromic device including: (a) forming either an electrochromic layer including an electrochromic material or a counter electrode layer including a counter electrode material, where the layer formed includes a superstoichiometric oxygen portion in an upper region of, and coextensive with, the area of the layer; (b) exposing the superstoichiometric oxygen portion to lithium; and (c) depositing the other of the electrochromic layer and the counter electrode layer on the superstoichiometric oxygen portion thereby converting at least part of the superstoichiometric oxygen portion to a region, coextensive with the area of the superstoichiometric oxygen portion and including an electronically-insulating ionically-conducting material and the material of the superstoichiometric oxygen portion. In one embodiment, the region includes a non-homogeneous mixture of the electronically-insulating ionically-conducting material and the material of the superstoichiometric oxygen portion.

In one embodiment, the electrochromic layer is formed first. In one such embodiment, the electrochromic layer includes depositing tungsten oxide. In one embodiment, depositing tungsten oxide includes sputtering using a tungsten target and a sputter gas, where the sputter gas includes between about 40% and about 80% $O_2$ and between about 20% and about 60% Ar at the start of sputtering the electrochromic layer, and the sputter gas includes between about 70% and 100% $O_2$ and between 0% and about 30% Ar at the end of sputtering the electrochromic layer, and heating, at least intermittently, to between about 200° C. and about 350° C. at the beginning of formation of the electrochromic layer but not heated during deposition of at least a final portion of the electrochromic layer. This EC layer may also be substantially polycrystalline.

In either of the two aforementioned methods, that is, using an electrochromic material having either an intermediate superstoichiometric oxygen layer or a single layer with a superstoichiometric oxygen upper region, exposing either the intermediate layer or the superstoichiometric oxygen portion to lithium can include sputtering, or otherwise delivering, lithium onto the aforementioned layer or portion. Depositing the other of the electrochromic layer and the counter electrode layer includes forming the counter electrode layer on the intermediate layer or the superstoichiometric oxygen portion. In one embodiment, the counter electrode layer includes a base anodically coloring material and one or more additives as described herein. The counter electrode layer may be between about 150 nm and about 300 nm thick. In one embodiment, the counter electrode material is substantially amorphous. Further processing can include sputtering, or otherwise delivering, lithium onto the counter electrode layer until the counter electrode layer is substantially bleached and sputtering an additional amount of lithium onto the counter electrode layer, between about 5% and about 15% excess based on the quantity required to bleach the counter electrode layer. A transparent conducting oxide layer, such as indium tin oxide, can be deposited on top of the counter electrode layer.

In one embodiment, stacks formed in this way are heated, before or after depositing the transparent conducting oxide, at between about 150° C. and about 450° C., for between about 10 minutes and about 30 minutes under Ar, and then for between about 1 minute and about 15 minutes under $O_2$. After this processing, the stack is processed further by heating the stack in air at between about 250° C. and about 350° C., for between about 20 minutes and about 40 minutes. Flowing a current between the electrochromic layer and the counter electrode layer as part of an initial activation cycle of the electrochromic device can also be performed.

In a third mechanism, the EC and CE layers are formed to completion (or at least to the point where the second formed layer is partially complete). Then, the device structure is heated and the heating converts at least some of the material in the interfacial region to an IC functioning material (for example, a lithium salt). Heating, for example as part of a multistep thermochemical conditioning (MTCC) as described further herein, may be performed during deposition or after deposition is completed. In one embodiment, the heating is performed after a transparent conductive oxide is formed on the stack. In another embodiment, heating is applied after the second layer is partially or wholly complete, but before a transparent conductive oxide is applied thereto. In some cases, the heating is directly and primarily responsible for the transformation. In other cases, the heating primarily facilitates the diffusion or flux of lithium ions that creates the IC-functioning material region as described in the second mechanism.

Finally, in a fourth mechanism, current flowing between the EC and CE layers drives the transformation of at least one of the electrochromic material and the counter electrode material to the IC-functioning material in the interfacial region. This may occur because, for example, an ion flux associated with the flowing current is so large it drives a chemical transformation of EC and/or CE material to IC material in the interfacial region. For example, as explained below, a large lithium flux through tungsten oxide in an EC layer may produce lithium tungstate, which serves as an IC material. The lithium flux may be introduced during, for example, an initial activation cycle of a newly formed device. In one embodiment, the current flow in the initial activation cycle is used, in lieu of heating, to drive the chemical transformation. However, this need not be the case, as other opportunities for driving high ionic fluxes may be more appropriate for effecting the conversion. More generally it is the application of an energy form, for example heat and/or electric current that drives the conversion of the materials to the ionically conductive electronically insulating interfacial region. Other energy forms such as vibrational energy, radiant energy, acoustic energy, mechanical energy and the like can be used. Methods described herein can be performed by one of ordinary skill in the art without resort to any one or more of the above mechanisms.

As described in relation to FIG. 2C, an EC element has no abrupt transition between an EC layer and an IC layer or between an IC layer and a CE layer, but rather is a single layer graded composition having an EC region, which transitions to an IC region (the interfacial region), which transitions to a CE region. Since an EC element is a single layer of graded composition, EC elements can be described in a number of ways including those below. The following description is meant to illustrative of certain embodiments of EC elements.

Figure 2D:
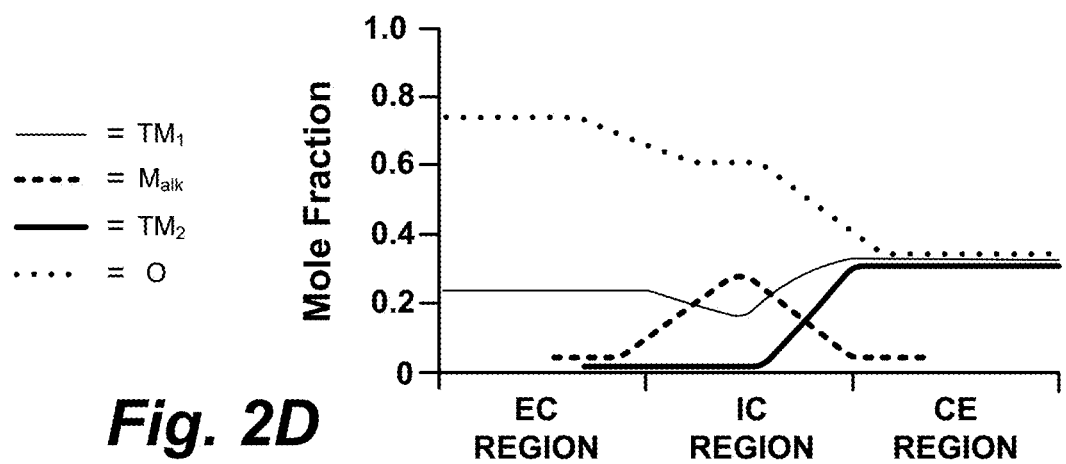
Figure 2E:
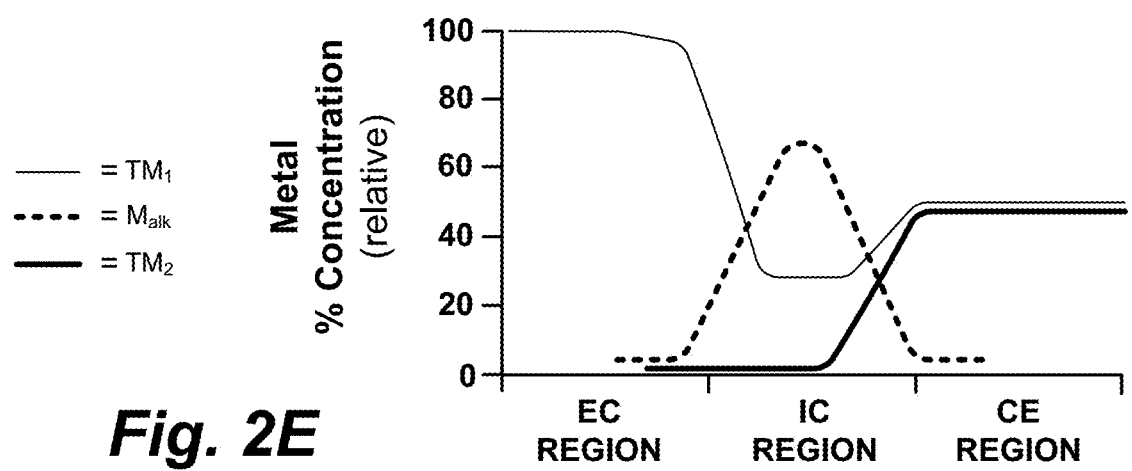
Figure 2F:
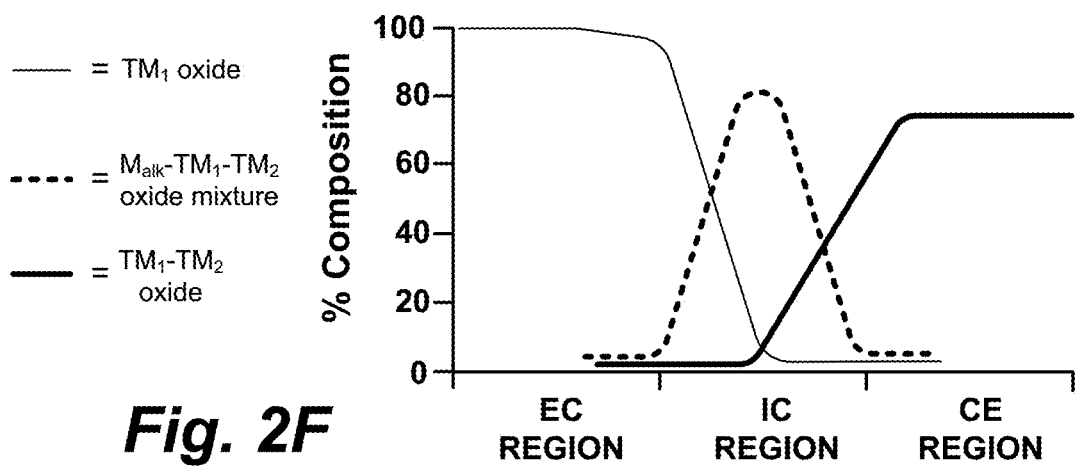

One embodiment is an EC element which is a single layer graded composition including an EC region, an IC region and a CE region, respectively. In one embodiment, the EC element is all solid-state and inorganic. A single EC element can be described in a number of ways in order to understand the graded composition of which it is comprised. In various embodiments, the single layer graded composition EC element has no abrupt boundaries between EC/IC or between IC/CE. Rather both of these interfaces are characterized by graded compositions as discussed herein. In some cases, the single layer graded composition EC element has a continuously variable composition across all regions of the element. In other cases, the element has at least one region, or at least two regions, of constant composition. FIGS. 2D, 2E and 2F are examples of how one can metric the composition of one type of EC element. In these particular examples, the EC element's EC region includes a first transition metal; the IC region includes an alkali metal, and the CE region comprises a mixed transition metal oxide. In this particular example, the mixed transition metal oxide includes the first transition metal and an additional transition metal, although in other examples, the mixed transition metal oxide does not include the first transition metal. In some other embodiments, the mixed transition metal oxide includes more than two transition metals (e.g., a base anodically coloring material including a first transition metal and two or more additives that are or include transition metals). In some devices, FIGS. 2D-2F are describing the same EC element, but in different ways. Each of these ways show how one might describe any number of EC elements in accord with embodiments described herein. In this example, some of the components depicted in the graphs are present throughout the graded composition, some are not. For example, one transition metal is continuously present in significant concentration across the entire device, from the EC region, through the CE region. The embodiments are not limited in this way. In some embodiments some or all the components are present at least in some de minimus amount (or even a significant amount) throughout the EC element. In certain examples within the realm of FIGS. 2D-2F, each component has at least some presence in each region of the EC element.

Referring to FIG. 2D, the EC element is described in terms of the mole fraction of elemental components from which it is composed as a function of the region, EC, IC or CE in which the components occur. Starting from the origin and moving from left to right across the graph, in the EC region, there is a higher mole fraction of oxygen (O) than the first transition metal ($TM_1$). For example, this could represent tungsten oxide in approximately a 3:1 ratio of oxygen to tungsten. Moving further to the right, the mole fraction of oxygen and the first transition metal decline starting somewhere in the EC region and through the IC region and into the CE region. At some point in the CE region, the mole fraction of oxygen and the first transition metal level off. For example, this could represent nickel tungsten oxide (or another CE material) of stable composition in the CE region. In this example, a second transition metal ($TM_2$) is present throughout the EC element, in this particular example having a higher mole fraction in the CE region than the other regions of the EC element. Also, an alkali metal ($M_{alk}$) is present in the EC element. For the purposes of this description, "alkali metal" is meant to encompass both neutral elemental alkali metal and cations thereof, e.g., bound in a material matrix or mobilely associated with the matrix and thus able to intercalate/transport during device operation. In this example the alkali metal has the highest mole fraction in the IC region. This might correspond to lithium of lithium tungstate existing in this region in one example. It is important to note that the mole fraction of components depicted in FIG. 2D are those components fixed in the EC element, e.g., the alkali metal component does not include mobile lithium ions that might be used to drive the EC element to color or bleach (as such ions are mobile and their position in the EC element will change depending upon an applied charge, for example). This example is illustrative of how one might describe the composition of an EC element.

One embodiment is an EC element including: a) a first transition metal having a higher mole fraction of the composition in the EC region than a second transition metal, if present, in the EC region, b) an alkali metal having a maximum mole fraction of the composition in the IC region as compared to the EC region and the CE region; and c) the second transition metal having its maximum mole fraction, of the composition of any region of the EC element, in the CE region.

Referring to FIG. 2E, if one were to consider the composition of the same EC element as described in relation to FIG. 2D, but without considering oxygen content, that is another way to describe embodiments described herein. For example, in this graph the y-axis is not mole fraction, but rather metal concentration; that is, the concentration of each metal, $TM_1$, $M_{alk}$ and $TM_2$, in each region of the graded composition. In this example, each of the first transition metal and the alkali metal are described in terms of their concentration relative to the other two metals. The second transition metal is described in terms of its absolute concentration. Referring to FIG. 2E, in the EC region, the first transition metal has its maximum concentration, relative to the other metals. The alkali metal has its maximum concentration in the IC region, relative to the other metals. The second transition metal has its maximum (absolute) concentration in the CE region. In this example, $TM_1$ and $TM_2$ have substantially the same concentration in the CE region, e.g., this might represent NiWO or another CE material as described herein.

One embodiment is an EC element, including: a) a first transition metal having a maximum concentration, relative to other metals in the EC element, in the EC region, b) an alkali metal having a maximum concentration, relative to other metals in the EC element, in the IC region, and c) a second transition metal having its absolute maximum concentration in the CE region of the EC element.

FIG. 2F describes the composition of the same EC element as described in relation to FIGS. 2D and 2E, but looking at the actual composition, e.g. compounds, that make up each region. For example, in this graph the y-axis is % composition of each compound, oxide of the first transition metal ($TM_1$-oxide), an oxide mixture which includes the alkali metal, along with the first and second transition metals ($M_{alk}$-$TM_1$-$TM_2$ oxide mixture) and a mixed transition metal oxide ($TM_1$-$TM_2$ oxide), in each region of the graded composition. As mentioned the mixed transition metal oxide need not include the first transition metal (e.g. it can include a second and third transition metal), but it does in this example. The graph in FIG. 2F represents devices including those represented by the specific example described in relation to FIG. 2C. In this example, the $TM_1$-oxide is most abundant in the EC region, and it is the primary constituent of the EC region. The $M_{alk}$-$TM_1$-$TM_2$ oxide mixture is the primary constituent of the IC region and the $TM_1$-$TM_2$ oxide is the primary constituent of the CE region. Note that the $M_{alk}$-$TM_1$-$TM_2$ oxide mixture may include more than one compound in a matrix of materials, e.g. this could represent a graded mixture of lithium tungstate, tungsten oxide and nickel tungsten oxide in one embodiment, or a similar graded mixture of materials where other EC and/or CE materials are used. The morphology of the EC element may vary across the layer, i.e. the graded region may have amorphous portions, crystalline portions and/or mixed amorphous crystalline portions in any one or more of the regions. In some embodiments, the CE region is substantially amorphous.

One embodiment is an EC element, including: a) a first transition metal oxide which is the primary constituent of the EC region, b) a mixed transition metal oxide which is the primary constituent of the CE region, and c) a mixture including the first transition metal and the mixed transition metal oxide, the mixture being the primary constituent of the IC region. One embodiment is an EC element, including: a) a first transition metal oxide which is the primary constituent of the EC region, b) a mixed transition metal oxide which is the primary constituent of the CE region, and c) a mixture including an alkali metal compound, the first transition metal and the mixed transition metal oxide, the mixture being the primary constituent of the IC region. In one embodiment, the mixed transition metal oxide includes the first transition metal and a second transition metal selected from the group consisting of nickel, tantalum, titanium, vanadium, chromium, cerium, cobalt, copper, iridium, iron, manganese, molybdenum, niobium, palladium, praseodymium, rhodium and ruthenium. The second transition metal may also be selected from any of the transition metals listed herein as possible additives. In one embodiment, the mixed transition metal oxide does not include the first transition metal. In one embodiment, the alkali metal is lithium cation, either associated with a compound or associated with the material matrix as a transportable ion during operation of the EC element.

One embodiment is an EC element as described herein in which the first transition metal is tungsten and the alkali metal is lithium. In one embodiment, the EC region is cathodically coloring and the CE region is anodically coloring. In one embodiment, the second transition metal is nickel. In certain embodiments, the EC element includes oxygen in each of the EC, IC and CE regions. In one embodiment, EC elements described herein are configured to operate by transport of lithium ions from the CE region, through the IC region and into the EC region, or, from the EC region, through the IC region and into the CE region, when a potential is applied across the EC element. In one embodiment, the first transition metal oxide is tungsten oxide and the mixed transition metal oxide is nickel tungsten oxide (or another CE material as described herein).

One embodiment is an EC device including: a) a first transparent electrode, b) a second transparent electrode, and c) the EC element as described herein sandwiched therebetween. In one embodiment, the first and second transparent electrodes include tin oxide based materials. The EC device may be fabricated on a substrate as described herein; in one embodiment, the substrate is glass. In one embodiment, the glass includes a sodium diffusion barrier.

One embodiment is an EC element which is a single layer graded composition including: a) an EC region including primarily tungsten oxide, b) a CE region including primarily nickel tungsten oxide (or another CE material as described herein, for example including a base anodically coloring material and one or more additives); and, therebetween, c) an IC region including a mixture of lithium tungstate, tungsten oxide and nickel tungsten oxide (or other CE material). One embodiment is an EC device including the aforementioned EC element. In one embodiment, the EC device comprises the EC element sandwiched between two transparent conductive electrodes.

One embodiment is an EC element which is a single layer graded composition including: a) an EC region including a tungsten oxide rich matrix which transitions to a matrix with increasingly more lithium tungstate, the EC region transitioning to; b) an IC region including a mixture of lithium tungstate, tungsten oxide and nickel tungsten oxide (or another CE material as described herein), the IC region transitioning, moving away from the EC region, i. from more to less tungsten oxide; ii. from less to more nickel tungsten oxide (or another CE material as described herein); and, iii. having a lithium tungstate rich matrix near a central portion of the IC region; and c) a CE region which transitions, moving away from the IC region, from more to less lithium tungstate to a nickel tungsten oxide rich matrix (or a matrix that is rich in another CE material as described herein). One embodiment is an EC device including the aforementioned EC element. In one embodiment, the EC device comprises the EC element sandwiched between two transparent conductive electrodes.

One embodiment is an EC element as described herein, further including, abutting one of the EC or the CE face of the EC element, a reflective coating, a thermochromic coating, a photovoltaic coating or a photochromic coating. One embodiment is an EC device including the aforementioned EC element. In one embodiment, the EC device comprises the EC element sandwiched between two transparent conductive electrodes. In one embodiment, the EC device includes the EC element having only the reflective coating abutting the CE face of the EC element, the EC element-reflective coating two-layer structure sandwiched between two transparent conductive electrodes. In one embodiment, the reflective coating is an EC coating that becomes reflective anodically and transparent cathodically. Examples of reflective coatings that may be used for this purpose are described in U.S. Pat. Nos. 7,646,526 and 8,031,389, filed Sep. 30, 2008 and Oct. 1, 2008, respectively, which are herein incorporated by reference in their entirety. In one embodiment, the aforementioned EC device is configured to operate by migration of lithium ions from the CE region, through the IC region and into the EC region, or, from the EC region, through the IC region and into the CE region, when a potential is applied across the EC element.

Additional EC functionality need not be a discrete layer added onto (abutting) one or both faces of an EC element. One embodiment is an EC element as described herein, further including, at least one additional region selected from the group consisting of a reflective region, a thermochromic region and a photochromic region. In one embodiment, the at least one of a reflective region, a thermochromic region or a photochromic region are on either side of the EC region-IC-region-CE-region core graded construct. In one embodiment, an anodically-coloring reflective region is included in the EC element either between the IC and CE regions or graded into the CE region, opposite the IC region. Example, but non-limiting, anodically coloring reflective materials for this region are described above. In one embodiment the EC element also includes at least one ion transport region between the reflective region and neighboring regions, e.g. as a buffer region if the reflective material is somehow incompatible with the IC region and/or the CE region.

Methods of fabricating EC devices and EC elements are described in more detail below.

Figure 3A:
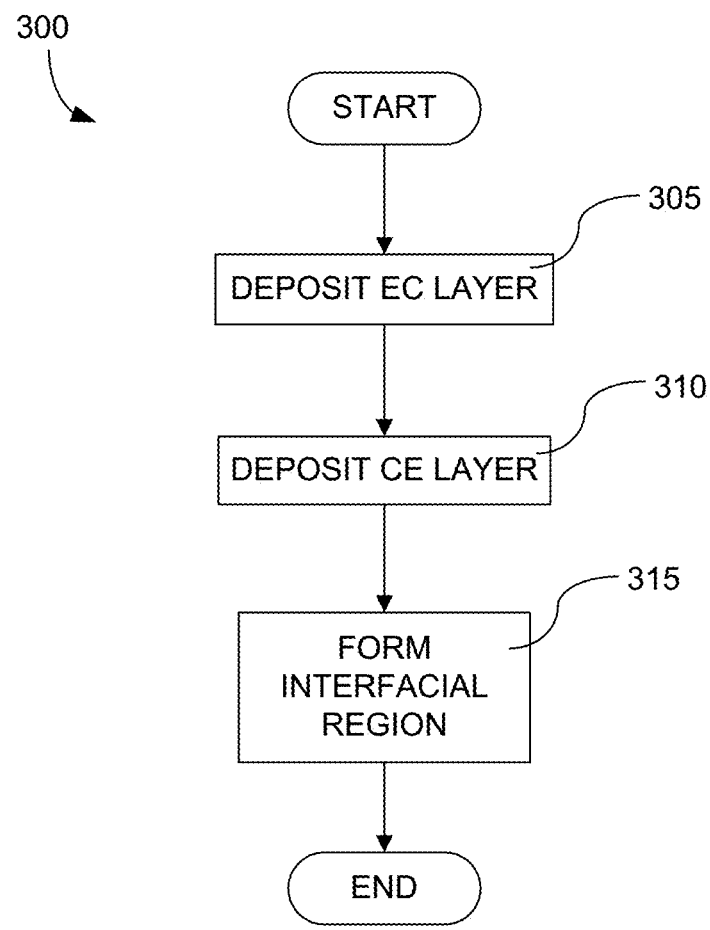
FIGS. 3A and 3B are process flows in accord with embodiments described herein.

FIG. 3A is a process flow, 300, in accord with methods described herein. Specifically, an EC layer is deposited (on a CL, for example a TCO), see 305. Then a CE layer is deposited, see 310. After the EC and CE layers are deposited, then an interfacial region serving as an IC layer is formed therebetween, see 315. One embodiment is an analogous method (not depicted) where steps 305 and 310 are reversed. The thrust of the method being that the interfacial region, functioning as an IC layer, is formed after the EC and CE layers, in some embodiments using at least part of one of the EC and CE layers to make the interfacial region. For this reason, interfacial regions formed in this way are sometimes referred to as "intrinsic" IC layers. In other embodiments a distinct layer is formed between the EC and CE layers, for example using an oxygen-enriched version of the EC material or the CE material, where the layer is converted whole or in part to the interfacial region, but again, after formation of the EC and CE layers. Various methods to form the interfacial region after the EC-CE stack is formed are described below.

Thus, as mentioned, one embodiment is a method of fabricating an electrochromic device, the method including: forming an electrochromic layer including an electrochromic material; forming a counter electrode layer in contact with the electrochromic layer without first providing an ion conducting electronically-insulating layer between the electrochromic layer and the counter electrode layer, where the counter electrode layer includes a counter electrode material as described herein; and forming an interfacial region between the electrochromic layer and the counter electrode layer, where the interfacial region is substantially ion conducting and substantially electronically-insulating. The interfacial region can contain component materials of the EC layer, the CE layer or both. The interfacial region can be formed in a number of ways, as described in more detail below.

Figure 3B:
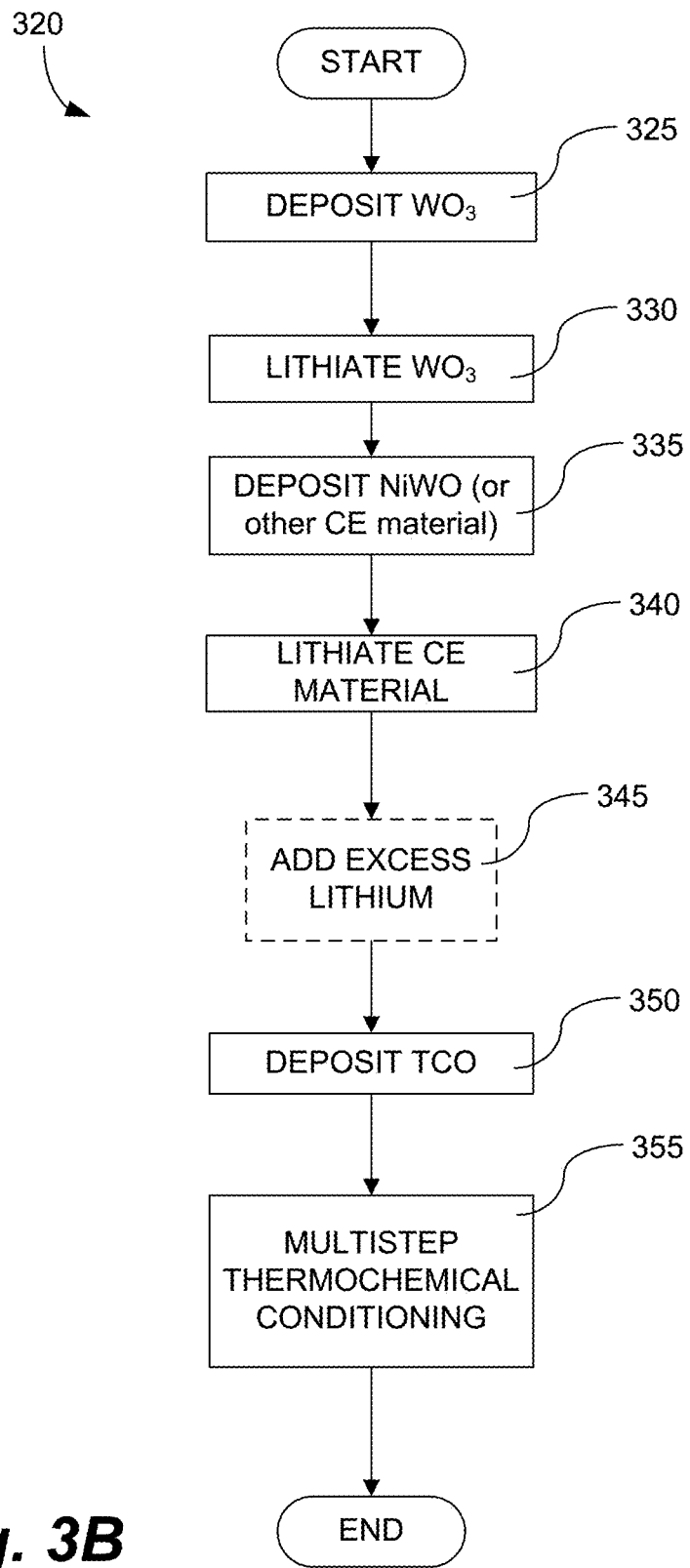

FIG. 3B is a process flow, 320, showing a process flow in accord with the method described in relation to FIG. 3A, in particular, a process flow for depositing an EC layer, then a CE layer and ultimately forming an interfacial region, functioning as an IC layer therebetween. Even more particularly, in this embodiment, the EC layer includes $WO_3$ with various amounts of oxygen, in particular compositions and configurations; the CE layer includes NiWO or another CE material as described herein, the interfacial region includes $Li_2WO_4$, and TCO materials such as indium tin oxide and fluorinated tin oxide are used. It should be noted that the layers of the electrochromic devices are described below in terms of solid state materials. Solid state materials are desirable because of reliability, consistent characteristics and process parameters and device performance. Example solid state electrochromic devices, methods and apparatus for making them and methods of making electrochromic windows with such devices are described in U.S. Non-provisional patent application Ser. No. 12/645,111, entitled "Fabrication of Low Defectivity Electrochromic Devices," by Kozlowski et al., and U.S. Non-provisional patent application Ser. No. 12/645,159, entitled "Electrochromic Devices," by Wang et al., both of which are incorporated by reference herein for all purposes. In particular embodiments, the electrochromic devices described herein are all solid state and made in apparatus that allow deposition of one or more layers of the stack in a controlled ambient environment. That is, in apparatus where the layers are deposited without leaving the apparatus and without, for example, breaking vacuum between deposition steps, thereby reducing contaminants and ultimately device performance. In a particular embodiment, the apparatus for forming the electrochromic device does not require a separate target for depositing an IC layer, as is required in conventional apparatus. As one of ordinary skill in the art would appreciate, the embodiments are not limited to these materials and methods, however, in certain embodiments, all of the materials making up electrochromic stacks and precursor stacks (as described below) are inorganic, solid (i.e., in the solid state), or both inorganic and solid.

FIG. 3B as presented in the drawings is further described throughout this application. In one particular embodiment, the method described in FIG. 3B involves depositing a counter electrode layer having a composition other than NiWO. In many cases the counter electrode layer will be made of a material that includes a base anodically coloring material and one or more additives. In these cases, operation 335 will include depositing the counter electrode layer to achieve the desired composition, and operation 340 will include lithiating the counter electrode layer. Examples of counter electrode materials are described below. As shown in FIG. 3B, and as described in the remainder of the application, the method may be performed without depositing an ion conductor layer between the electrochromic layer and the counter electrode layer, such that the electrochromic and counter electrode layers are in contact with one another.

Because organic materials tend to degrade over time, for example when exposed to ultraviolet light and heat associated with window applications, inorganic materials offer the advantage of a reliable electrochromic stack that can function for extended periods of time. Materials in the solid state also offer the advantage of not having containment and leakage issues, as materials in the liquid state often do. It should be understood that any one or more of the layers in the stack may contain some amount of organic material, but in many implementations one or more of the layers contains little or no organic matter. The same can be said for liquids that may be present in one or more layers in small amounts. It should also be understood that solid state material may be deposited or otherwise formed by processes employing liquid components such as certain processes employing sol-gels or chemical vapor deposition.

Figure 4A:
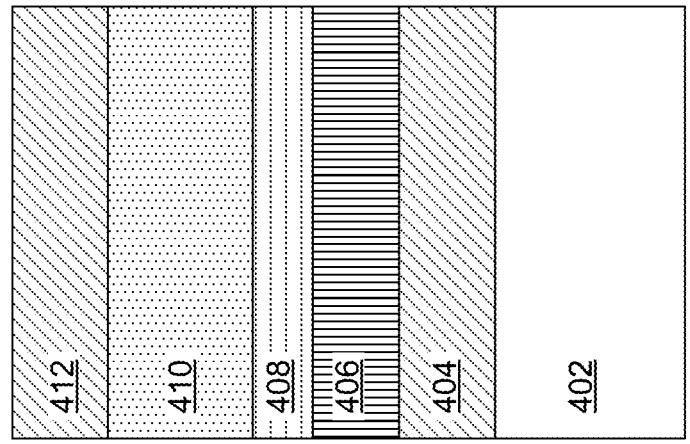
FIGS. 4A-4D are schematic cross-sections depicting formation of electrochromic devices in accord with specific embodiments described herein.
Figure 4A:
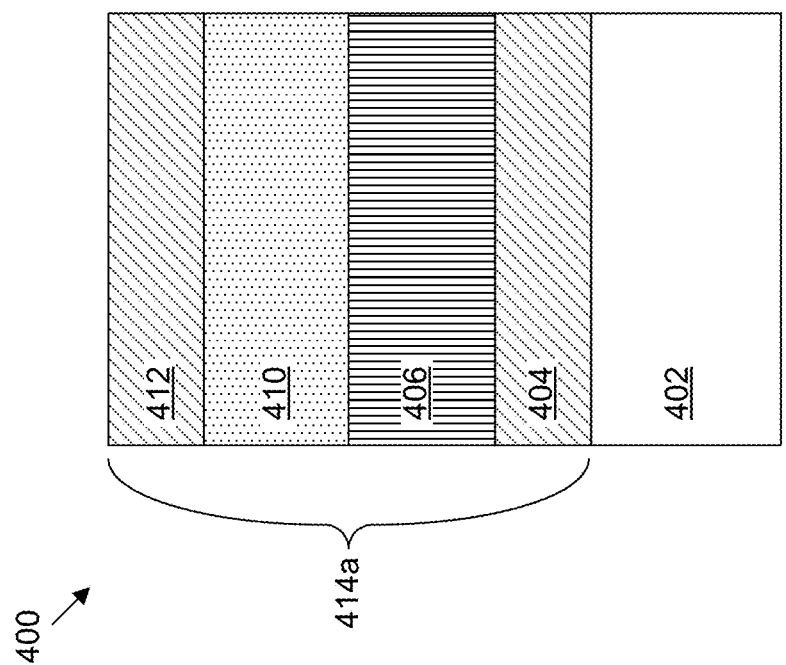
Figure 4B:
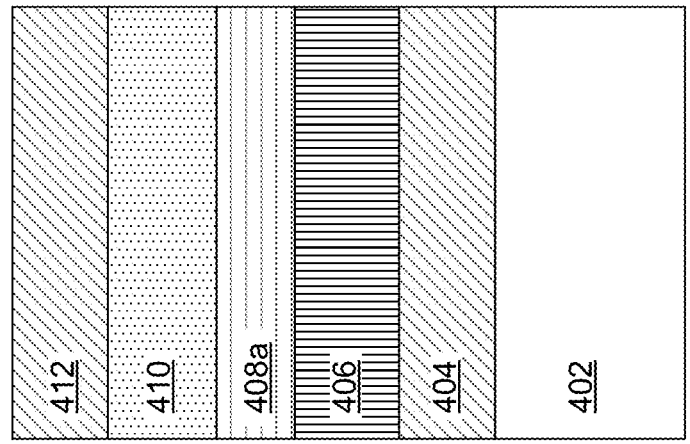
Figure 4B:
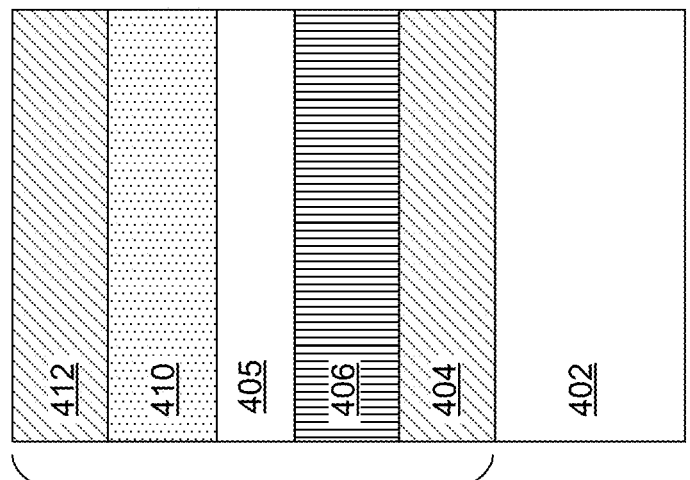
Figure 4C:
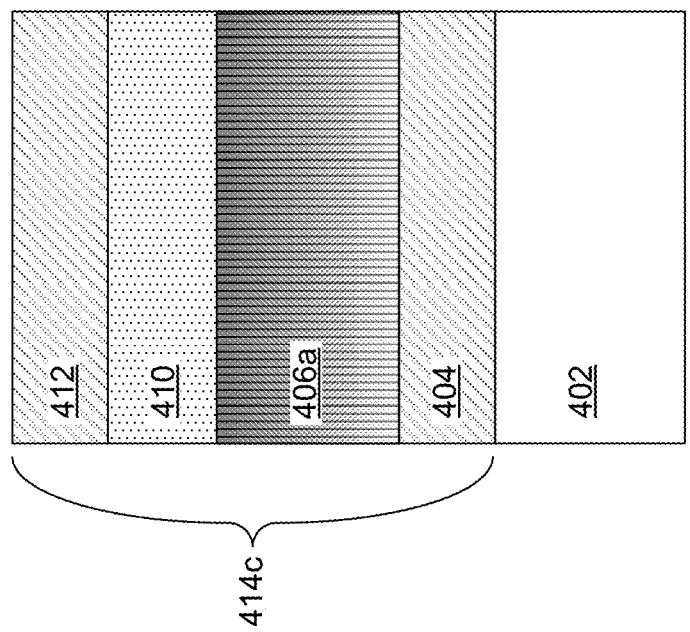

Referring again to FIG. 3B, first an EC layer of $WO_3$ is deposited, see 325. FIGS. 4A-4C are schematic cross-sections depicting formation of electrochromic devices in accord with specific methods and apparatus described herein, and specifically in accord with process flow 320. Specifically, FIGS. 4A-4C are used to show three non-limiting examples of how an EC layer including $WO_3$ can be formed as part of a stack, where an interfacial region serving as an IC layer is formed after the other layers of the stack are deposited. In each of FIGS. 4A-4C, the substrate 402, the first TCO layer 404, the CE layer 410 and the second TCO layer 412 are essentially the same. Also, in each of the three embodiments, a stack is formed without an IC layer, such that the EC and CE layers are in direct physical contact with one another as deposited. After deposition, the stack is further processed in order to form an interfacial region that serves as an IC layer within the stack that is between the EC and the CE layer. Even though an interfacial region forms, it may be part of the counter electrode layer and/or electrochromic layer so that the layers remain in physical contact.

Referring to each of FIGS. 4A-4C, layered structures, 400, 403 and 409, respectively are depicted. Each of these layered structures includes a substrate, 402, which is, for example, glass. Any material having suitable optical, electrical, thermal, and mechanical properties may be used as substrate 402. Such substrates include, for example, glass, plastic, and mirror materials. Suitable plastic substrates include, for example acrylic, polystyrene, polycarbonate, allyl diglycol carbonate, SAN (styrene acrylonitrile copolymer), poly(4-methyl-1-pentene), polyester, polyamide, etc.

and it is beneficial for the plastic to be able to withstand high temperature processing conditions. If a plastic substrate is used, it may be barrier protected and abrasion protected using a hard coat of, for example, a diamond-like protection coating, a silica/silicone anti-abrasion coating, or the like, such as is well known in the plastic glazing art. Suitable glasses include either clear or tinted soda lime glass, including soda lime float glass. The glass may be tempered or not. In some embodiments, commercially available substrates such as glass substrates contain a transparent conductive layer coating. Examples of such glasses include conductive layer coated glasses sold under the trademark TEC Glass™ by Pilkington of Toledo, Ohio, and SUNGATE™ 300 and SUNGATE™ 500 by PPG Industries of Pittsburgh, Pa. TEC Glass™ is a glass coated with a fluorinated tin oxide conductive layer.

In some embodiments, the optical transmittance (i.e., the ratio of transmitted radiation or spectrum to incident radiation or spectrum) of substrate 402 is about 90 to 95%, for example, about 90-92%. The substrate may be of any thickness, as long as it has suitable mechanical properties to support the electrochromic device. While substrate 402 may be of any size, in some embodiments, it is about 0.01 mm to 10 mm thick. In certain embodiments, the substrate is between about 3 mm and about 9 mm thick. In one embodiment, the substrate is between about 0.01 mm and about 1 mm thick. In yet another embodiment, the substrate is between about 0.05 mm and about 0.5 mm thick. In the latter two embodiments, the substrate may be annealed glass, e.g., glasses made by Corning, Inc. of Corning, N.Y.

In some embodiments, the substrate is architectural glass. Architectural glass is glass that is used as a building material. Architectural glass is typically used in commercial buildings, but may also be used in residential buildings, and typically, though not necessarily, separates an indoor environment from an outdoor environment. In certain embodiments, architectural glass is at least 20 inches by 20 inches, and can be much larger, for example, as large as about 72 inches by 120 inches. Architectural glass is typically at least about 2 mm thick. Architectural glass that is less than about 3.2 mm thick cannot be tempered. In some embodiments with architectural glass as the substrate, the substrate may still be tempered even after the electrochromic stack has been fabricated on the substrate. In some embodiments with architectural glass as the substrate, the substrate is a soda lime glass from a tin float line. The percent transmission over the visible spectrum of an architectural glass substrate (i.e., the integrated transmission across the visible spectrum) is generally greater than 80% for neutral substrates, but it could be lower for colored substrates. In some cases, the percent transmission of the substrate over the visible spectrum is at least about 90% (for example, about 90-92%). The visible spectrum is the spectrum that a typical human eye will respond to, generally about 380 nm (purple) to about 780 nm (red). In some cases, the glass has a surface roughness of between about 10 nm and about 30 nm. In one embodiment, substrate 402 is soda glass with a sodium diffusion barrier (not shown) to prevent sodium ions from diffusing into the electrochromic device. For the purposes of this description, such an arrangement is referred to as "substrate 402."

Referring again to layered structures, 400, 403 and 409, on top of substrate 402 is deposited a first TCO layer, 404, for example made of fluorinated tin oxide or other suitable material, that is, among other things, conductive and transparent. Transparent conductive oxides include metal oxides and metal oxides doped with one or more metals. Examples of such metal oxides and doped metal oxides include indium oxide, indium tin oxide, doped indium oxide, tin oxide, doped tin oxide, zinc oxide, aluminum zinc oxide, doped zinc oxide, ruthenium oxide, doped ruthenium oxide and the like.

In many embodiments, a counter electrode includes an anodically coloring electrochromic material in combination with one or more additives. The anodically coloring electrochromic material may be referred to as a base material or a base anodically coloring material in some cases, and is often provided as an oxide. In many, but not necessarily all cases, the additive may be provided at an atomic percent lower than that of the metal in the base anodically coloring material (excluding any oxygen atoms present). That is, the counter electrode contains a base material "B" (often provided as an oxide) and an additive, "A" where a ratio of B:A in the anodically coloring material (excluding oxygen atoms) is represented by 1-x:x, that is $B_{1-x}A_x$, where x is <0.5. For example, while the base material is anodically coloring, the additive may be cathodically coloring or electrochromically neutral. Anodically coloring "additives" may be considered part of the base material. The balance between the base material and the additive should be maintained within a range that results in an anodically coloring material overall. This range is different for different base materials and additives, though one of ordinary skill in the art can readily determine the boundaries of acceptable compositions. In certain embodiments, the additive may exceed 50% atomic (a/o), so long as the resultant counter electrode material is anodically coloring. For example, a counter electrode may be made with nickel oxide combined with tungsten. This may mean that a nickel base material, provided in the form of nickel oxide, contains some additive tungsten atoms, typically less than about 50% atomic (a/o). It is understood that NiWO is only anodically coloring where the nickel to tungsten (atomic) ratio (Ni:W) is within certain ranges. Such ranges are further discussed in Electrochromic Nickel-Tungsten Oxides: Optical, Electrochemical and Structural Characterization of Sputter-deposited Thin Films in the Whole Composition Range, authored by Sara Green, Acta Universitatis Upsaliensis, Digital Comprehensive Summaries of Uppsala Dissertations from the Faculty of Science and Technology 963, Uppsala, which is herein incorporated by reference in its entirety. In some contexts, a tungsten-doped nickel oxide may also be referred to as nickel tungsten oxide (NiWO), and similar naming conventions may be used for other materials, as well. In some cases, the base material and additive are each provided in the form of an oxide (for example, a mixture of $Ni_2O_3$ (containing the base material) and $WO_3$ (containing the additive)) when forming the anodically coloring material.

In one embodiment the second TCO layer is between about 20 nm and about 1200 nm thick, in another embodiment, between about 100 nm and about 600 nm thick, in another embodiment about 350 nm thick. The TCO layer should have an appropriate sheet resistance ($R_s$) because of the relatively large area spanned by the layers. In some embodiments, the sheet resistance of the TCO layers is between about 5 and about 30 Ohms per square. In some embodiments, the sheet resistance of TCO layers is about 15 Ohms per square. In general, it is desirable that the sheet resistance of each of the two conductive layers be about the same. In one embodiment, the two layers, for example 404 and 412, each have a sheet resistance of about 10-15 Ohms per square. In another embodiment, each of the two TCO layers have a sheet resistance of less than 10 Ohms per square.

Each of layered structures 400, 403 and 409, include a stack 414a, 414b and 414c, respectively, each of which include the first TCO layer 404 on top of substrate 402, a CE layer 410, and a second TCO layer 412. The difference in each of layered structures 400, 403 and 409 is how the EC layer was formed, which in turn affects the morphology of the resultant interfacial region in each scenario.

Consistent with process flow 325 of FIG. 3B, each of stacks 414a, 414b and 414c include an electrochromic layer deposited on top of the first TCO layer 404. The electrochromic layer may contain any one or more of a number of different electrochromic materials, including metal oxides. Such metal oxides include tungsten oxide ($WO_3$), molybdenum oxide ($MoO_3$), niobium oxide ($Nb_2O_5$), titanium oxide ($TiO_2$), copper oxide (CuO), iridium oxide ($Ir_2O_3$), chromium oxide ($Cr_2O_3$), manganese oxide ($Mn_2O_3$), vanadium oxide ($V_2O_5$), nickel oxide ($Ni_2O_3$), cobalt oxide ($Co_2O_3$) and the like. In some embodiments, the metal oxide is doped with one or more dopants such as lithium, sodium, potassium, molybdenum, niobium, vanadium, titanium, and/or other suitable metals or compounds containing metals. Mixed oxides (for example, W—Mo oxide, W—V oxide) are also used in certain embodiments, that is, the electrochromic layer includes two or more of the aforementioned metal oxides. An electrochromic layer including a metal oxide is capable of receiving ions transferred from a counter electrode layer.

In some embodiments, tungsten oxide or doped tungsten oxide is used for the electrochromic layer. In one embodiment, the electrochromic layer is made substantially of $WO_x$, where "x" refers to an atomic ratio of oxygen to tungsten in the electrochromic layer, and x is between about 2.7 and 3.5. It has been suggested that only sub-stoichiometric tungsten oxide exhibits electrochromism; i.e., stoichiometric tungsten oxide, $WO_3$, does not exhibit electrochromism. In a more specific embodiment, $WO_x$, where x is less than 3.0 and at least about 2.7 is used for the electrochromic layer. In another embodiment, the electrochromic layer is $WO_x$, where x is between about 2.7 and about 2.9. Techniques such as Rutherford Backscattering Spectroscopy (RBS) can identify the total number of oxygen atoms which include those bonded to tungsten and those not bonded to tungsten. In some instances, tungsten oxide layers where x is 3 or greater exhibit electrochromism, presumably due to unbound excess oxygen along with sub-stoichiometric tungsten oxide. In another embodiment, the tungsten oxide layer has stoichiometric or greater oxygen, where x is 3.0 to about 3.5. In some embodiments, at least a portion of the EC layer has an excess of oxygen. This more highly oxygenated region of the EC layer is used as a precursor to formation of an ion conducting electron insulating region which serves as an IC layer. In other embodiments a distinct layer of highly oxygenated EC material is formed between the EC layer and the CE layer for ultimate conversion, at least in part, to an ion conducting electronically-insulating interfacial region.

In certain embodiments, the tungsten oxide is crystalline, nanocrystalline, or amorphous. In some embodiments, the tungsten oxide is substantially nanocrystalline, with grain sizes, on average, from about 5 nm to 50 nm (or from about 5 nm to 20 nm), as characterized by transmission electron microscopy (TEM). The tungsten oxide morphology or microstructure may also be characterized as nanocrystalline using x-ray diffraction (XRD) and/or electron diffraction (SAED), such as selected area electron diffraction (SAED). For example, nanocrystalline electrochromic tungsten oxide may be characterized by the following XRD features: a crystal size of about 10 to 100 nm, for example, about 55 nm. Further, nanocrystalline tungsten oxide may exhibit limited long range order, for example, on the order of several (about 5 to 20) tungsten oxide unit cells.

Thus, for convenience, the remainder of process flow 320, in FIG. 3B, will be further described in relation to a first embodiment, including formation of EC layer 406, represented in FIG. 4A. Then a second and third embodiment, represented in FIGS. 4B and 4C, respectively, will be described thereafter with particular emphasis on formation and morphology and/or microstructure of their respective EC layers.

As mentioned with reference to FIG. 3B, an EC layer is deposited, see 325. In a first embodiment (represented in FIG. 4A), a substantially homogeneous EC layer, 406, including $WO_3$ is formed as part of stack 414a, where the EC layer is in direct contact with a CE layer 410. In one embodiment, the EC layer includes $WO_3$ as described above. In one embodiment, heating is applied during deposition of at least a portion of the $WO_3$. In one particular embodiment, several passes are made past a sputter target, where a portion of the $WO_3$ is deposited on each pass, and heating is applied, for example to substrate 402, after each deposition pass to condition the $WO_3$ prior to deposition of the next portion of $WO_3$ of layer 406. In other embodiments, the $WO_3$ layer may be heated continually during deposition, and deposition can be done in a continuous manner, rather than several passes with a sputter target. In one embodiment, the EC layer is between about 300 nm and about 600 nm thick. As mentioned, the thickness of the EC layer depends on upon the desired outcome and method of forming the IC layer.

In embodiments described in relation to FIG. 4A, the EC layer is $WO_3$, between about 500 nm and about 600 nm thick, that is sputtered using a tungsten target and a sputter gas including between about 40% and about 80% $O_2$ and between about 20% Ar and about 60% Ar, and where the substrate upon which the $WO_3$ is deposited is heated, at least intermittently, to between about 150° C. and about 450° C. during formation of the EC layer. In a particular embodiment, the EC layer is $WO_3$, about 550 nm thick, sputtered using the tungsten target, where the sputter gas includes about 50% to about 60% $O_2$ and about 40% to about 50% Ar, and the substrate upon which the $WO_3$ is deposited is heated, at least intermittently, to between about 250° C. and about 350° C. during formation of the electrochromic layer. In these embodiments, the $WO_3$ layer is substantially homogenous. In one embodiment, the $WO_3$ is substantially polycrystalline. It is believed that heating the $WO_3$, at least intermittently, during deposition aids in formation of a polycrystalline form of the $WO_3$.

As mentioned, a number of materials are suitable for the EC layer. Generally, in electrochromic materials, the colorization (or change in any optical property—for example, absorbance, reflectance, and transmittance) of the electrochromic material is caused by reversible ion insertion into the material (for example, intercalation) and a corresponding injection of a charge balancing electron. Typically some fraction of the ion responsible for the optical transition is irreversibly bound up in the electrochromic material. As described herein, some or all of the irreversibly bound ions are used to compensate "blind charge" in the material. In most electrochromic materials, suitable ions include lithium ions (Li) and hydrogen ions ($H^+$) (i.e., protons). In some cases, however, other ions will be suitable. These include, for example, deuterium ions ($D^+$), sodium ions ($Na^+$), potassium ions ($K^+$), calcium ions ($Ca^{++}$), barium ions ($Ba^{++}$), strontium ions ($Sr^{++}$), and magnesium ions ($Mg^{++}$). In various embodiments described herein, lithium ions are used to produce the electrochromic phenomena. Intercalation of lithium ions into tungsten oxide ($WO_{3-y}$ ($0<y\leq\sim0.3$)) causes the tungsten oxide to change from transparent (bleached state) to blue (colored state). In a typical process where the EC layer includes or is tungsten oxide, lithium is deposited, for example via sputtering, on EC layer 406 to satisfy the blind charge (as will be discussed in more detail below with reference to FIGS. 6 and 7), see 330 of the process flow in FIG. 3B. In one embodiment, the lithiation is performed in an integrated deposition system where vacuum is not broken between deposition steps. It should be noted that in some embodiments, lithium is not added at this stage, but rather can be added after deposition of the counter electrode layer or in other embodiments lithium is added after the TCO is deposited.

Referring again to FIG. 4A, next a CE layer, 410, is deposited on EC layer 406. In some embodiments, counter electrode layer 410 is inorganic and/or solid. The counter electrode layer may include one or more of a number of different materials that are capable of serving as reservoirs of ions when the electrochromic device is in the bleached state. During an electrochromic transition initiated by, for example, application of an appropriate electric potential, the counter electrode layer transfers some or all of the ions it holds to the electrochromic layer, changing the electrochromic layer to the colored state. Concurrently, the counter electrode layer colors with the loss of ions.

In some embodiments, the "electrochromic" material is a cathodically coloring material and the "counter electrode" material is an anodically coloring material or an optically passive material. Because counter electrode layer 410 contains the ions used to produce the electrochromic phenomenon in the electrochromic material when the electrochromic material is in the bleached state, the counter electrode may have high transmittance and a neutral color when it holds significant quantities of these ions.

The counter electrode morphology may include microcrystalline, nanocrystalline and/or amorphous phases. For example, the counter electrode may be, e.g., a material with an amorphous matrix having nanocrystals distributed throughout. In certain embodiments, the nanocrystals constitute about 50% or less of the counter electrode material, about 40% or less of the counter electrode material, about 30% or less of the counter electrode material, about 20% or less of the counter electrode material or about 10% or less of the counter electrode material (by weight or by volume depending on the embodiment). In certain embodiments, the nanocrystals have a maximum diameter of less than about 50 nm, in some cases less than about 25 nm, less than about 10 nm, or less than about 5 nm. In some cases, the nanocrystals have a mean diameter of about 50 nm or less, or about 10 nm or less, or about 5 nm or less (e.g., about 1-10 nm). In certain embodiments, it is desirable to have a nanocrystal size distribution where at least about 50% of the nanocrystals have a diameter within 1 standard deviation of the mean nanocrystal diameter, for example where at least about 75% of the nanocrystals have a diameter within 1 standard deviation of the mean nanocrystal diameter or where at least about 90% of the nanocrystals have a diameter within 1 standard deviation of the mean nanocrystal diameter. It has been found that counter electrodes with an amorphous matrix tend to operate more efficiently compared to counter electrodes that are relatively more crystalline. In certain embodiments, the additive may form a host matrix in which domains of the base anodically coloring material may be found. In various cases, the host matrix is substantially amorphous. In certain embodiments, the only crystalline structures in the counter electrode are formed from the base anodically coloring electrochromic material, in, e.g., oxide form. As mentioned, the additives may contribute to forming an amorphous host matrix that is not substantially crystalline, but which incorporates domains (e.g., nanocrystals in some cases) of the base anodically coloring electrochromic material. In other embodiments, the additive and the anodically coloring base material together form a chemical compound with covalent and/or ionic bonding. The compound may be crystalline, amorphous, or any combination thereof. In other embodiments, the anodically coloring base material forms a host matrix in which domains of the additive exist as discrete phases or pockets.

Particular non-limiting examples of suitable materials for the counter electrodes include various nickel oxides (NiO and $Ni_2O_3$), and nickel oxides containing other metals; e.g., nickel tungsten oxide (NiWO), nickel vanadium oxide, nickel chromium oxide, nickel aluminum oxide, nickel manganese oxide, and nickel magnesium oxide. Other suitable materials for counter electrodes include chromium oxide ($Cr_2O_3$), manganese oxide ($MnO_2$), electron conducting polymers (e.g., polyaniline, etc.), Prussian blue, cerium titanium oxide ($CeO_2$—$TiO_2$), cerium zirconium oxide ($CeO_2$—$ZrO_2$), and vanadium oxide ($V_2O_5$). As noted, in many cases the counter electrode material will include a base anodically coloring material and one or more additives as listed herein. Any of the counter electrode materials discussed herein may further include hydrogen. While oxygen is the only non-metal element in many of the counter electrode examples described herein, it may be supplemented or replaced (in whole or part) by one or more electronegative elements such as fluorine and/or nitrogen. In certain embodiments, the electrochromic device does not include organic materials, e.g., an all solid state and inorganic electrochromic device.

In general, many different counter electrode materials may be used. These materials may have different optical properties such as different transmissivity values in the bleached state and/or different colors (absorption spectra) in the bleached state. In embodiments where a complimentary coloring (anodic) counter electrode is desired, generally one or more base anodically coloring metal oxide materials may be combined with one or more additives. The one or more additives may be non-anodically coloring materials (alone or when provided in an oxide), e.g., non-electrochromic materials or cathodically coloring materials. For example, anodically coloring transition metals, e.g., chromium, manganese, cobalt, nickel, iron, rhodium, ruthenium, iridium, vanadium, and mixtures thereof (often provided in the form of oxides), may be used as anodically coloring base materials.

These base materials may be combined with one or more other materials/additives, e.g., a metal or metal oxide that is cathodically coloring or not electrochromic (color neutral). For example, NiWO, may be thought of as nickel oxide (an anodically coloring base material) combined with tungsten oxide (a cathodically coloring material). The ratio of the base material to the additive material is formulated such that the counter electrode material is, on the whole, anodically coloring. For example, in the context of NiWO, if the amount of tungsten is too high relative to the base nickel material, the material will be cathodically coloring and is therefore not suitable for use as a counter electrode material. As such, the ratio of Ni:W in the counter electrode should be maintained above a certain threshold (for example, above about 2.33:1, as noted above). In certain embodiments, the counter electrode material may be a binary, ternary or quaternary mixture of metals and/or metal oxides, where at least one of the metal oxides is a base anodically coloring material, and where the counter electrode material, on the whole, is anodically coloring. It should be noted that the counter electrode material may include an additional material (e.g., metal) that is involved in ion transfer between the layers. In many cases this additional material is lithium, though other materials may also be used as described herein. For example, a NiWO counter electrode may also have lithium therein, where the concentration of lithium depends on the optical state of the electrochromic device. Some amount of lithium may be irreversibly bound within the counter electrode material. As used herein, the terms "binary," "ternary," "quaternary," etc. are understood to refer to the relevant materials without regard to the material used for ion transfer. In other words, NiWO may be considered a material having a binary mixture of metals/metal oxides, even though lithium or another charge carrier may be incorporated into the NiWO.

In many cases, the counter electrode is nickel oxide and/or another anodically coloring metal oxide base material (e.g. iridium oxide, vanadium oxide, chromium oxide, manganese oxide, cobalt oxide, iron oxide, ruthenium oxide, rhodium oxide and any mixture thereof) doped or otherwise combined with an additive such as a second metal or an oxide of a second metal. In certain embodiments, the base material is nickel oxide, vanadium oxide, manganese oxide, iridium oxide, iron oxide and any mixture thereof doped or otherwise combined with an additive such as a second metal, or an oxide of a second metal. The second metal may be, for example, silver (Ag), aluminum (Al), arsenic (As), gold (Au), boron (B), barium (Ba), beryllium (Be), bismuth (Bi), calcium (Ca), cadmium (Cd), cerium (Ce), cesium (Cs), copper (Cu), europium (Eu), gallium, (Ga), gadolinium (Gd), germanium (Ge), hafnium (Hf), mercury (Hg), indium (In), potassium (K), lithium (Li), lanthanum (La), magnesium (Mg), molybdenum (Mo), sodium (Na), niobium (Nb), neodymium (Nd), osmium (Os), protactinium (Pa), lead (Pb), palladium (Pd), polonium (Po), promethium (Pm), praseodymium (Pr), platinum (Pt), radium (Ra), rubidium (Rb), rhenium (Re), antimony (Sb), scandium (Sc), selenium (Se), silicon (Si), samarium (Sm), tin (Sn), strontium (Sr), tantalum (Ta), terbium (Tb), technetium (Tc), tellurium (Te), thorium (Th), titanium (Ti), thallium (Tl), uranium (U), tungsten (W), yttrium (Y), zinc (Zn), zirconium (Zr), or any combination thereof.

For example, one or more anodically coloring transition metal oxides, e.g., oxides of chromium, manganese, cobalt, nickel, iron, rhodium, ruthenium, iridium, vanadium, and mixtures thereof, are used as anodically coloring "base" material, which is combined with one or more of the above listed elements, to form an anodically coloring counter electrode material. Any of the anodically coloring base materials may be combined with any of the subsets of additives/second metals described herein. Specific examples include nickel/iridium, nickel/cobalt, nickel/manganese mixtures as the base material, which is further combined with, e.g., lithium, the compound being in the form of an oxide. For example, the counter electrode material may include lithium nickel cobalt, lithium nickel iridium and/or lithium nickel manganese, in oxide form.

In some cases, the additive is selected from the group consisting of Al, As, Au, B, Ba, Be, Bi, Ca, Cd, Ce, Cs, Cu, Eu, Ga, Gd, Ge, Hf, Hg, In, K, Li, La, Mg, Mo, Na, Nb, Nd, Os, Pa, Pb, Pd, Po, Pm, Pr, Pt, Rb, Ra, Re, Sb, Sc, Se, Si, Sm, Sn, Sr, Ta, Tb, Tc, Te, Th, Ti, Tl, U, W, Y, Zn, Zr, and any combinations thereof. In further cases, the additive is selected from the group consisting of Al, Au, Ge, Mg, Nb, Si, Ta, Zr, and any combinations thereof. In certain embodiments, the additive is selected from the group consisting of Al, Mg, Nb, Si, Ta, Zr, Ge and any combinations thereof. In some embodiments, the additive is selected from the group consisting of Al, Mg, Ta, Ge and any mixtures thereof. In other embodiments, the additive may be selected from the group consisting of Ag, As, Au, B, Cd, Cs, Cu, Eu, Ga, Gd, Ge, Hg, Os, Pb, Pd, Pm, Po, Pt, Ra, Rb, Tb, Tc, Th, Tl, and combinations thereof. In still other embodiments, the additive is selected from the group of Gd, Ga, Ge, and combinations thereof.

In certain cases, the additive may be chosen from the group consisting of Bi, In, Mo, Re, Sn and W. These metals may have oxides that are cathodically coloring. However, these metals and oxides remain colorless when a nickel oxide (or other base material) undergoes color changes at normal operating potentials, and therefore do not reduce light transmission when the active system is functioning in the bleached state. The additive may also be chosen from the group consisting of: Al, Be, Ca, Mg, Sb, Si, Ta, U, Y, Zn and Zr. The additive may also be chosen from the group consisting of Cs, Li, K, Na and Rb. These metals may have an oxide that may serve to improve the stability of the counter electrode material. Certain metals, such as Li, Na, K, may serve as intercalation ions for the purpose of optical switching and/or be part of the immobile phase of the counter electrode. In other words, while it is understood that such metals may travel to different portions of the device as charge is transferred (entering and exiting the counter electrode as needed), the counter electrode may include a permanent minimum concentration of such metals. At no point during cycling does the composition of these metals (Li, Na, K) drop below the permanent minimum concentration. In some cases, some amount of the Li/Na/K may be irreversibly bound in the counter electrode. As used herein, where Li/Na/K are described as "additives" or "second metals," it is understood that such elements are provided at an amount that assures that the concentration of the Li/Na/K does not drop below the permanent minimum concentration.

In certain embodiments, the counter electrode includes a first metal and a second additive metal, where the first metal is nickel, vanadium, iridium, manganese, cobalt or a mixture thereof, and the second additive metal is germanium or silicon. One embodiment is an electrochromic device including a counter electrode including at least one of lithiated nickel germanium oxide, lithiated vanadium germanium oxide, lithiated iridium germanium oxide, lithiated manganese germanium oxide and lithiated cobalt germanium oxide. One embodiment is an electrochromic device including a counter electrode including at least one of lithiated vanadium silicon oxide, lithiated iridium silicon oxide, lithiated manganese silicon oxide and lithiated cobalt silicon oxide. The counter electrode material or counter electrode itself may be fabricated in a lithiated form, an unlithiated form, or at some intermediate state of lithiation.

The counter electrode may have a certain composition and structure in some cases. For instance, the counter electrode may include an amorphous anodically coloring electrochromic material oxide (e.g., chromium oxide, manganese oxide, cobalt oxide, nickel oxide, iron oxide, rhodium oxide, ruthenium oxide, iridium oxide, vanadium oxide, and mixtures thereof) having crystal grains as described herein (e.g., average or maximum crystal diameter of less than about 50 nm, less than about 25 nm, less than about 10 nm, less than about 5 nm, average crystal diameter between about 1-10 nm, or between about 2-5 nm, or within the crystal size distributions discussed above), the anodically coloring electrochromic material oxide being doped, alloyed, or otherwise combined with an additive material. The additive material may be selected from the group consisting of silver (Ag), aluminum (Al), arsenic (As), gold (Au), boron (B), barium (Ba), beryllium (Be), bismuth (Bi), calcium (Ca), cadmium (Cd), cerium (Ce), cesium (Cs), copper (Cu), europium (Eu), gallium, (Ga), gadolinium (Gd), germanium (Ge), hafnium (Hf), mercury (Hg), indium (In), potassium (K), lithium (Li), lanthanum (La), magnesium (Mg), molybdenum (Mo), sodium (Na), niobium (Nb), neodymium (Nd), osmium (Os), protactinium (Pa), lead (Pb), palladium (Pd), polonium (Po), promethium (Pm), praseodymium (Pr), platinum (Pt), radium (Ra), rubidium (Rb), rhenium (Re), antimony (Sb), scandium (Sc), selenium (Se), silicon (Si), samarium (Sm), tin (Sn), strontium (Sr), tantalum (Ta), terbium (Tb), technetium (Tc), tellurium (Te), thorium (Th), titanium (Ti), thallium (Tl), uranium (U), tungsten (W), yttrium (Y), zinc (Zn), zirconium (Zr), or any combination thereof. In other cases, the additive material may be selected from the group consisting of Ag, As, Au, B, Cd, Cs, Cu, Eu, Ga, Gd, Ge, Hg, Os, Pb, Pd, Pm, Po, Pt, Ra, Rb, Tb, Tc, Th, Tl, and combinations thereof. The counter electrode may form a layer (or two or more sub-layers) in a stack of functional layers fitted on a carrier substrate, and is capable of reversibly and simultaneously inserting ions and electrons.

In some cases, the counter electrode includes lithium nickel oxide doped, alloyed, or otherwise combined with one or more of the elements listed above. In these or other cases, the nickel may be present in multiple oxidation states (e.g., both Ni(II) and Ni(III) may be present). Examples of counter electrode materials that use both lithium and nickel include, but are not limited to, mixtures of LiNiWO, LiNiZrO, LiNiZrLaO, LiNiZrMoO, LiNiZrTaO, LiNiZrVO and LiNiGeO. It should be understood that lithium is present at significant concentrations in the counter electrode material during the device's normal operation in the untinted state. Counter electrode materials, being cathodically bleaching materials (i.e., anodically coloring materials), accept and insert positive ions (e.g., lithium) during the bleaching operation. The insertion of lithium ions may drive nickel from oxidation state III to oxidation state II. A similar change in oxidation state may occur with metals in other base anodically coloring materials as well.

In certain cases, ternary or higher order metal combinations may be used to construct the counter electrode. In one embodiment, the counter electrode includes a material of the formula: $Li_{1-10}A_\alpha B_\beta C_\delta O_{1-10}$ where A is nickel, iridium, vanadium, manganese or iron; B is chromium, cobalt, rhodium or ruthenium; C is silver (Ag), aluminum (Al), arsenic (As), gold (Au), boron (B), barium (Ba), beryllium (Be), bismuth (Bi), calcium (Ca), cadmium (Cd), cerium (Ce), cesium (Cs), copper (Cu), europium (Eu), gallium, (Ga), gadolinium (Gd), germanium (Ge), hafnium (Hf), mercury (Hg), indium (In), potassium (K), lanthanum (La), magnesium (Mg), molybdenum (Mo), sodium (Na), niobium (Nb), neodymium (Nd), osmium (Os), protactinium (Pa), lead (Pb), palladium (Pd), polonium (Po), promethium (Pm), praseodymium (Pr), platinum (Pt), radium (Ra), rubidium (Rb), rhenium (Re), antimony (Sb), scandium (Sc), selenium (Se), silicon (Si), samarium (Sm), tin (Sn), strontium (Sr), tantalum (Ta), terbium (Tb), technetium (Tc), tellurium (Te), thorium (Th), titanium (Ti), thallium (Tl), uranium (U), tungsten (W), yttrium (Y), zinc (Zn) or zirconium (Zr); D is chlorine, bromine or fluorine; α is 1-y; β≠zero; γ≠zero; δ can be zero; and, where y=β+γ+δ, which is <0.5.

In one embodiment, the counter electrode includes a material of the formula: $Li_{1-10}A_\alpha B_\beta C_\gamma D_\delta O_{1-10}$ where A is nickel, iridium, vanadium or manganese; B is chromium, cobalt, rhodium or ruthenium; C is aluminum (Al), boron (B), beryllium (Be), cerium (Ce), gallium, (Ga), gadolinium (Gd), germanium (Ge), indium (In), magnesium (Mg), molybdenum (Mo), niobium (Nb), neodymium (Nd), praseodymium (Pr), rubidium (Rb), rhenium (Re), selenium (Se), silicon (Si), tin (Sn), strontium (Sr), tantalum (Ta), titanium (Ti), tungsten (W), zinc (Zn) or zirconium (Zr); D is chlorine, bromine or fluorine; α is 1-y; β≠zero; γ≠zero; δ can be zero; and, where y=β+γ+δ, which is <0.5.

In one embodiment, the counter electrode includes a material of the formula: $Li_{1-10}A_\alpha B_\beta C_\gamma D_\delta O_{1-10}$ where A is nickel, iridium or vanadium; B is chromium or cobalt; C is aluminum (Al), cerium (Ce), gallium, (Ga), germanium (Ge), indium (In), magnesium (Mg), molybdenum (Mo), niobium (Nb), silicon (Si), tin (Sn), tantalum (Ta), titanium (Ti), tungsten (W) or zirconium (Zr); D is chlorine, bromine or fluorine; α is 1-y; β≠zero; γ≠zero; δ can be zero; and, where y=β+γ+δ, which is <0.5.

In particular embodiments, the counter electrode may include nickel and tungsten in combination with one or more additives selected from the group consisting of Ag, Al, As, Au, B, Cd, Cs, Cu, Eu, Ga, Gd, Ge, Hf, Hg, Mg, Os, Pb, Pd, Pm, Po, Pt, Ra, Rb, Si, Ta, Tb, Tc, Th, Tl, Y, Zr, and any combination thereof. In particular embodiments, the counter electrode may include nickel and tungsten in combination with one or more additives selected from the group consisting of Ag, As, Au, B, Cd, Cs, Cu, Eu, Ga, Gd, Ge, Hg, Os, Pb, Pd, Pm, Po, Pt, Ra, Rb, Tb, Tc, Th, Tl, and any combination thereof. In certain other embodiments, the counter electrode may include nickel and tungsten in combination with one or more additives selected from the group consisting of Al, Ga, Gd, Ge, Nb, Hf, Mg, Si, Ta, Y, Zr, and any combination thereof. In some other cases, the counter electrode may include nickel and tungsten in combination with one or more additives selected from the group consisting of Al, Hf, Mg, Si, Ta, Y, Zr, and any combination thereof. In yet other embodiments, the counter electrode may include nickel and tungsten in combination with one or more additives selected from the group consisting of Ga, Gd, Ge, and any combination thereof. In some of the above counter electrode compositions, nickel is present as nickel oxide and tungsten is present in an elemental or quasi-elemental state.

In some embodiments, where the counter electrode layer is nickel-tungsten oxide (with or without an additional additive as described herein), the counter electrode material is amorphous or substantially amorphous. Substantially amorphous nickel-tungsten oxide counter electrodes have been found to perform better, under some conditions, in comparison to their crystalline counterparts. The amorphous state of the nickel-tungsten oxide may be obtained though the use of certain processing conditions, described below, which may also apply to other counter electrode materials described herein. While not wishing to be bound to any theory or mechanism, it is believed that amorphous nickel-tungsten oxide is produced by relatively higher energy atoms in the sputtering process. Higher energy atoms are obtained, for example, in a sputtering process with higher target powers, lower chamber pressures (i.e., higher vacuum), and smaller source to substrate distances. Under the described process conditions, higher density films, with better stability under UV/heat exposure are produced. However, in various embodiments the counter electrode material is crystalline.

In certain embodiments, the amount of nickel present in the nickel-tungsten oxide (with or without an additional additive as described herein) can be up to about 90% by weight of the nickel tungsten oxide. In a specific embodiment, the mass ratio of nickel to tungsten in the nickel tungsten oxide is between about 4:6 and 6:4, in one example, about 1:1. In one embodiment, the NiWO is between about 15% (atomic) Ni and about 60% Ni, and between about 10% W and about 40% W; optionally provided with another additive. In another embodiment, the NiWO is between about 30% (atomic) Ni and about 45% Ni, and between about 15% W and about 35% W; optionally provided with another additive. In another embodiment, the NiWO is between about 30% (atomic) Ni and about 45% Ni, and between about 20% W and about 30% W; optionally provided with another additive. In one embodiment, the NiWO is about 42% (atomic) Ni and about 14% W; optionally provided with another additive.

In various embodiments the CE layer 410 includes a base anodically coloring material and one or more additives as described herein. In one embodiment, CE layer 410 is NiWO as described above, see 335 of FIG. 3B. In one embodiment, the CE layer is between about 150 nm and about 300 nm thick, in another embodiment between about 200 nm and about 250 nm thick, in another embodiment about 230 nm thick.

In a typical process, lithium is also applied to the CE layer until the CE layer is bleached. It should be understood that reference to a transition between a colored state and bleached state is non-limiting and suggests only one example, among many, of an electrochromic transition that may be implemented. Unless otherwise specified herein, whenever reference is made to a bleached-colored transition, the corresponding device or process encompasses other optical state transitions such non-reflective-reflective, transparent-opaque, etc. Further the term "bleached" refers to an optically neutral state, for example, uncolored, transparent or translucent. Still further, unless specified otherwise herein, the "color" of an electrochromic transition is not limited to any particular wavelength or range of wavelengths. As understood by those of skill in the art, the choice of appropriate electrochromic and counter electrode materials governs the relevant optical transition.

In a particular embodiment, lithium, for example via sputtering, is added to a CE layer, see 340 of FIG. 3B. In a particular embodiment, an additional amount of lithium is added after sufficient lithium has been introduced to fully bleach the CE material, see 345 of FIG. 3B (this process is optional, and in one embodiment excess lithium is not added at this stage in the process). In one embodiment this additional amount is between about 5% and about 15% excess based on the quantity required to bleach the counter electrode layer. In another embodiment, the excess lithium added to the CE layer is about 10% excess based on the quantity required to bleach the counter electrode layer. After CE layer 410 is deposited, bleached with lithium and additional lithium is added, a second TCO layer, 412, is deposited on top of the counter electrode layer, see 350 of FIG. 3B. In one embodiment, the transparent conducting oxide includes indium tin oxide, in another embodiment the TCO layer is indium tin oxide. In one embodiment this second TCO layer is between about 20 nm and about 1200 nm thick, in another embodiment, between about 100 nm and about 600 nm thick, in another embodiment about 350 nm thick.

Referring again to FIG. 4A, once layered structure 400 is complete, it is subjected to thermochemical conditioning which converts at least a portion of stack 414a to an IC layer (if it was not already converted due to lithium diffusion or other mechanism). Stack 414a is a precursor, not an electrochromic device, because it does not yet have an ion conducting/electronically-insulating layer (or region) between EC layer 406 and CE layer 410. In this particular embodiment, in a two step process, a portion of EC layer 406 is converted to IC layer 408 to make a functional electrochromic device 401. Referring to FIG. 3B, layered structure 400 is subjected to an MTCC, see 355. In one embodiment, the stack is first subjected to heating, under inert atmosphere (for example argon) at between about 150° C. and about 450° C., for between about 10 minutes and about 30 minutes, and then for between about 1 minutes and about 15 minutes under $O_2$. In another embodiment, the stack is heated at about 250° C., for about 15 minutes under inert atmosphere, and then about 5 minutes under $O_2$. Next, layered structure 400 is subjected to heating in air. In one embodiment the stack is heated in air at between about 250° C. and about 350° C., for between about 20 minutes and about 40 minutes; in another embodiment the stack is heated in air at about 300° C. for about 30 minutes. The energy required to implement MTCC need not be radiant heat energy. For example, in one embodiment ultraviolet radiation is used to implement MTCC. Other sources of energy could also be used without escaping the scope of the description.

After the multistep thermochemical conditioning, process flow 320 is complete and a functional electrochromic device is created. As mentioned, and while not wishing to be bound by theory, it is believed that the lithium in stack 414a along with a portion of EC layer 406 and/or CE layer 410 combine to form interfacial region 408 which functions as an IC layer. Interfacial region 408 is believed to be primarily lithium tungstate, $Li_2WO_4$, which is known to have good ion conducting and electronically-insulating properties relative to traditional IC layer materials. As discussed above, precisely how this phenomenon occurs is not yet known. There are chemical reactions that must take place during the multistep thermochemical conditioning to form the ion conducting electronically-insulating region 408 between the EC and CE layers, but also it is thought that an initial flux of lithium traveling through the stack, for example provided by the excess lithium added to the CE layer as described above, plays a part in formation of IC layer 408. The thickness of the ion conducting electronically-insulating region may vary depending on the materials employed and process conditions for forming the layer. In some embodiments, interfacial region 408 is about 10 nm to about 150 nm thick, in another embodiment about 20 nm to about 100 nm thick, and in other embodiments between about 30 nm to about 50 nm thick.

Although the interfacial region (sometimes referred to as an intermediate layer) in a completed EC device is located between the portions of the device that act as EC and CE layers, the interfacial region may still be considered to be part of the EC and/or CE layers. For instance, the interfacial region may be considered a sub-region within the EC and/or CE layers. The material that eventually comprises the interfacial region is deposited at the same time, through the same processes, and with the same materials, as the EC/CE layers. In contrast, conventional EC devices require a distinct ion conducting layer that cannot be considered part of the EC/CE layers, because the IC layer is deposited at a different time than the EC/CE layers (e.g., after formation of the first EC or CE layer, and before formation of the second CE or EC layer), in a different process (e.g., a distinct sputtering process that does not use the EC or CE sputter targets), with different materials (e.g., a sputter target with distinct IC material). With this understanding, it can be seen that in the disclosed embodiments, the EC and CE layer are in direct physical contact with one another, both before formation of the interfacial region, and after. Although the interfacial region may occupy a portion of the CE and/or EC layer, this region is considered part of these layers.

As mentioned above, there are a number of suitable materials for making the EC layer. As such, using, for example lithium or other suitable ions, in the methods described above one can make other interfacial regions that function as IC layers starting from oxygen rich EC materials. Suitable EC materials for this purpose include, but are not limited to $SiO_2$, $Nb_2O_5$, $Ta_2O_5$, $TiO_2$, $ZrO_2$ and $CeO_2$. In particular embodiments where lithium ions are used, ion conducting materials such as but not limited to, lithium silicate, lithium aluminum silicate, lithium aluminum borate, lithium aluminum fluoride, lithium borate, lithium nitride, lithium zirconium silicate, lithium niobate, lithium borosilicate, lithium phosphosilicate, and other such lithium-based ceramic materials, silicas, or silicon oxides, including lithium silicon-oxide can be made as interfacial regions that function as IC layers.

As mentioned, in one embodiment, the precursor of the ion conducting region is an oxygen-rich (super-stoichiometric) layer that is transformed into ion-conducting/electron-insulating region via lithiation and MTCC as described herein. While not wishing to be bound to theory, it is believed that upon lithiation, the excess oxygen forms lithium oxide, which further forms lithium salts, that is, lithium electrolytes, such as lithium tungstate ($Li_2WO_4$), lithium molybdate ($Li_2MoO_4$), lithium niobate ($LiNbO_3$), lithium tantalate ($LiTaO_3$), lithium titanate ($Li_2TiO_3$), lithium zirconate ($Li_2ZrO_3$) and the like. In one embodiment, the interfacial region comprises at least one of tungsten oxide ($WO_{3+x}$, $0 \leq x \leq 1.5$), molybdenum oxide ($MoO_{3+x}$, $0 \leq x \leq 1.5$), niobium oxide ($Nb_2O_{5+x}$, $0 \leq x \leq 2$), titanium oxide ($TiO_{2+x}$, $0 \leq x \leq 1.5$), tantalum oxide ($Ta_2O_{5+x}$, $0 \leq x \leq 2$), zirconium oxide ($ZrO_{2+x}$, $0 \leq x \leq 1.5$) and cerium oxide ($CeO_{2+x}$, $0 \leq x \leq 1.5$).

Any material, however, may be used for the ion conducting interfacial region provided it can be fabricated with low defectivity and it allows for the passage of ions between the counter electrode layer 410 to the electrochromic layer 406 while substantially preventing the passage of electrons. The material may be characterized as being substantially conductive to ions and substantially resistive to electrons. In one embodiment, the ion conductor material has an ionic conductivity of between about $10^{-10}$ Siemens/cm (or $ohm^{-1}$ $cm^{-1}$) and about $10^{-3}$ Siemens/cm and an electronic resistivity of greater than $10^5$ ohms-cm. In another embodiment, the ion conductor material has an ionic conductivity of between about $10^{-8}$ Siemens/cm and about $10^{-3}$ Siemens/cm and an electronic resistivity of greater than $10^{10}$ ohms-cm. While ion conducting layers should generally resist leakage current (for example, providing a leakage current of not more than about 15 $\mu A/cm^2$, it has been found that some devices fabricated as described herein have surprisingly high leakage currents, for example, between about 40 $\mu A/cm$ and about 150 $\mu A/cm$, yet provide good color change across the device and operate efficiently.

As mentioned above, there are at least two other ways of creating an ion conducting electronically-insulating region between the EC and CE layers, after formation of the stack. These additional embodiments are described below with reference to a particular example where tungsten oxide is used for the EC layer. Also, as mentioned above, the interfacial region with IC properties may form in situ during fabrication of the stack when, for example, lithium diffusion or heat converts some of the EC and/or CE layer to the interfacial region.

In general, there are certain benefits to creating the ion conducting region later in the process. First, the ion conducting material may be protected from some of the harsh processing that occurs during deposition and lithiation of the EC and CE layers. For example, the deposition of these layers by a plasma process is often accompanied by a large voltage drop proximate the stack, frequently in the neighborhood of 15-20 volts. Such large voltages can damage or cause break down of the sensitive ion conducting material. By shifting the IC material formation to later in the process, the material is not exposed to potentially damaging voltage extremes. Second, by forming the IC material later in the process, one may have better control over some process conditions that are not possible prior to completion of both the EC and CE layers. These conditions include lithium diffusion and current flow between electrodes. Controlling these and other conditions late in the process provides additional flexibility to tailor the physical and chemical properties of the IC material to particular applications. Thus, not all of the benefits described herein are due to the unique interfacial region acting as an IC layer, that is, there are manufacturing and other benefits as well.

It has been observed that ion conducting materials formed in accordance with some of the embodiments described herein have superior performance when compared to devices fabricated using conventional techniques for forming an IC layer (for example, PVD from an IC material target). The device switching speed, for example, has been found to be very fast, for example less than 10 minutes, in one example about eight minutes, to achieve about 80% of end state compared to 20-25 minutes or more for traditional devices. In some instances, devices described herein have switching speeds orders of magnitude better than conventional devices. This is possibly attributable to the greater amounts of readily transferable lithium disposed in the interfacial region and/or the graded interfaces, for example between the EC and interfacial region and/or between the CE and the interfacial region. Such lithium may be in the EC and/or CE phases intermixed with the IC phase present in the interfacial region. It is also due possibly to the relatively thin layer or network of IC material present in the interfacial region. In support of this view, it has been observed that some devices fabricated in accordance with the teachings herein have high leakage currents, yet surprisingly exhibit good color change and good efficiency. In some cases, the leakage current density of solidly performing devices has been found to be at least about 100 $\mu A/cm$. In some embodiments, EC devices and EC elements may have leakage currents as low as 10 $\mu A/cm$ or less. In other embodiments, using methods herein, EC devices and EC elements may have leakage currents as low as 1 $\mu A/cm^2$ or less.

Referring now to FIG. 4B, in a second embodiment, the initially laid down EC material of stack 414*b* is really two layers: a first $WO_3$ layer, 406, analogous to layer 406 in FIG. 4A, but between about 350 nm and about 450 nm thick, that is sputtered using a tungsten target and a first sputter gas including between about 40% and about 80% $O_2$ and between about 20% Ar and about 60% Ar, and a second $WO_3$ layer, 405, between about 100 nm and about 200 nm thick, that is sputtered using the tungsten target and a second sputter gas including between about 70% and about 100% $O_2$ and between 0% Ar and about 30% Ar. In this embodiment, heat is applied, for example by heating substrate 402, at least intermittently, to between about 150° C. and about 450° C. during deposition of the first WO₃ layer, 406, but not, or substantially not, heated during deposition of the second WO₃ layer 405. In a more specific embodiment, layer 406 is about 400 nm thick and the first sputter gas includes between about 50% and about 60% $O_2$ and between about 40% and about 50% Ar; the second WO₃ layer 405 is about 150 nm thick and the second sputter gas is substantially pure $O_2$. In this embodiment, heat is applied, at least intermittently, to between about 200° C. and about 350° C. during formation of the first WO₃ layer, 406, but not, or substantially not, heated during formation of the second WO₃ layer 405. In this way, the first WO₃ layer is substantially polycrystalline, while the second WO₃ layer is not necessarily so.

Referring again to FIG. 4B, as described above in relation to FIGS. 3B and 4A, the stack is completed by lithiation of EC layer(s) 406 and 405 to approximately or substantially satisfy the blind charge, deposition of CE layer 410, lithiation of the CE layer to bleach state, addition of additional lithium, and deposition of the second TCO layer 412 to complete layered stack 403. Analogous thermochemical conditioning is performed on layered stack 403 to provide layered stack 407, a functional electrochromic device including an ion conducting electronically-insulating region 408a. While not wishing to be bound by theory, in this example, it is believed that the oxygen rich layer 405 of WO₃ serves primarily as the source of precursor material to form interfacial region 408a. In this example, the entire oxygen rich WO₃ layer is depicted as converting to interfacial region 408a, however it has been found that this is not always the case. In some embodiments, only a portion of an oxygen rich layer is converted to form an interfacial region that serves the function of an IC layer.

Referring now to FIG. 4C, in a third embodiment, layered stack 409 includes an EC layer, 406a, which has a graded composition of WO₃ and is formed as part of a stack, 414c, where the graded composition includes varying levels of oxygen. In one non-limiting example, there is a higher concentration of oxygen in EC layer 406a at the EC-CE layer (410) interface than, for example, at the interface of TCO layer 404 with EC layer 406a.

In one embodiment, EC layer 406a is a graded composition WO₃ layer, between about 500 nm and about 600 nm thick, that is sputtered using a tungsten target and a sputter gas, where the sputter gas includes between about 40% and about 80% $O_2$ and between about 20% Ar and about 60% Ar at the start of sputtering the electrochromic layer, and the sputter gas includes between about 70% and 100% $O_2$ and between 0% Ar and about 30% Ar at the end of sputtering the electrochromic layer, and where heat is applied, for example to substrate 402, at least intermittently, to between about 150° C. and about 450° C. at the beginning of formation of EC layer 406a but not, or substantially not, applied during deposition of at least a final portion of EC layer 406a. In a more specific embodiment, the graded composition WO₃ layer is about 550 nm thick; the sputter gas includes between about 50% and about 60% $O_2$ and between about 40% and about 50% Ar at the start of sputtering the electrochromic layer, and the sputter gas is substantially pure $O_2$ at the end of sputtering the electrochromic layer; and where heat is applied, for example to substrate 402, at least intermittently, to between about 200° C. and about 350° C. at the beginning of formation of the electrochromic layer but not, or substantially not, applied during deposition of at least a final portion of the electrochromic layer. In one embodiment heat is applied at the described temperature ranges at the onset of deposition and gradually decreased to no applied heat at a point where about half of the EC layer is deposited, while the sputter gas composition is adjusted from between about 50% and about 60% $O_2$ and between about 40% and about 50% Ar to substantially pure $O_2$ along a substantially linear rate during deposition of the EC layer.

More generally, the interfacial region typically, though not necessarily, has a heterogeneous structure that includes at least two discrete components represented by different phases and/or compositions. Further, the interfacial region may include a gradient in these two or more discrete components such as an ion conducting material and an electrochromic material (for example, a mixture of lithium tungstate and tungsten oxide). The gradient may provide, for example, a variable composition, microstructure, resistivity, dopant concentration (for example, oxygen concentration), stoichiometry, density, and/or grain size regime. The gradient may have many different forms of transition including a linear transition, a sigmoidal transition, a Gaussian transition, etc. In one example, an electrochromic layer includes a tungsten oxide region that transitions into a superstoichiometric tungsten oxide region. Part, or all, of the superstoichiometric oxide region is converted to the interfacial region. In the final structure, the tungsten oxide region is substantially polycrystalline and the microstructure transitions to substantially amorphous at the interfacial region. In another example, an electrochromic layer includes a tungsten oxide region that transitions into a niobium (superstoichiometric) oxide region. Part, or all, of the niobium oxide region is converted to the interfacial region. In the final structure, the tungsten oxide region is substantially polycrystalline and the microstructure transitions to substantially amorphous at the interfacial region.

Referring again to FIG. 4C, as described above in relation to FIGS. 3B and 4A, the stack is completed by lithiation of EC layer 406a to approximately or substantially satisfy the blind charge, deposition of CE layer 410, lithiation of the CE layer to bleach state, addition of additional lithium, and deposition of the second TCO layer 412 to complete layered stack 409. Analogous multistep thermochemical conditioning is performed on layered stack 409 to provide layered stack 411, a functional electrochromic device including an ion conducting electronically-insulating region 408b and at least a portion of original graded EC layer 406a which serves as the EC layer in the functional electrochromic device 411. While not wishing to be bound by theory, in this example, it is believed that uppermost oxygen rich portion of the graded layer of WO₃ primarily forms graded interfacial region 408b. While not wishing to be bound by theory, there is the possibility that formation of the interfacial region is self-limiting and depends on relative amounts of oxygen, lithium, electrochromic material and/or counter electrode material in the stack.

In various embodiments described herein, the electrochromic stack is described as not, or substantially not, being heated during certain processing phases. In one embodiment, the stack is cooled, actively or passively (for example using a heat sink), after a heating step. Apparatus described herein include active and passive cooling components, for example, active cooling can include platens that are cooled via fluid circulation, cooling via exposure to cooled (e.g. via expansion) gases, refrigeration units and the like. Passive cooling components can include heat sinks, such as blocks of metal and the like, or simply removing the substrate from exposure to heat.

Another embodiment is a method of fabricating an electrochromic device, the method including: (a) forming either an electrochromic layer including an electrochromic material or a counter electrode layer including a counter electrode material; (b) forming an intermediate layer over the electrochromic layer or the counter electrode layer, where the intermediate layer includes an oxygen rich form of at least one of the electrochromic material, the counter electrode material and an additional material, where the additional material includes distinct electrochromic or counter electrode material, where the intermediate layer is not substantially electronically-insulating; (c) forming the other of the electrochromic layer and the counter electrode layer; and (d) allowing at least a portion of the intermediate layer to become substantially electronically-insulating.

In one embodiment, the electrochromic material is $WO_3$. In another embodiment, (a) includes sputtering $WO_3$ using a tungsten target and a first sputter gas including between about 40% and about 80% $O_2$ and between about 20% Ar and about 60% Ar, to reach of thickness of between about 350 nm and about 450 nm, and heating, at least intermittently, to between about 150° C. and about 450° C. during formation of the electrochromic layer. In another embodiment, (b) includes sputtering $WO_3$ using a tungsten target and a second sputter gas including between about 70% and 100% $O_2$ and between 0% Ar and about 30% Ar, to reach a thickness of between about 100 nm and about 200 nm, without heating.

In yet another embodiment, the method further includes sputtering lithium onto the intermediate layer until the blind charge is approximately or substantially satisfied. In one embodiment, the counter electrode layer includes NiWO or another counter electrode material as described herein, between about 150 nm and about 300 nm thick. In another embodiment, lithium is sputtered onto counter electrode layer until the counter electrode layer is bleached. In another embodiment, an additional amount of lithium, between about 5% and about 15% excess based on the quantity required to bleach the counter electrode layer, is sputtered onto the counter electrode layer. In another embodiment, a transparent conducting oxide layer is deposited on top of the counter electrode layer. In one embodiment the transparent conducting oxide includes indium tin oxide, in another embodiment, the transparent conducting oxide is indium tin oxide. In another embodiment, the stack formed from the above embodiments is heated at between about 150° C. and about 450° C., for between about 10 minutes and about 30 minutes under Ar, and then for between about 1 minutes and about 15 minutes under $O_2$, and then heated in air at between about 250° C. and about 350° C., for between about 20 minutes and about 40 minutes.

In another embodiment, (a) includes sputtering a first electrochromic material of formula $MO_x$, where M is a metal or metalloid element and x indicates stoichiometric oxygen to M ratio, and (b) includes sputtering a second electrochromic material of formula $NO_y$, as the intermediate layer, where N is the same or a different metal or metalloid element and y indicates a superstoichiometric amount of oxygen to N ratio. In one embodiment, M is tungsten and N is tungsten. In another embodiment, M is tungsten and N is selected from the group consisting of niobium, silicon, tantalum, titanium, zirconium and cerium.

Another embodiment is an electrochromic device including: (a) an electrochromic layer including an electrochromic material; (b) a counter electrode layer including a counter electrode material; and (c) an interfacial region between the electrochromic layer and the counter electrode layer, where the interfacial region includes an electronically-insulating ion conducting material and at least one of the electrochromic material, the counter electrode material and an additional material, where the additional material includes distinct electrochromic or counter electrode material.

In one embodiment, the electronically-insulating ion conducting material and at least one of the electrochromic materials, the counter electrode material and the additional material are substantially evenly distributed within the interfacial region. In another embodiment, the electronically-insulating ion conducting material and at least one of the electrochromic material, the counter electrode material and the additional material include a composition gradient in a direction perpendicular to the layers. In another embodiment, consistent with either of the two aforementioned embodiments, the electronically-insulating ion conducting material includes lithium tungstate, the electrochromic material includes a tungsten oxide and the counter electrode material includes nickel tungsten oxide (with or without an additional additive as described herein). In a related embodiment a different counter electrode material may be used, including a base anodically coloring material and one or more additives as described herein. In a specific implementation of the aforementioned embodiments, there is no additional material. In one embodiment, the electrochromic layer is between about 300 nm and about 500 nm thick, the interfacial region is between about 10 nm and about 150 nm thick, and the counter electrode layer is between about 150 nm and about 300 nm thick. In another embodiment, the electrochromic layer is between about 400 nm and about 500 nm thick; the interfacial region is between about 20 nm and about 100 nm thick, and the counter electrode layer is between about 150 and about 250 nm thick. In yet another embodiment, the electrochromic layer is between about 400 nm and about 450 nm thick; the interfacial region is between about 30 nm and about 50 nm thick, and the counter electrode layer is about 200 nm and about 250 nm thick.

Another embodiment is a method of fabricating an electrochromic device, the method including: depositing an electrochromic layer by sputtering a tungsten target with a sputter gas comprising between about 40% and about 80% $O_2$ and between about 20% Ar and about 60% Ar to produce $WO_3$ to a thickness of between about 500 nm and about 600 nm, where the substrate upon which the $WO_3$ is deposited is heated, at least intermittently, to between about 150° C. and about 450° C. during formation of the electrochromic layer; sputtering lithium onto the electrochromic layer until the blind charge is satisfied; depositing a counter electrode layer on the electrochromic layer without first providing an ion conducting electronically-insulating layer between the electrochromic layer and the counter electrode layer, where the counter electrode layer includes NiWO (with or without an additional additive as described herein, or in other embodiments this may be another counter electrode material as described herein); sputtering lithium onto the counter electrode layer until the counter electrode layer is substantially bleached; and forming an interfacial region between the electrochromic layer and the counter electrode layer, where the interfacial region is substantially ion conducting and substantially electronically-insulating. In one embodiment, forming the interfacial region includes MTCC of the stack, alone or along with substrate, conductive and/or encapsulation layers.

Figure 4D:
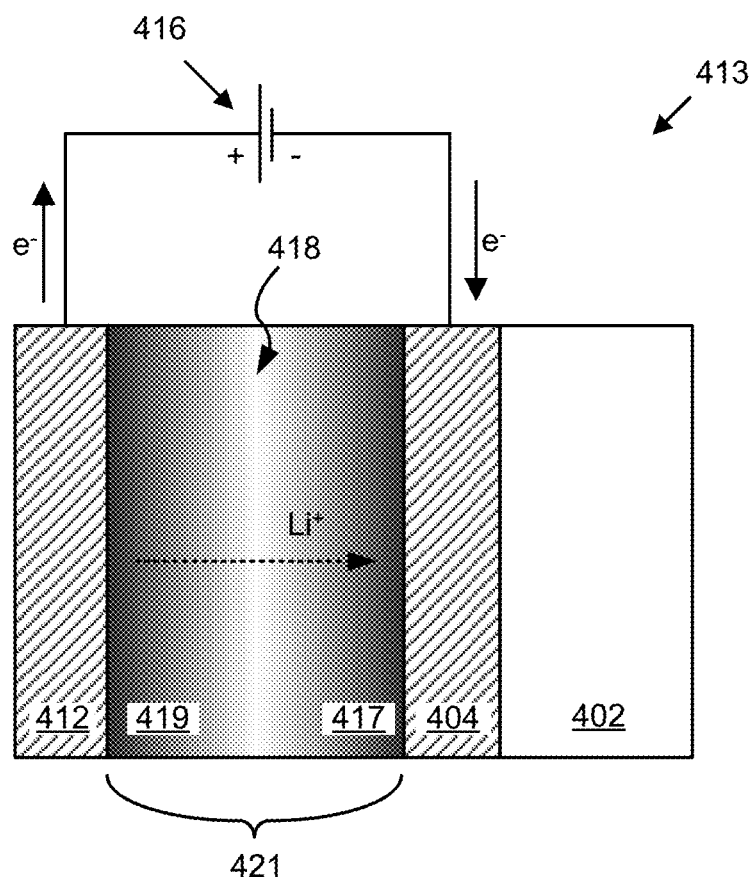

The description in relation to FIGS. 4A-4C was in relation to EC devices, that is, in terms of at least two distinct layers existing in the device architecture. As described, certain embodiments include EC elements where there is only a single layer of graded material that serves the function of an EC device or stack. FIG. 4D depicts one such EC element, 421, which is part of an EC device 413. The EC element 421 is a single layer graded composition, having a cathodically coloring EC region, 417, which transitions to an IC region, 418 (an interfacial region as described herein), which transitions to an anodically coloring CE region, 419. The EC element 421 is sandwiched between two transparent conducting oxide (TCO) electrodes, 404 and 412. Device fabrication in this example includes depositing TCO 404 on substrate 402, the depositing EC element 421 on TCO 404, followed by deposition of TCO 412 on EC element 421. Thus, EC device 413 has only three layers, EC element 421 sandwiched between TCO's 404 and 412. Fabrication of EC elements is described in more detail below.

In a broad sense, an EC element is a single layer EC device stack having successive functional regions as opposed to distinct layers where there is an abrupt material change between layers and de minimus material mixing between successive layers. Rather, an EC element has successive functional regions where there is more than de minimus material mixing between each successive functional region. In certain embodiments, e.g. as described in relation to possible mechanisms for formation of an interfacial region serving as an IC layer, fabrication of an EC element can include judicious choice of materials, where the materials are laid down in a conventional sense, in layers, but where the material choice and/or subsequent processing promotes material mixing and/or chemical and/or morphological changes that transform the interfaces between successive layers into graded regions, and thus, what starts as a stack of layers is transformed into an EC element.

In other embodiments, fabrication of an EC element includes depositing, e.g. sputtering, materials in the vapor phase to deposit successive functional regions in an EC element, where there is more than de minimus material mixing between successive functional regions during the deposition process, that is, in the vapor phase, e.g., materials for successive functional regions are co-sputtered at least for a period between sputtering of the first material and sputtering of the second material. In the example of all sputter deposited materials, this result may be accomplished by, e.g., using sputter targets having the appropriate composition and configuration such that material mixing is limited to some fraction of each of the successive functional regions. That is, the functional regions are composed primarily of some material (which itself may be a graded composition) and this material is deposited to form the bulk of the function region. For example, material mixing occurs during transition from sputtering a first material, from which a first functional region is comprised, to sputtering a second material, from which the next successive functional region is comprised. There is some mixing (co-sputtering) during this transition between the two materials, which ceases at some point, and then the second material is sputtered for a period, followed by a transition where the second material is sputtered along with a third material. The transition from the second functional region to the third function region includes co-sputter of the second and third materials. The third material is sputtered alone for a period, followed by the next transition if there is a fourth material, and so on. In certain embodiments, the material mixing occurs in the vapor phase, prior to the materials being deposited (although there may be further mixing and/or morphological changes after deposition). Particular embodiments for achieving sputtering profiles for creating EC elements are described below.

One embodiment is a method of fabricating a single layer graded composition EC element on a substrate in a sputter system, including: a) sputter coating an EC material including a first transition metal and a first oxygen concentration onto the substrate; b) increasing from the first oxygen concentration to a second oxygen concentration, higher than the first, during a); c) introducing lithium into the sputter system; and d) sputter coating a CE material including at least a second transition metal and oxygen; wherein the fabrication is a substantially continuous process and the concentration of the first transition metal is decreased from a) to d), and the concentration of the second transition metal is increased from a) to d). In one embodiment, the first transition metal is tungsten or another additive as described herein. In one embodiment, the second transition metal is nickel or another metal in a base anodically coloring material as described herein. In one embodiment, introducing lithium into the sputter system includes sputtering target comprising a lithium compound. In one embodiment, the lithium compound is lithium tungstate.

Methods of fabricating EC elements described herein can be performed, for example, using a sputter system having capability of introducing targets and/or target materials during plasma sputter. Another way to accomplish these methods is to arrange a series of targets, in substantially contiguous fashion, where the targets' composition reflects the composition of the desired graded EC element, and pass the substrate pass the targets during sputter (and/or pass the targets past the substrate during sputter). Yet another way of performing these methods is to sputter from a single a target, the composition of which reflects the composition of the desired graded EC element. These embodiments are described in more detail below.

One embodiment is a method of fabricating a single layer graded composition EC element on a substrate in a sputter system, including sputter coating materials from a plurality of closely associated sputter targets such that there is mixing of materials sputtered from each target in the region where two targets are proximate each other; where the single layer EC element is fabricated upon a single pass of the substrate and the plurality of closely associated sputter targets past each other.

Figure 4E:
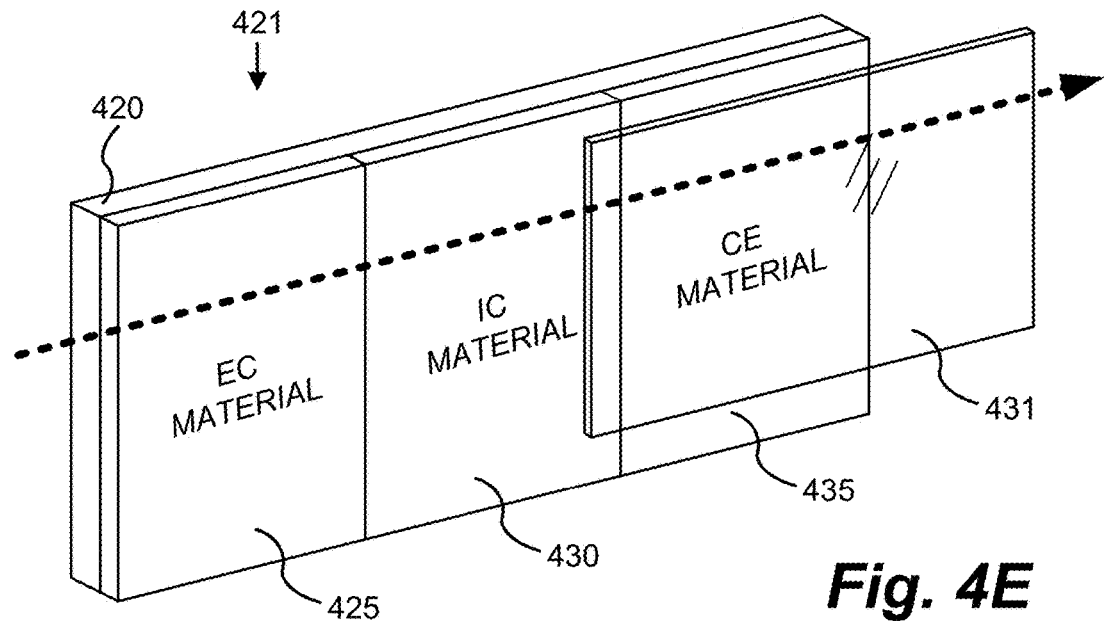
FIGS. 4E-4G depict sputter targets and aspects of sputtering methods in accord with embodiments described herein.

FIG. 4E depicts a target assembly, 421, which may be used to fabricate an EC element as described herein. Target assembly 421 includes a backing plate, 420, on which are affixed three target sections, an EC target section, 425, an IC target section, 430, and a CE target section, 435. In some embodiments, the IC target section 430 is omitted. Each of the target sections comprises a material reflective of the majority constituent of the deposited region to which they correspond. A substrate, 431, is translated past target assembly 421 as depicted by the heavy dashed arrow. One of ordinary skill in the art would appreciate that three separate targets, each with their own power supply and backing plate, for example, would also work, so long as the targets were proximate during sputter deposition such that there was some mixing of materials from the sputter plasmas in the areas near contiguous target edges. For the purposes of this description the term "closely associated sputter targets" is meant to include these possibilities. Also, although FIG. 4E depicts linear edges of the target sections proximate and parallel to each other, this need not be so. For example, the adjoining (or proximate) edges of targets could be curved, zig zag or other complementary (or not) shapes to enhance plasma and thus material mixing in the deposited layer. Also, although in this example there are three target sections, this need not be so. For example there may be many target sections, reflective of the graded composition along the sputter deposition path, for example, of varying widths, shapes and compositions depending upon the desired outcome. The width of the target, speed of translation of the substrate and/or target past each other, sputter power, etc. will determine the characteristics of the deposited single film graded composition. The plurality of closely associated sputter targets need not be planar targets, but may be rotary targets or combinations of planar, rotary and other target types and/or shapes appropriate to effect the desired outcome in the graded composition.

Referring again to FIG. 4E, as indicated by the heavy dashed arrow, substrate 431 and target assembly are translated relative to each other, for example the substrate is passed along and in front of the target assembly, during sputter deposition. As the substrate moves along the target, a single layer graded composition that functions as an EC device is deposited on the substrate. In one embodiment, a plurality of closely associated sputter targets includes a target including an EC material, a target including an IC material and a target including a CE material. In one embodiment, the EC material includes tungsten oxide. In one embodiment, the IC material includes lithium tungstate. In one embodiment, the CE material includes nickel tungsten oxide (optionally with another additive as described herein). In another embodiment, the EC material includes tungsten oxide or another metal oxide, and the CE material includes a base anodically coloring material such as nickel oxide (or other base anodically coloring materials as described above) doped, alloyed, or otherwise combined with an additive/second metal as described above. The IC material may be omitted, such that the EC material and CE material are deposited in contact with one another, with no IC layer between them. After formation, the device may be subjected to a thermal or other type of treatment to convert part of the interfacial region between the EC and CE layers to a region that acts as an IC layer.

The sputter targets shown in FIG. 4E may be metals, metal alloys, metal oxides, or oxides of metal alloys. One or more sputter targets may be used to deposit a layer of material. For example, to form a counter electrode made from an oxide of a first and second metal, either one or two sputter targets may be used. Where one sputter target is used, the target should include the first metal and the second metal in homogenous or inhomogenous combination. An example of a homogenous composition is an alloy of two or more of the metals. Examples of inhomogeneous combinations include mosaics of the two or more metals. The mosaic patterns can be any appropriate geometric shape including pie shaped, rectangular grid shaped, etc. The sputter target may also include oxygen, though in various cases the sputter target includes only metal, and the sputtering occurs in the presence of oxygen under appropriate temperatures and partial pressures to thereby form the desired oxide material of the counter electrode. Where two sputter targets are used simultaneously, the first target should include the first metal and the second target should include the second metal. Each target may or may not include oxygen, for example in the form of a metal oxide. In some cases, sputtering from two targets may occur in the presence of oxygen (or other electronegative elements) to form a desired metal oxide counter electrode material.

In a particular example, a device includes a counter electrode layer including nickel tantalum oxide (in some cases tantalum doped nickel oxide). Where a single sputter target is used to deposit this layer, the sputter target may include a mixture or alloy of nickel tantalum, or nickel tantalum oxide, or a patchwork of nickel and tantalum or their oxides. Where two sputter targets are used to deposit this layer, the first sputter target may include nickel or nickel oxide, and the second sputter target may include tantalum or tantalum oxide. One or both of the targets can contain two or more metals such as the case where there is some overlap between two of the counter electrode metals in one target. Typically the targets will have different compositions.

In certain embodiments, the amount of base anodically coloring metal present in the counter electrode can be up to about 90% by weight of the counter electrode material. In a specific embodiment, the mass ratio of the base metal to the second metal (often referred to herein as an additive) in the anodically coloring material is between about 4:6 and 6:4, in one example, about 1:1. In one embodiment, the anodically coloring material is between about 15-60% (atomic) base metal, and between about 10-40% second metal. In another embodiment, the anodically coloring material is between about 30-45% (atomic) base metal, and between about 15-35% second metal. In another embodiment, the anodically coloring material is between about 30-45% (atomic) base metal and between about 20-30% second metal. In one embodiment, the anodically coloring material is about 42% (atomic) base metal and about 14% second metal.

In certain embodiments, the amount of nickel present in a nickel-metal oxide counter electrode (e.g., where the second metal is tantalum or another additive material listed above) can be up to about 90% by weight of the nickel-metal oxide. In a specific embodiment, the mass ratio of nickel to the second metal in the nickel-metal oxide is between about 4:6 and 6:4, in one example, about 1:1. In one embodiment, the nickel-metal oxide is between about 15-60% (atomic) Ni, and between about 10-40% second metal. In another embodiment, the nickel-metal oxide is between about 30-45% (atomic) Ni, and between about 15-35% second metal. In another embodiment, the nickel-metal oxide is between about 30-45% (atomic) Ni and between about 20-30% second metal. In one embodiment, the nickel-metal oxide is about 42% (atomic) Ni and about 14% second metal.

In these or other embodiments, the electrochromic layer may be made from any suitable material, and in one example is tungsten oxide. The thickness of the electrochromic layer may be between about 300-600 nm, and the thickness of the counter electrode may be between about 150-300 nm. The electrochromic device may be fabricated on an apparatus as shown in FIGS. 4E-4G, 4I-4Q, and 5 (with or without a separate target for an IC layer).

In another particular example, a device includes a counter electrode layer including nickel germanium oxide. Where a single sputter target is used to deposit this layer, the sputter target may include a mixture or alloy of nickel germanium, or nickel germanium oxide, or a patchwork of nickel and germanium or their oxides. Where two sputter targets are used to deposit this layer, the first sputter target may include nickel or nickel oxide, and the second sputter target may include germanium or germanium oxide. One or both of the targets can contain two or more metals such as the case where there is some overlap between two of the counter electrode metals in one target. Typically the targets will have different compositions.

In certain embodiments, the amount of nickel present in a nickel germanium oxide counter electrode (where the second metal is germanium) can be up to about 90% by weight of the nickel-germanium oxide. In a specific embodiment, the mass ratio of nickel to the germanium in the nickel-metal oxide is between about 4:6 and 6:4, in one example, about 1:1. In one embodiment, the nickel-germanium oxide is between about 15-60% (atomic) Ni, and between about 10-40% germanium. In another embodiment, the nickel-germanium oxide is between about 30-45% (atomic) Ni, and between about 15-35% germanium. In another embodiment, the nickel-germanium oxide is between about 30-45% (atomic) Ni and between about 20-30% germanium. In one embodiment, the nickel-germanium oxide is about 42% (atomic) Ni and about 14% germanium. In these or other embodiments, the electrochromic layer may be made from any suitable material, and in one example is tungsten oxide. The thickness of the electrochromic layer may be between about 300-600 nm, and the thickness of the counter electrode may be between about 150-300 nm. The electrochromic device may be fabricated on an apparatus as shown in FIGS. 4E-4G, 4I-4Q, and 5 (with or without a separate target for an IC layer).

In a further example, a device includes a counter electrode layer including nickel gallium oxide. Where a single sputter target is used to deposit this layer, the sputter target may include a mixture or alloy of nickel gallium, or nickel gallium oxide, or a patchwork of nickel and gallium or their oxides. Where two sputter targets are used to deposit this layer, the first sputter target may include nickel or nickel oxide, and the second sputter target may include gallium or gallium oxide. One or both of the targets can contain two or more metals such as the case where there is some overlap between two of the counter electrode metals in one target. Typically the targets will have different compositions.

In certain embodiments, the amount of nickel present in a nickel gallium oxide counter electrode (where the second metal is gallium) can be up to about 90% by weight of the nickel gallium oxide. In a specific embodiment, the mass ratio of nickel to the gallium in the nickel gallium oxide is between about 4:6 and 6:4, in one example, about 1:1. In one embodiment, the nickel gallium oxide is between about 15-60% (atomic) Ni, and between about 10-40% gallium. In another embodiment, the nickel gallium oxide is between about 30-45% (atomic) Ni, and between about 15-35% gallium. In another embodiment, the nickel gallium oxide is between about 30-45% (atomic) Ni and between about 20-30% gallium. In one embodiment, the nickel gallium oxide is about 42% (atomic) Ni and about 14% gallium. In these or other embodiments, the electrochromic layer may be made from any suitable material, and in one example is tungsten oxide. The thickness of the electrochromic layer may be between about 300-600 nm, and the thickness of the counter electrode may be between about 150-300 nm. The electrochromic device may be fabricated on an apparatus as shown in FIGS. 4E-4G, 4I-4Q, and 5 (with or without a separate target for an IC layer).

In another example, a device includes a counter electrode layer including nickel gadolinium oxide. Where a single sputter target is used to deposit this layer, the sputter target may include a mixture or alloy of nickel gadolinium, or nickel gadolinium oxide, or a patchwork of nickel and gadolinium or their oxides. Where two sputter targets are used to deposit this layer, the first sputter target may include nickel or nickel oxide, and the second sputter target may include gadolinium or gadolinium oxide. One or both of the targets can contain two or more metals such as the case where there is some overlap between two of the counter electrode metals in one target. Typically the targets will have different compositions.

In certain embodiments, the amount of nickel present in a nickel gadolinium oxide counter electrode (where the second metal is gadolinium) can be up to about 90% by weight of the nickel gadolinium oxide. In a specific embodiment, the mass ratio of nickel to the gallium in the nickel gadolinium oxide is between about 4:6 and 6:4, in one example, about 1:1. In one embodiment, the nickel gadolinium oxide is between about 15-60% (atomic) Ni, and between about 10-40% gadolinium. In another embodiment, the nickel gadolinium oxide is between about 30-45% (atomic) Ni, and between about 15-35% gadolinium. In another embodiment, the nickel gadolinium oxide is between about 30-45% (atomic) Ni and between about 20-30% gadolinium. In one embodiment, the nickel gadolinium oxide is about 42% (atomic) Ni and about 14% gadolinium. In these or other embodiments, the electrochromic layer may be made from any suitable material, and in one example is tungsten oxide. The thickness of the electrochromic layer may be between about 300-600 nm, and the thickness of the counter electrode may be between about 150-300 nm. The electrochromic device may be fabricated on an apparatus as shown in FIGS. 4E-4G, 4I-4Q, and 5 (with or without a separate target for an IC layer). Of course, one of ordinary skill in the art would understand that any of the disclosed counter electrode materials may be formed in a similar way using one or more targets containing the base anodically coloring material and the additive material, in metal and/or oxide form.

Figure 4F:
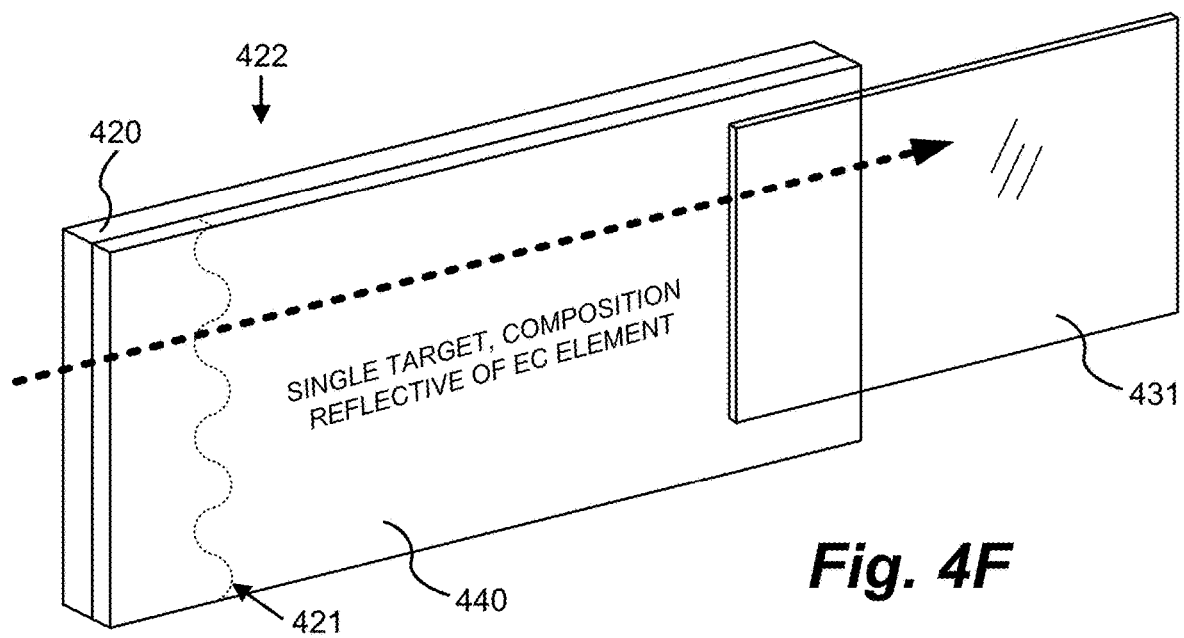

As described above, another embodiment is a method of fabricating a single layer graded composition EC element on a substrate in a sputter system, including sputter coating materials from a single sputter target including a composition substantially reflective of the single layer EC element; wherein the single layer EC element is fabricated upon a single pass of the substrate and the single sputter target past each other. This is illustrated in FIG. 4F. Target assembly 422 includes a backing plate 420, to which is affixed a sputter target, 440. Sputter target 440 has a composition reflective of the desired EC element to be deposited. During sputtering, a substrate is translated past sputter target 440 in a single pass, during which the EC element is deposited. The single target can be manufactured, e.g., by sintering together materials for each of the respective regions of the EC element. In one embodiment, target sub-sections are sintered together; that is, smaller pre-formed target sections are sintered and/or fused together into the single target. The individual target sections that are sintered into a single target may have straight edges prior to sintering together, e.g. target sections as depicted in relation to FIG. 4E. In other embodiments, the individual target sub-sections are interleaved at the abutting edges, e.g. as depicted in FIG. 4F, line 421, prior to sintering. That is, the target sub-sections may fit together, e.g. like postage stamps, having interleaved edges. In certain embodiments, interleaving provides for bettering mixing of materials at the transition between two materials in the EC element (thus in one embodiment, the interleaving obviates the need for sintering sections into a single target). The interleaving can be of any shape, e.g. curved as line 421 suggests, or zig-zag, rectangular interlocking, and the like. Also, the interleaving can be gross, having large interleaving features and/or very fine or small interleaving features, e.g. prismatically interleaved surfaces are abutted and the target sub-sections sintered together.

In one embodiment, the single sputter target includes a region of EC material, which is graded into a region of IC material, which is graded into a region of CE material. In one embodiment, the region of EC material includes tungsten oxide. In one embodiment, the region of IC material includes lithium tungstate. In one embodiment, the region of CE material includes a base anodically coloring material and one or more additives. In one particular embodiment, the region of CE material includes nickel tungsten oxide.

Figure 4G:
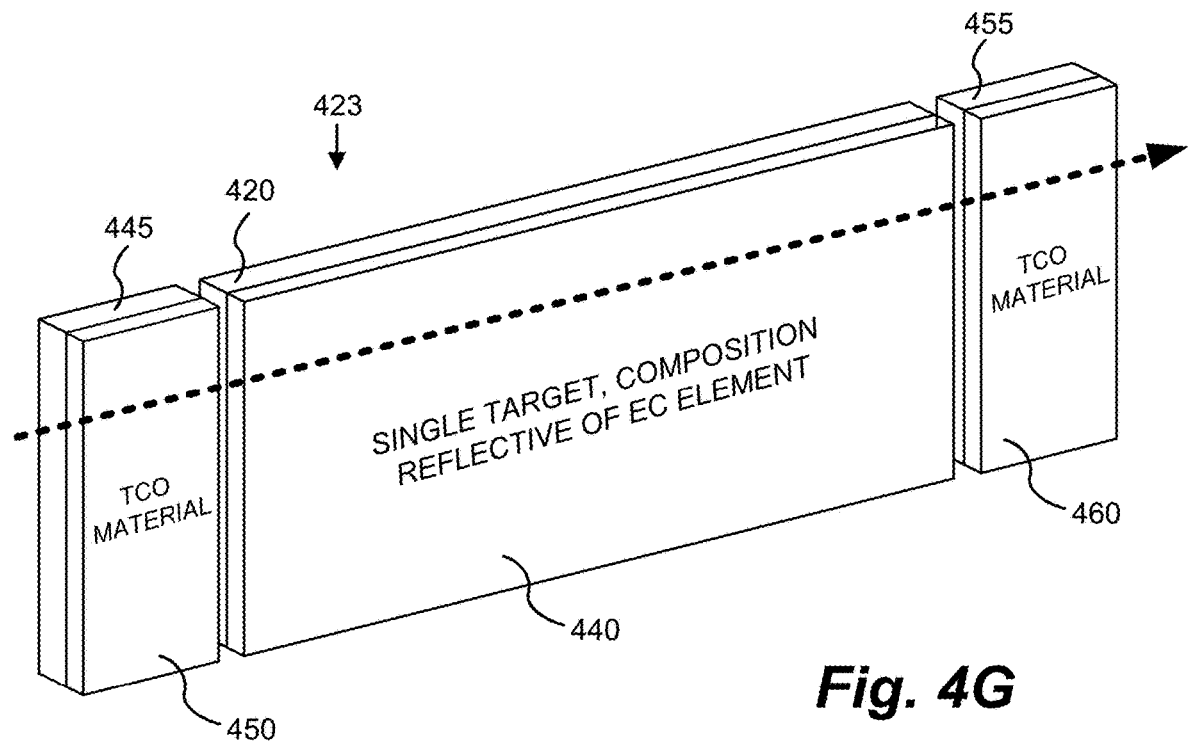

In the description above, an EC element is often described in terms of a single layer graded composition having an EC region, an IC region and a CE region. In certain embodiments, this EC element is described as being sandwiched between two transparent conducting oxide (TCO) electrodes in order to form an EC device. FIG. 4G illustrates a target arrangement, 423, that can be used to fabricate such an EC device. In this arrangement, target assembly 422, as described in relation to FIG. 4F, is situated between two separate targets, 450 having a backing plate 445, and 460 having a backing plate 455. Assuming there is no mixing of materials between targets 450, 440 and 460 during sputtering, an EC element sandwiched between two TCO layer electrodes will be formed in a single pass sputter deposition. However, if targets 450 and 460 are proximate target 440 such that there is material mixing by design during sputtering, then an EC element such as described in relation to FIG. 4H is formed.

Figure 4H:
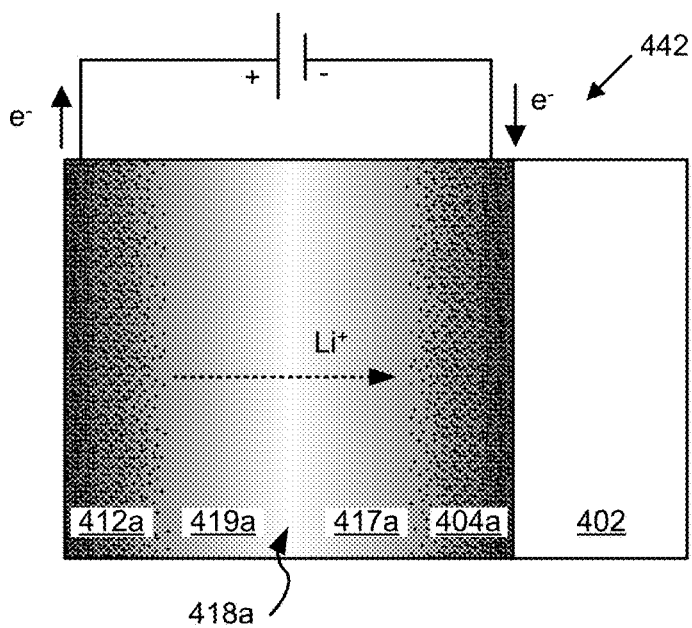
FIG. 4H depicts a schematic cross section of an electrochromic element.

FIG. 4H is a cross section schematic of an EC element, 442. EC element 442 is a single layer graded composition having a first TCO region, 404a, a cathodically coloring EC region, 417a, an IC region, 418a, an anodically coloring CE region, 419a and a second TCO region, 412a. Once appropriately lithiated (during formation of EC element 442, or not), as depicted, a potential can be applied across EC element 442 and it will function as a conventional EC device. However, EC element 442 is a single layer graded composition, deposited in a single pass on a substrate. This is a radical departure from conventional fabrication methods and EC structure. Using the methods described herein, one can coat a single layer of material on a substrate, where the material behaves as a conventional EC device would. This saves considerable processing steps and the result is highly desirable—a single layer film switchable coating, e.g. one that includes complementary coloring functional regions. One advantage of such a construct is that delamination resulting from adhesion issues between material layers is avoided. Of course, as described above, there are various target arrangements that can accomplish these methods.

Figure 4I:
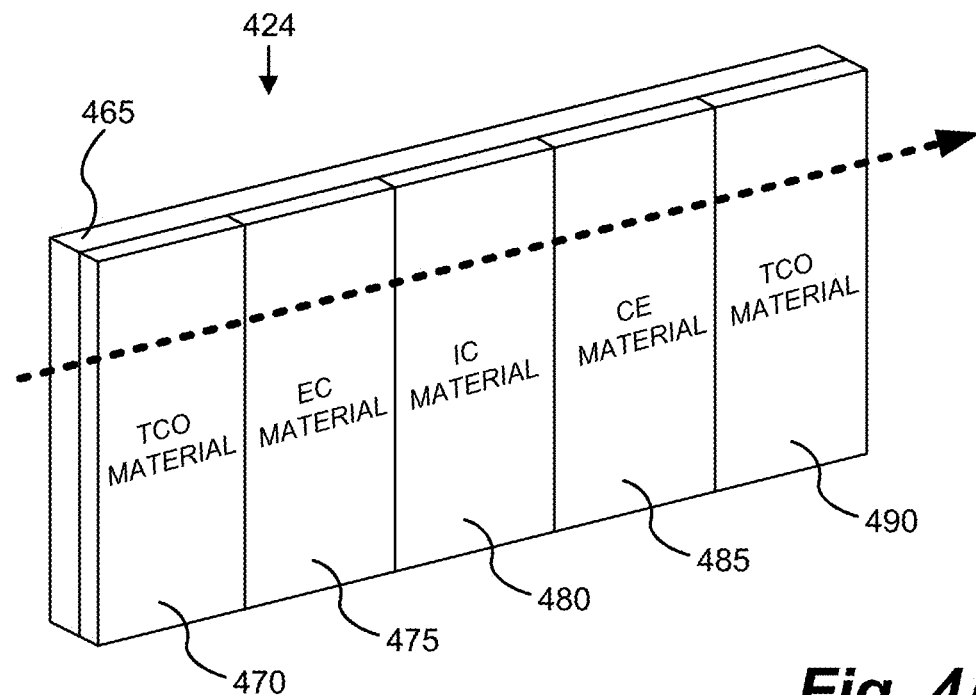
FIGS. 4I-4L depict sputter targets and aspects of sputtering methods in accord with embodiments described herein.

As described in relation to FIG. 4G, if the target sections are appropriately spaced one can fabricate an EC element such as that described in relation to FIG. 4H. Alternatively, a target assembly, 424, as depicted in FIG. 4I could be used. Target assembly 424 includes a single backing plate, 465, on which are mounted a plurality of target sections, 470-490, whose composition correspond to the regions of the desired EC element on the substrate post sputter. In this example, the neighboring target sections are abutting or in close proximity with each other. The abutting or closely neighboring edges may not be straight as depicted, but may include interleaving as described in relation to FIG. 4F. One embodiment is a method of fabricating an EC element including five successive functional regions: a first transparent conductor region, a cathodically coloring electrochromic region, an ion conducting region, an anodically coloring electrochromic region and a second transparent conductor region; the method comprising substantially continuous sputtering during formation of the five successive functional regions.

Figure 4J:
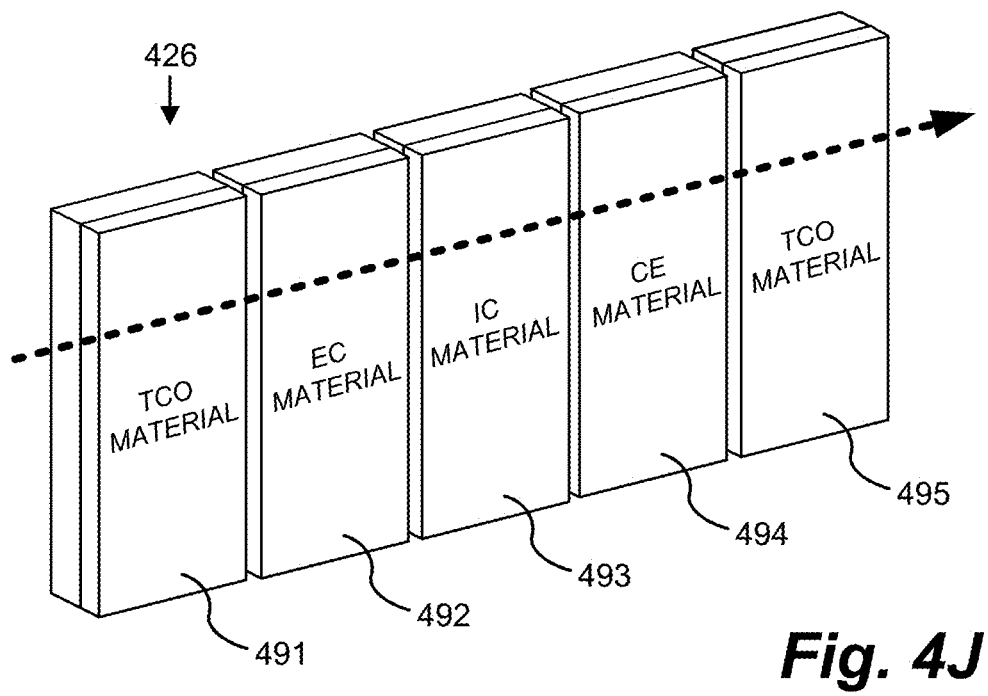

FIG. 4J shows yet another alternative, sputter target assembly 426, which is a plurality of closely associated sputter targets, 491-495, e.g. each with their own backing plate and associated power supply and magnetic source, whose composition correspond to the regions of the desired EC element on the substrate post sputter. Targets 491-495 are configured so that there is material mixing by design of the plasmas for each target in the regions between the targets. Conventional thought is to have complete isolation and control of sputter plasma geometry such that a substrate can be passed by the sputter target and a film of highly uniform composition, reflecting the target and sputter gas composition is deposited. In embodiments described herein, material mixing of adjacent plasma and/or material deposited on a substrate is by design so that a single layer graded composition results. One of ordinary skill in the art would appreciate that various target arrangements and materials are possible without deviating from the scope of the description. For example, rather than five target sections as depicted in FIG. 4I, the first TCO target section may be obviated if the substrate is, e.g., float glass with a TCO, e.g. a fluorinated tin oxide pyrolytic coating, already deposited (the result would be in this example, an EC device because there are two layers, the TCO and an EC element with four regions). In another example, rather than five sputter targets, as depicted in FIG. 4J, one might choose to use ten targets, e.g., of less width but having overall substantially the same collective width, for more material mixing throughout the deposition and thus in the deposited single layer graded composition. Lithium sputter targets (not depicted) may also be included at various positions in the target arrangement. In yet another example, a reflective region, a thermochromic region, a photochromic region, and/or a photovoltaic region may be desired. In this example, targets are configured and/or arranged so that corresponding reflective, thermochromic, photochromic and/or photovoltaic regions are incorporated in the EC element.

Figure 4K:
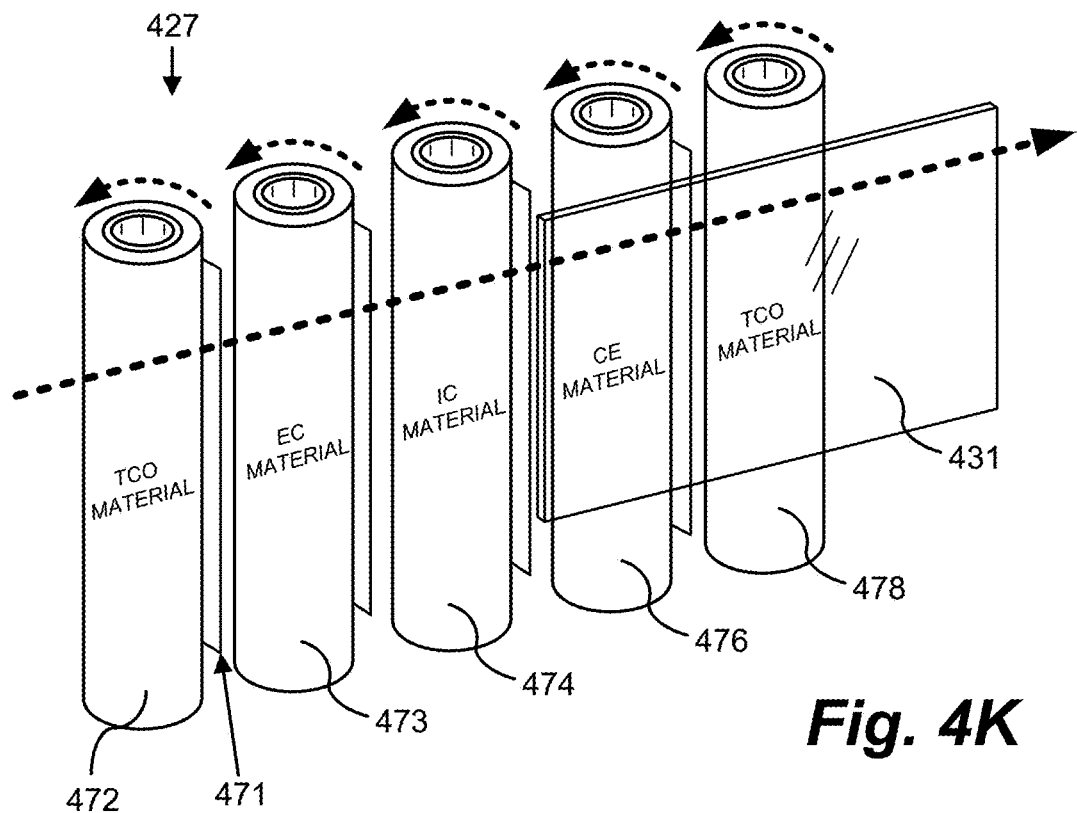

FIG. 4K shows yet another alternative, sputter target assembly 427, which is a plurality of closely associated rotary sputter targets, 472, 473, 474, 476 and 478, e.g. each with their own associated power supply and magnetic source, whose composition correspond to the regions of the desired EC element on substrate 431 post sputter. The rotary targets are configured so that there is material mixing by design of the plasmas for each target in the regions between the targets. In this example, there are baffles, 471, between each rotary target. Baffles 471 may be movable, in order to attenuate or augment material mixing in the region between neighboring rotary targets. The baffles may be moved perpendicular to the substrate, toward or away from the substrate and/or along an axis parallel to the substrate, between two rotary targets, such that the separation between the baffle and any two targets on either side can be controlled. By being able to move the baffles in this manner, the material mixing in the region between neighboring targets can be controlled and designed for the desired result. The baffles may not have straight edges as depicted, i.e., they may have edges with curved edges, jagged edges, rectangular cuts, etc. in order to mediate material mixing in the region between targets. In addition to, or in the alternative to baffles, sputter targets (planar or rotary) may be configured to move toward and away from each other and/or toward and away from the substrate during sputter deposition. The rotary targets in FIG. 4K are depicted as rotating in the same direction, but this is but one embodiment. In other embodiments, the rotary targets may turn in alternating directions or in any combination, e.g., two clockwise, one counter clockwise, two clockwise, etc.

Figure 4L:
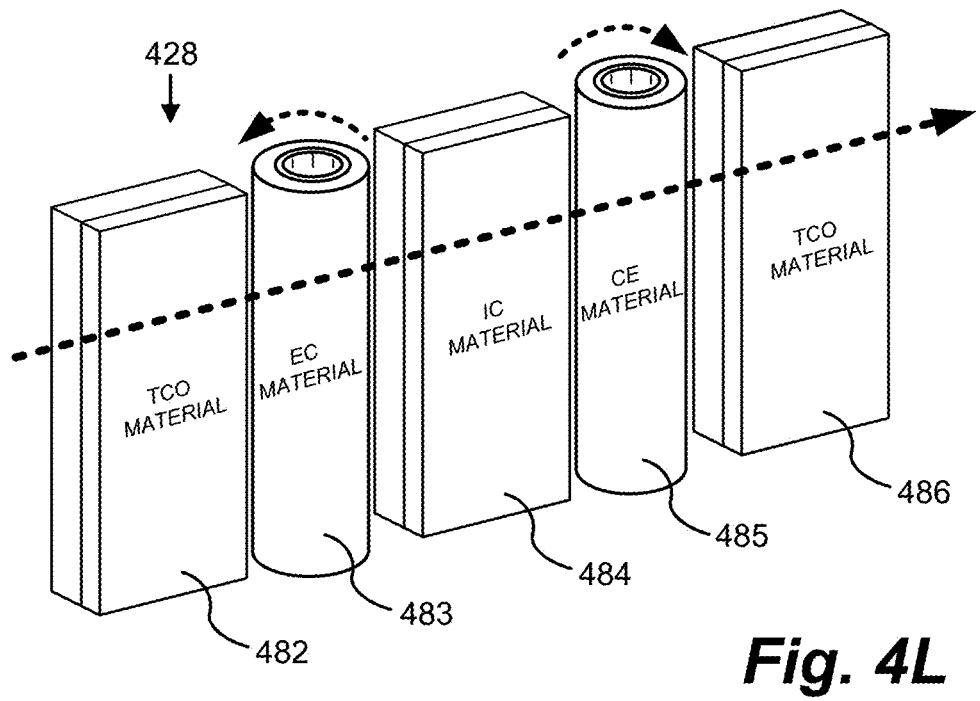

FIG. 4L shows yet another alternative sputter target assembly 428, which is a plurality of closely associated sputter targets, 482, 483, 484, 485 and 486, e.g., each with their own associated power supply and magnetic source, whose composition correspond to the regions of the desired EC element on a substrate post sputter. This example shows a mixture of planar sputter targets and rotary targets. In this example, rotary targets 483 and 485 rotate opposite each other. The neighboring targets may have baffles as described above or not. The order and number of rotary and planar targets may vary, depending upon the desired sputter outcome. For example, there may be two planar targets and three rotary targets or four planar targets and one rotary target. Mixing rotary and planar targets allows for greater flexibility in process design and control. Parameters related to sputter deposition of an EC element are described in more detail below.

Figure 4M:
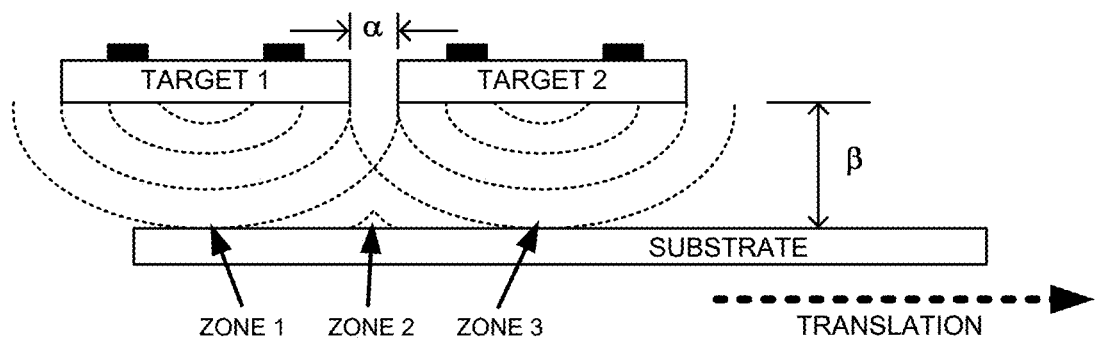
FIGS. 4M, 4N, 4P and 4Q are schematic representations of sputtering according to embodiments described herein.

Certain embodiments described herein include using a plurality of separate sputter targets arranged in close proximity in order to create overlapping zones of different material plasmas which allows fabrication of an EC element. FIG. 4M depicts various geometries as they relate to process parameters in relation to two planar sputter targets in close proximity and a substrate translating past the targets. The distance between the sputter targets, $\alpha$, is one factor that affects material mixing in the sputter plasmas. The distance between the sputter targets will be a factor in the amount of overlap of plasma densities (as depicted by the curved dotted lines radiating from each target. Also, the shape and density of the plasma from each target will be affected by the magnetic field shape and strength (the black rectangles represent the magnets of the cathode) as well as the pressure and power density used to generate the plasma. The distance between the sputter target and the substrate, $\beta$, is another parameter that affects how proximate sputter plasmas will mix. The distance between the target and the substrate will determine how dense the plasma impinging on the substrate will be. The distance $\beta$ can be varied to increase or decrease the density of the plasma impinging on the substrate, for example, by moving the targets toward, or away from, the substrate; moving the substrate toward, or away from the targets, or both.

In certain embodiments, the relationship between distances $\alpha$ and $\beta$ are chosen to impact the density and shape of the plasmas as well as the desired deposition profile. In one embodiment, for deposition using mixed plasmas between two targets, the ratio of $\beta$ to $\alpha$ is between about 1 and about 10, in another embodiment between about 1.5 and about 5, and in another embodiment between about 2 and about 5. The plasma densities depicted in FIG. 4M are merely representative. In this example, the plasma densities are drawn as symmetrical and equivalent in shape. This is not necessary. For example, as described, the plasmas are of different materials (as reflected by the target compositions) and therefore may require different energies, pressures, etc. to be created and maintained. As well, the magnets of the cathodes may be configured in various ways to shape the plasmas and create varying densities appropriate for a particular deposition profile for a desired EC element. As depicted in FIG. 4M, this configuration creates three zones. Zone 1 is a material deposition zone that is substantially comprised of the material from which target 1 is made. Zone 3 is a material deposition zone that is substantially comprised of the material from which target 2 is made. Zone 2 is a material deposition zone that is substantially a mixture of the two target materials. The relative concentrations of the plasma from target 1 and the plasma from target 2 in zone 2 is generally a gradient along the length (parallel to translation of the substrate) of zone 2. The gradient can be manipulated by, e.g., configuring the plasma densities and shapes of two successive targets. The plasma densities, material properties, magnetic coils, and the like are factors that allow these zones to be established and maintained in a steady state so that varying compositions can be deposited on the substrate as it translates past the targets.

Another parameter that affects the deposition is the speed at which the substrate and the target assembly pass by one another. For example, the speed of translation of the substrate past the targets will be a factor in how much material is deposited onto the substrate. In one embodiment the translation speed of the substrate past the targets is constant, in another embodiment it varies. In one embodiment, the translation speed of the substrate past the targets is between about 0.1 meters per second and about 1 meter per second, in another embodiment between about 0.1 meters per second and about 0.5 meters per second, and in another embodiment between about 0.2 meters per second and about 0.5 meters per second. The speed of the substrate will determine the travel distance, that is, how far a particular point on the substrate must traverse in each deposition zone, or collectively, across the target assembly that creates the EC element. The thickness of the EC element, and of each material or mixture of materials deposited in each deposition zone, will directly depend on the translation speed, the travel distance, as well as the plasma density, shape, etc. as described above.

Figure 4N:
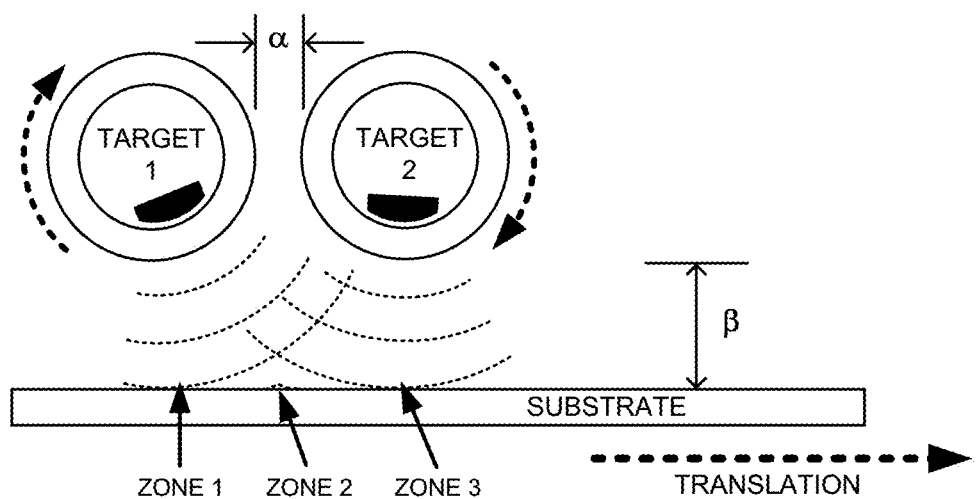
Figure 4P:
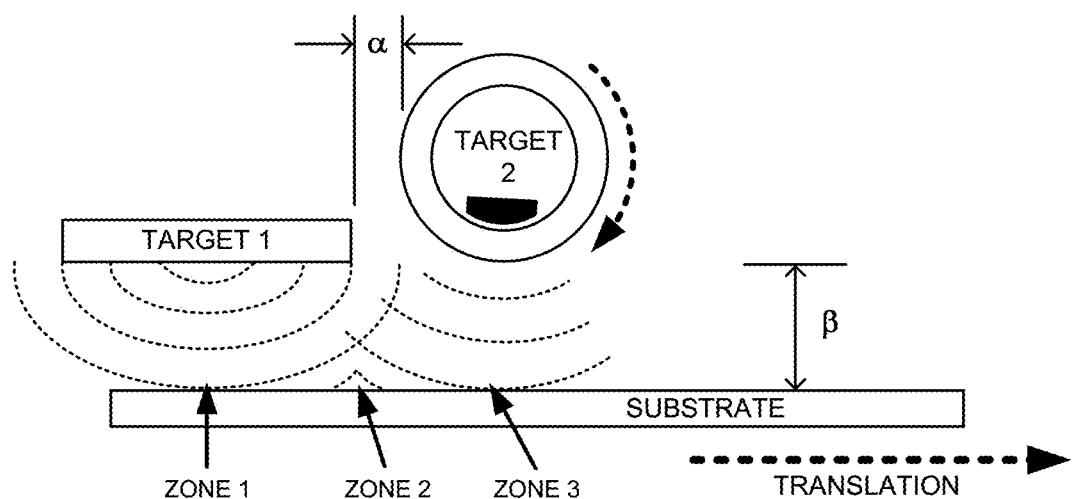

FIGS. 4N and 4P depict arrangements with two rotary targets and one planar and one rotary target, respectively. For these configurations, the distances $\alpha t$ and $\beta$ are as described above in relation to FIG. 4M. Referring to FIG. 4N, rotary targets 1 and 2 are depicted as having their internal magnets (depicted as dark curved structures in the interior of each target) configured to generate plasmas at different angles with respect to the substrate surface. This is another example of how plasma densities and shapes can be manipulated in order to create material deposition zones 1-3. The rotation of the targets can be in the same direction or not. Referring to FIG. 4P, planar target 1 and rotary target 2 are proximate each other. This arrangement produces another unique plasma deposition profile across three zones. FIGS. 4M, 4N and 4P depict the three possible combinations of two proximate planar and/or rotary targets. As described herein, various combinations of successive planar and rotary targets are possible. Considering any three successive targets in an assembly for depositing an EC element, a planar target may be flanked by two planar targets, two rotary targets, or one planar and one rotary target. Likewise a rotary target may be flanked by two planar targets, two rotary targets, or one planar and one rotary target. As discussed above, baffles may also be used in between targets, planar or rotary, to further shape and control plasma mixing between two targets.

As described herein in relation to fabrication of an EC element, multiple targets may be arranged proximate each other and a substrate passed by the sputter plasmas emanating from the targets, including mixing between successive targets, in order to deposit an EC element on the substrate. One of ordinary skill in the art would appreciate that the more disparate the characteristics of the materials of each target, the more variables there are to be considered when configuring a particular system to deposit an EC element, particularly creating contiguous plasmas from each target. This is true because of the different power requirements, pressures, temperatures and the like that are required for each of the target materials. In certain embodiments, the target materials are selected so that the conditions used to create plasmas from each are similar. In one embodiment, each of the assembly of sputter targets comprises a metal oxide. In one embodiment, each of the assembly of sputter targets comprises a transition metal oxide. Each target may also include a compound that contains a transition metal and an alkali metal, e.g., lithium tungstate. By using targets that each have a metal oxide, the process conditions for sputtering each of the successive targets are more closely matched. This aids in sputtering an EC element, because, e.g., the pressure, temperature, power etc. are more normalized across the targets. This allows for less complication in the configuration of the sputter chamber that contains the targets, e.g., less baffles or other measures to accommodate pressure, temperature or power density differentials in successive target zones. For example, in one embodiment the temperature across the deposition zones does not vary by more than about 150° C., in another embodiment the temperature across the deposition zones does not vary by more than about 100° C., in another embodiment the temperature across the deposition zones does not vary by more than about 50° C. In another example, the pressure across the deposition zones does not vary by more than about 10 mTorr, in another embodiment the pressure across the deposition zones does not vary by more than about 5 mTorr, in another embodiment the pressure across the deposition zones does not vary by more than about 2 mTorr. In one embodiment an EC element is fabricated using a tungsten target, a lithium tungstate target and a nickel tungsten target. The EC element is fabricated using argon or other inert sputter gas along with oxygen as described herein. In one embodiment, the EC element is lithiated via lithium sputter using a lithium metal target downstream from the target assembly used to fabricate the EC element.

Figure 4Q:
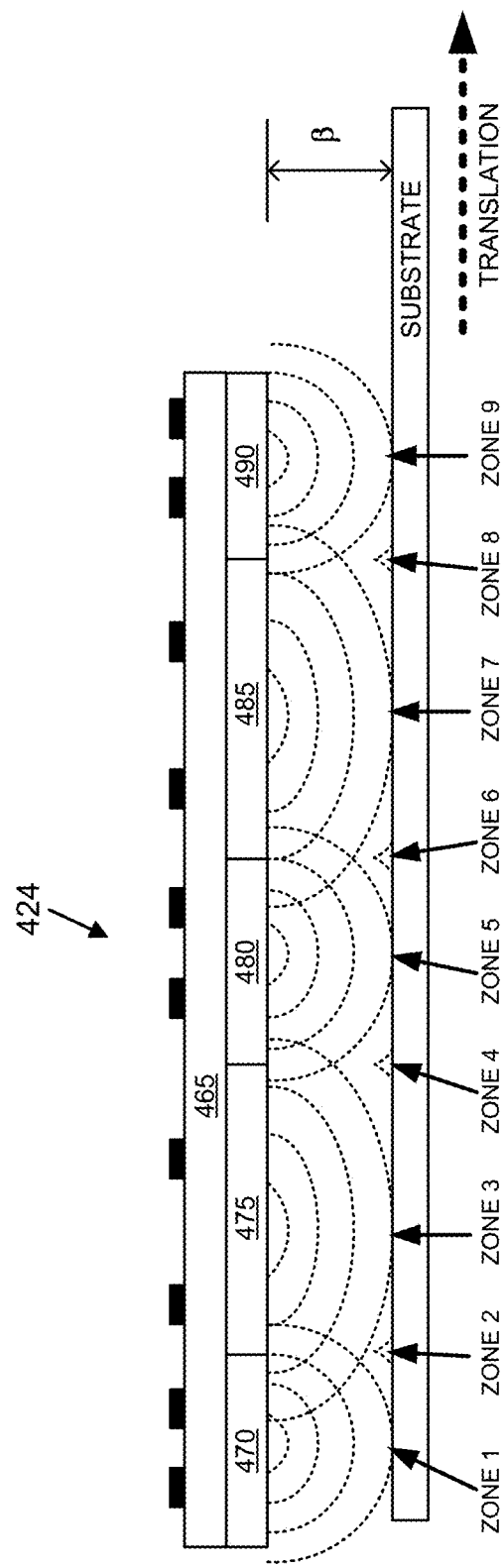

In certain embodiments, as described above, rather than using a plurality of separate sputter targets arranged in close proximity in order to create overlapping zones of different material plasmas, one can use a single target with varying composition across the target (e.g. see FIGS. 4F and/or 4G and associated description) or a plurality of abutting targets on a single backing plate (e.g. see FIGS. 4E and/or 4I and associated description) to fabricate an EC element. For example, taking the example from FIG. 4I, target assembly 424, where five target sections, 470, 475, 480, 485 and 490, are affixed to a backing plate 465, FIG. 4Q depicts a single plasma geometry across the five targets. In this example, the sputter target sections are abutted together or very close together so, α, is very small or non-existent. The relative widths of the targets are only representative, they may in reality be much wider or narrower than each other, depending upon the plasma density, amount of material desired in the deposition, thickness of regions, etc. The distance β is shown, which is, again, important due to the plasma densities, etc. as the substrate passes by the target assembly. The shape and density of the plasma across the target sections will be affected by the magnetic field shape and strength (the black rectangles represent the magnets of the cathode) as well as the pressure and power density used to generate the plasma. In this example, the target sections are of different widths and the cathode magnets are arranged asymmetrically, depending upon the desired plasma density profile.

In this example, since there are five target sections, nine deposition zones are established during sputter. As the leading edge of the substrate enters zone 1, TCO material is deposited. This deposition is continued until zone 2 is reached, where a graded mixture of TCO and electrochromic material are deposited. Zone 3 is where electrochromic material is deposited, followed by zone 4 where a mixture of electrochromic material and ion conducting material is deposited. Next, in zone 5, ion conducting material is laid down, followed by zone 6, where a mixture of ion conducting material and counter electrode material is deposited. In zone 7, counter electrode material is deposited, followed by zone 8, where a mixture of counter electrode material and a second TCO material are deposited. Finally, in zone 9, the second TCO material is laid down.

As the substrate exits zone 9, a single layer of material, which comprises five functional regions, a first transparent conducting region, an electrochromic region, an ion conducting region, a counter electrode region and a second transparent conducting region, respectively, has been deposited on the substrate. The functional regions may comprise any of the materials described herein for their respective functions. In one embodiment, the first and second transparent conducting regions comprise ITO, the electrochromic region comprises tungsten oxide, the counter electrode region comprises a base anodically coloring material and one or more additives as described herein, and the ion conducting region comprises at least one of lithium tungstate, silicon-aluminum-oxide lithium silicate, lithium aluminum silicate, lithium aluminum borate, lithium aluminum fluoride, lithium borate, lithium nitride, lithium zirconium silicate, lithium niobate, lithium borosilicate, lithium phosphosilicate and lithium phosphorous oxynitride.

The EC devices and EC elements described herein can include one or more additional layers or regions, respectively, such as one or more passive layers or regions, for example to improve certain optical properties, providing moisture or scratch resistance, to hermetically seal the electrochromic device and the like. Typically, but not necessarily, a capping layer is deposited on an EC stack or EC element. In some embodiments, the capping layer is SiAlO. In some embodiments, the capping layer is deposited by sputtering. In one embodiment, the thickness of a capping layer is between about 30 nm and about 100 nm.

From the discussion above, it should be appreciated that EC devices and EC elements described herein can be made in a single chamber apparatus, for example a sputter tool that has, for example, a tungsten target, a nickel target and a lithium target along with oxygen and argon sputter gases. As mentioned, due to the nature of the interfacial regions formed to serve the purpose of a conventional distinct IC layer, a separate target for sputtering an IC layer is not necessary. For example in certain embodiments, an EC and CE layer are deposited in contact with each other and an interfacial region serving as an IC layer is formed thereafter. In other embodiments a single layer graded composition is fabricated from a target having a composition that substantially reflects the composition of the graded layer. Of particular interest to the inventors is fabricating electrochromic devices and/or EC elements described herein, for example, in a high throughput fashion, therefore it is desirable to have apparatus that can fabricate EC devices and/or EC elements sequentially as substrates pass through an integrated deposition system. For example, the inventors are particularly interested in fabricating electrochromic devices on windows, particularly architectural glass scale windows (supra).

Thus, another embodiment is an apparatus for fabricating an electrochromic device, including: an integrated deposition system including: (i) a first deposition station containing a material source configured to deposit an electrochromic layer including an electrochromic material; and (ii) a second deposition station configured to deposit a counter electrode layer including a counter electrode material; and a controller containing program instructions for passing the substrate through the first and second deposition stations in a manner that sequentially deposits a stack on the substrate, the stack having an intermediate layer sandwiched in between the electrochromic layer and the counter electrode layer; where either or both of the first deposition station and the second deposition station are also configured to deposit the intermediate layer over the electrochromic layer or the counter electrode layer, and where the intermediate layer includes an oxygen rich form of the electrochromic material or the counter electrode material and where the first and second deposition stations are interconnected in series and operable to pass a substrate from one station to the next without exposing the substrate to an external environment. In one embodiment, apparatus described herein are operable to pass the substrate from one station to the next without breaking vacuum and may include one or more lithiation stations operable to deposit lithium from a lithium-containing material source on one or more layers of the electrochromic device. In one embodiment, apparatus described herein are operable to deposit the electrochromic stack on an architectural glass substrate.

In one embodiment, the apparatus is operable to pass the substrate from one station to the next without breaking vacuum. In another embodiment, the integrated deposition system further includes one or more lithiation stations operable to deposit lithium from a lithium-containing material source on at least one of the electrochromic layer, the intermediate layer and the counter electrode layer. In certain embodiments, lithiation may occur through a particular method involving sustained self-sputtering. Such methods are further described in P.C.T. Patent Application No. PCT/US14/35358, filed Apr. 24, 2014, and titled "SUSTAINED SELF-SPUTTERING OF LITHIUM FOR LITHIUM PHYSICAL VAPOR DEPOSITION," which is herein incorporated by reference in its entirety.

In yet another embodiment, the integrated deposition system is operable to deposit the stack on an architectural glass substrate. In one embodiment, the apparatus is operable to pass the substrate across a plurality of closely associated sputter targets such that a single layer graded composition, EC element, is deposited on the substrate in a single pass. In another embodiment, the integrated deposition system further includes a substrate holder and transport mechanism operable to hold the architectural glass substrate in a vertical orientation while passing through the integrated deposition system. In another embodiment, the apparatus further includes one or more load locks for passing the substrate between an external environment and the integrated deposition system. In another embodiment, the apparatus further includes at least one slit valve operable to permit isolation of the one or more lithium deposition stations from at least one of the first deposition station and the second deposition station. In one embodiment, the integrated deposition system includes one or more heaters configured to heat the substrate.

Figure 5:
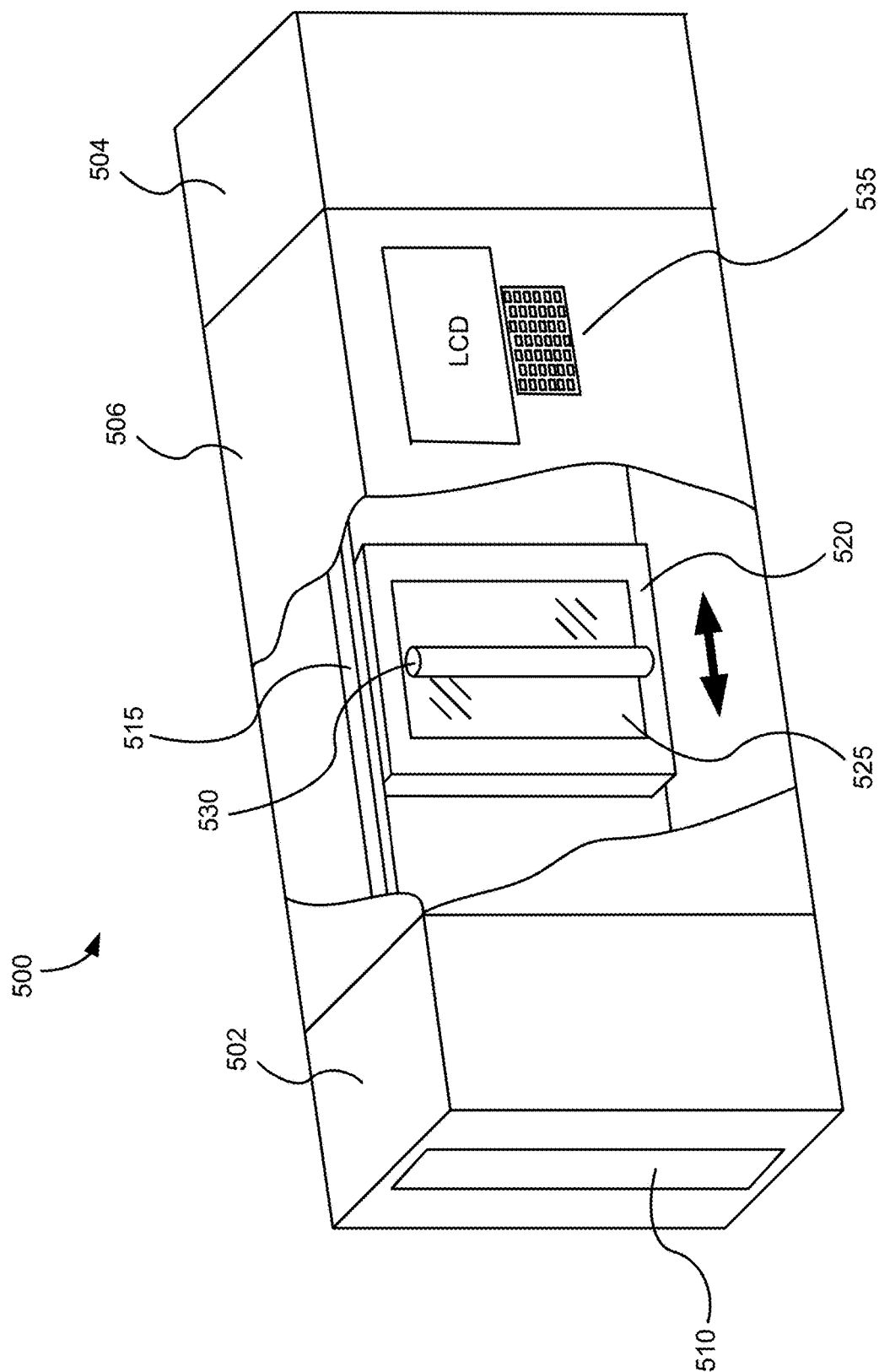
FIG. 5 depicts an integrated deposition system in a perspective view.

FIG. 5 depicts a simplified representation of an integrated deposition system 500 in a perspective view and with more detail including a cutaway view of the interior. In this example, system 500 is modular, where entry load lock 502 and exit load lock 504 are connected to deposition module 506. There is an entry port, 510, for loading, for example, architectural glass substrate 525 (load lock 504 has a corresponding exit port). Substrate 525 is supported by a pallet, 520, which travels along a track, 515. In this example, pallet 520 is supported by track 515 via hanging but pallet 520 could also be supported atop a track located near the bottom of apparatus 500 or a track, for example mid-way between top and bottom of apparatus 500. Pallet 520 can translate (as indicated by the double headed arrow) forward and/or backward through system 500. For example during lithium deposition, the substrate may be moved forward and backward in front of a lithium target, 530, making multiple passes in order to achieve a desired lithiation. This function is not limited to lithium targets, however, for example a tungsten target may pass multiple times past a substrate, or the substrate may pass by via forward/backward motion path in front of the tungsten target to deposit, for example, an electrochromic layer. Pallet 520 and substrate 525 are in a substantially vertical orientation. A substantially vertical orientation is not limiting, but it may help to prevent defects because particulate matter that may be generated, for example, from agglomeration of atoms from sputtering, will tend to succumb to gravity and therefore not deposit on substrate 525. Also, because architectural glass substrates tend to be large, a vertical orientation of the substrate as it traverses the stations of the integrated deposition system enables coating of thinner glass substrates since there are fewer concerns over sag that occurs with thicker hot glass. Further details regarding the deposition system and a mechanism for supporting the substrate during deposition are discussed in P.C.T. Patent Application No. PCT/US14/41569, filed Jun. 9, 2014, and titled "GLASS PALLET FOR SPUTTERING SYSTEMS," which is herein incorporated by reference in its entirety.

Target 530, in this case a cylindrical target, is oriented substantially parallel to and in front of the substrate surface where deposition is to take place (for convenience, other sputter means are not depicted here). Substrate 525 can translate past target 530 during deposition and/or target 530 can move in front of substrate 525. The movement path of target 530 is not limited to translation along the path of substrate 525. Target 530 may rotate along an axis through its length, translate along the path of the substrate (forward and/or backward), translate along a path perpendicular to the path of the substrate, move in a circular path in a plane parallel to substrate 525, etc. Target 530 need not be cylindrical, it can be planar or any shape necessary for deposition of the desired layer with the desired properties. Also, there may be more than one target in each deposition station and/or targets may move from station to station depending on the desired process. The various stations of an integrated deposition system described herein may be modular, but once connected, form a continuous system where a controlled ambient environment is established and maintained in order to process substrates at the various stations within the system.

More detailed aspects of how electrochromic materials are deposited using integrated deposition system 500 are described in U.S. Non-Provisional patent application Ser. Nos. 12/645,111 and 12/645,159, supra.

Integrated deposition system 500 also has various vacuum pumps, gas inlets, pressure sensors and the like that establish and maintain a controlled ambient environment within the system. These components are not shown, but rather would be appreciated by one of ordinary skill in the art. System 500 is controlled, for example, via a computer system or other controller, represented in FIG. 5 by an LCD and keyboard, 535. One of ordinary skill in the art would appreciate that embodiments described herein may employ various processes involving data stored in or transferred through one or more computer systems. Embodiments described herein also relate to the apparatus, such computers and microcontrollers, for performing these operations. These apparatus and processes may be employed to deposit electrochromic materials of methods described herein and apparatus designed to implement them. The control apparatus described herein may be specially constructed for the required purposes, or it may be a general-purpose computer selectively activated or reconfigured by a computer program and/or data structure stored in the computer. The processes presented herein are not inherently related to any particular computer or other apparatus. In particular, various general-purpose machines may be used with programs written in accordance with the teachings herein, or it may be more convenient to construct a more specialized apparatus to perform and/or control the required method and processes.

Embodiments that describe fabrication of single layer graded composition EC elements can be made in a similar apparatus to that described in relation to FIG. 5, with appropriate configuration of target assemblies and the like. One embodiment is an integrated deposition system for fabricating an electrochromic window, the system comprising: a plurality of closely associated sputter targets operable to pass a substrate from one sputter to the next without exposing the substrate to an external environment, wherein the plurality of closely associated sputter targets comprise (i) a first sputter target containing a material source for depositing an electrochromic material; (ii) an optional second sputter target containing a material source for depositing an ion conducting material; and (iii) a third sputter target containing a material source for depositing a counter electrode material (e.g., a base anodically coloring material and/or an additive as described herein, either or both optionally in oxide form); and a controller containing program instructions for passing the substrate by the plurality of closely associated sputter targets in a manner that deposits on the substrate a single layer graded composition including: (i) an electrochromic region, (ii) an optional ion conducting region, and (iii) a counter electrode region. In one embodiment, the system is operable to pass the substrate past the plurality of closely associated sputter targets without breaking vacuum. In one embodiment, the system is configured to deposit the single layer graded composition on an architectural glass substrate of at least six feet by ten feet. In another embodiment, the system further includes a substrate holder and transport mechanism operable to hold the architectural glass substrate in a substantially vertical orientation while in the system. The system may further include one or more load locks for passing the substrate between an external environment and the integrated deposition system. In one embodiment, the system further includes one or more lithium deposition stations, each comprising a lithium-containing material source. These stations can be used to lithiate the EC element should that be desirable. In one embodiment, the system includes at least two lithium deposition stations. The system may therefore include at least one slit valve operable to permit isolation a lithium deposition station, apart from the plurality of closely associated sputter targets. In one embodiment, the system can be configured to accommodate a target having a composition that substantially reflects the composition of an EC element to be deposited. Such targets are contemplated to be wider in some instances that a traditional sputter target, depending upon the desired thickness of the single layer graded composition film and the switching characteristics desired.

From the description above, particularly of FIGS. 3A-3B, it can be seen that with methods described herein, one can not only make electrochromic devices, but also prefabricate a layered stack, for example 400, 403 and 409, that can in some cases be converted through subsequent processing, for example as described herein, to an electrochromic device. Though not functional electrochromic devices, by virtue of not having an ion conducting and electronically-insulating region between the EC and CE layers, such "electrochromic device precursors" can be of particular value. This is especially true if the device precursors are manufactured in a high purity, integrated processing apparatus as described herein, where the material layers are all deposited under a controlled ambient environment where, for example, vacuum is never broken. In that way, high purity, low-defect materials are stacked and essentially "sealed," for example, by the final TCO layer and/or a capping layer prior to leaving the integrated system.

Like the electrochromic devices described above, electrochromic device precursors can also include one or more additional layers (not shown) such as one or more passive layers, for example to improve certain optical properties, providing moisture or scratch resistance, to hermetically seal the device precursor and the like. In one embodiment, a capping layer is deposited on the TCO layer of the precursor stack. In some embodiments, the capping layer is SiAlO. In some embodiments, the capping layer is deposited by sputtering. In one embodiment, the thickness of a capping layer is between about 30 nm and about 100 nm. Subsequent processing with the cap layer in place forms the IC layer without contamination from the environment, that is, with the additional protection of the capping layer.

In some embodiments, a capping layer includes a material that is similar in composition to the counter electrode material. For example, a capping layer may include the same elements at different relative concentrations compared to the CE layer. In a particular embodiment, the CE layer may be deposited as two sub-layers having slightly different compositions, where the second sub-layer (the one farther away from the EC layer) acts as the capping layer. The partially fabricated device may be lithiated between deposition of the two CE sub-layers. In one implementation, a first sub-layer of counter electrode material (e.g., NiWO or another CE material as described herein) is deposited on either an IC material or on a cathodically coloring EC material. After deposition of the first sub-layer, the partially fabricated device is lithiated. Next, a second sub-layer of counter electrode material (e.g., NiWO or another CE material as described herein) is deposited on the first sub-layer. The second sub-layer may be more electronically insulating than the first sub-layer. The second sub-layer may or may not have color switching properties, or may exhibit such properties to a lesser extent than the first sub-layer. The first and second sub-layers may have different compositions, though they may be made of the same collection of elements.

Conversion of an EC device precursor to a functional electrochromic device can occur outside the integrated system if desired, since the internal stack structure is protected from the outside environment and somewhat less stringent purity conditions are necessary for the last conditioning steps to convert the precursor stack to the functional device. Such stacked electrochromic device precursors can have advantages, for example, longer lifespan due to conversion to the electrochromic device only when needed, flexibility by having, for example, a single precursor stack that can be stored and used when conversion parameters are improved or fed to different conversion chambers and/or customer sites for conversion depending on the needs of the final product and quality standards that must be met. Also such precursor stacks are useful for testing purposes, for example, quality control or research efforts.

Accordingly, one embodiment is an electrochromic device precursor including: (a) a substrate; (b) a first transparent conducting oxide layer on the substrate; (c) a stack on the first transparent conducting oxide layer, the stack including: (i) an electrochromic layer including an electrochromic material, and (ii) a counter electrode layer including a counter electrode material; where the stack does not include an ion conducting and electronically-insulating region between the electrochromic layer and the counter electrode layer; and (d) a second transparent conducting oxide layer on top of the stack. In one embodiment, the electrochromic layer includes tungsten oxide and the counter electrode layer comprises nickel tungsten oxide or another counter electrode material as described herein (e.g., a material that includes a base anodically coloring material and one or more additives). In one embodiment, at least one of the stack and the electrochromic layer contain lithium. In another embodiment, the electrochromic layer is tungsten oxide with super-stoichiometric oxygen content at least at the interface with the counter electrode layer. In another embodiment, the stack includes an IC precursor layer between the counter electrode layer and the electrochromic layer, the IC precursor layer including tungsten oxide with higher oxygen content than that of the electrochromic layer. In one embodiment, where there is no IC precursor layer between the EC and CE layers, the electrochromic layer is between about 500 nm and about 600 nm thick and the counter electrode layer is between about 150 nm and about 300 nm thick. In another embodiment, where there is an IC precursor layer between the EC and CE layers, the electrochromic layer is between about 350 nm and about 400 nm thick, the IC precursor layer is between about 20 nm and about 100 nm thick, and the counter electrode layer is between about 150 nm and about 300 nm thick. In one embodiment, precursor devices described herein are exposed to heating to convert them to functional electrochromic devices. In one embodiment, the heating is part of an MTCC.

Another embodiment is an electrochromic device including: (a) an electrochromic layer including an electrochromic material, and (b) a counter electrode layer including a counter electrode material, where the device does not contain a compositionally homogeneous layer of electronically-insulating, ion conducting material between the electrochromic layer and the counter electrode layer. In one embodiment, the electrochromic material is tungsten oxide, the counter electrode material is nickel tungsten oxide (or another counter electrode material including a base anodically coloring material and one or more additives as described herein), and between the electrochromic layer and the counter electrode layer is an interfacial region including a mixture of lithium tungstate and at least one of tungsten oxide and nickel tungsten oxide (or other counter electrode material). In another embodiment, the electrochromic layer is between about 300 nm and about 500 nm thick; the interfacial region is between about 10 nm and about 150 nm thick, and the counter electrode layer is between about 150 nm and about 300 nm thick.

EXAMPLES

Figure 6:
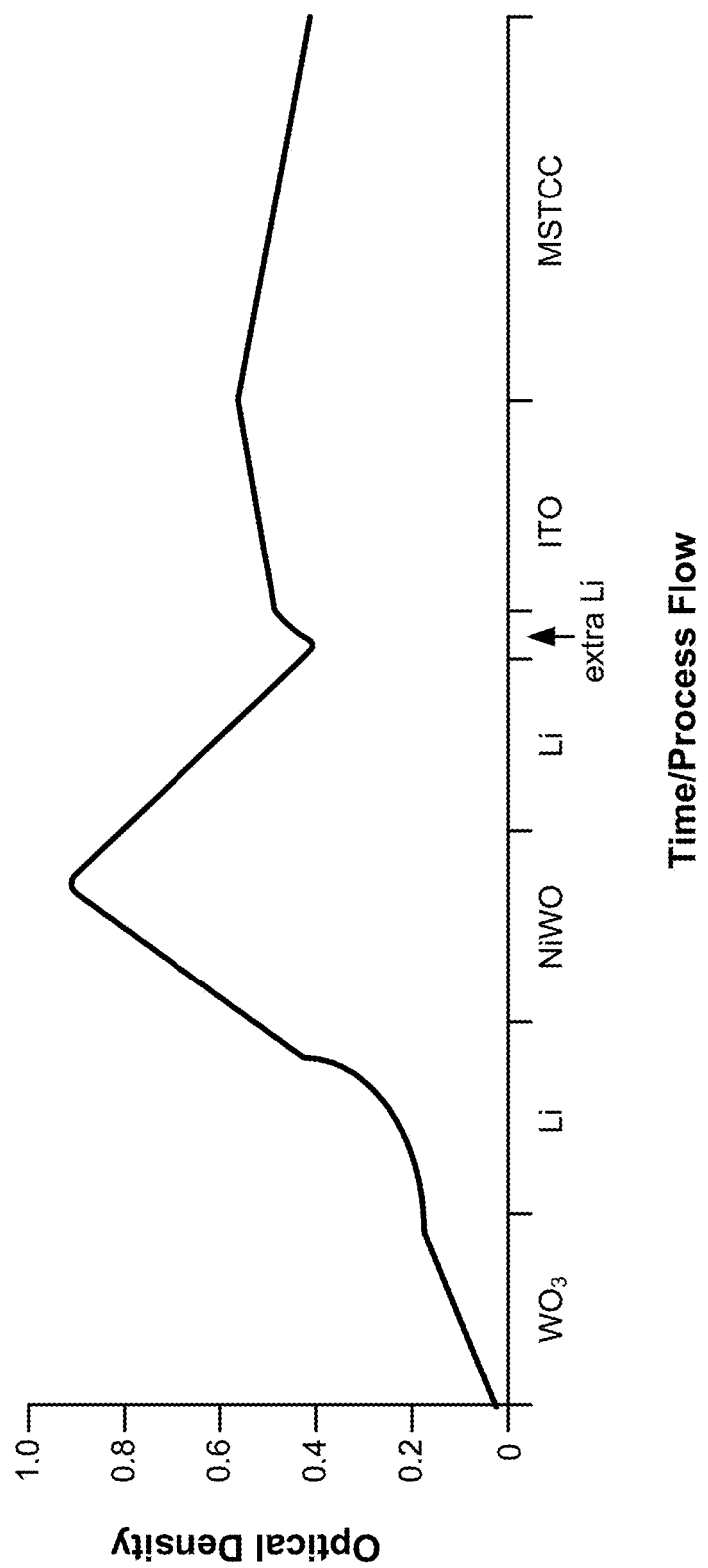
FIG. 6 is a graph showing how process parameters and endpoint readouts correlate during formation of an electrochromic stack in accord with embodiments described herein.

FIG. 6 is a graph of a process flow used as a protocol for fabricating electrochromic devices. The y axis units are optical density and the x axis units are time/process flow. In this example, an electrochromic device is fabricated analogous to that described in relation to FIG. 4A, where the substrate is glass with fluorinated tin oxide as the first TCO, the EC layer is $WO_3$ with excess oxygen in the matrix (for example, sputtered using the tungsten target, where the sputter gas is about 60% $O_2$ and about 40% Ar), the CE layer is formed atop the EC layer and is made of NiWO and the second TCO is indium tin oxide (ITO). Lithium is used as the ion source for the electrochromic transition. In a similar embodiment, an electrochromic device may be fabricated to include a different counter electrode material as described herein, and may or may not have a different electrochromic material.

Optical density is used to determine endpoints during fabrication of the electrochromic device. Starting at the origin of the graph, optical density is measured as the EC layer, $WO_3$, is deposited on the substrate (glass+TCO). The optical density of the glass substrate has a baseline value optical density of about 0.07 (absorbance units). The optical density increases from that point as the EC layer builds, because tungsten oxide, although substantially transparent, absorbs some visible light. For a desired thickness of the tungsten oxide layer about 550 nm thick, as described above, the optical density rises to about 0.2. After deposition of the tungsten oxide EC layer, lithium is sputtered on the EC layer as indicated by the first time period denoted "Li." During this period, the optical density increases along a curve further to about 0.4, indicating that the blind charge of the tungsten oxide has been satisfied, as tungsten oxide colors as lithium is added. The time period denoted "NiWO" indicates deposition of the counter electrode layer, during which the optical density increases because the counter electrode material (e.g., NiWO in FIG. 6, though other materials may also be used) is colored. The optical density increases further during counter electrode material deposition, from about 0.4 to about 0.9 for the addition of a NiWO layer about 230 nm thick. Note that some lithium may diffuse from the EC layer to the CE layer as the counter electrode is deposited. This serves to maintain the optical density at a relatively lower value during the counter electrode deposition, or at least during the initial phase of the deposition.

The second time period denoted "Li" indicates addition of lithium to the counter electrode layer. The optical density decreases from about 0.9 to about 0.4 during this phase because lithiation of the counter electrode material bleaches the counter electrode material. Lithiation is carried out until the counter electrode material is bleached, including a local minima at about 0.4 optical density. The optical density bottoms out at about 0.4 because the $WO_3$ layer is still lithiated and accounts for the optical density. Next, as indicated by time period "extra Li" additional lithium is sputtered onto the counter electrode layer, in this example about 10% additional lithium as compared to that added to the counter electrode to bleach it. During this phase the optical density increases slightly. Next the indium tin oxide TCO is added, as indicated by "ITO" in the graph. Again, the optical density continues to rise slightly during formation of the indium tin oxide layer, to about 0.6. Next, as indicated by time period denoted "MSTCC" the device is heated to about 250° C., for about 15 minutes under Ar, and then about 5 minutes under $O_2$. Then the device is annealed in air at about 300° C. for about 30 minutes. During this time, the optical density decreases to about 0.4. Thus optical density is a useful tool for fabricating devices, for example for determining layer thickness based on material deposited and morphology, and especially for titrating lithium onto the various layers for satisfying blind charge and/or reaching a bleached state.

Figure 7:
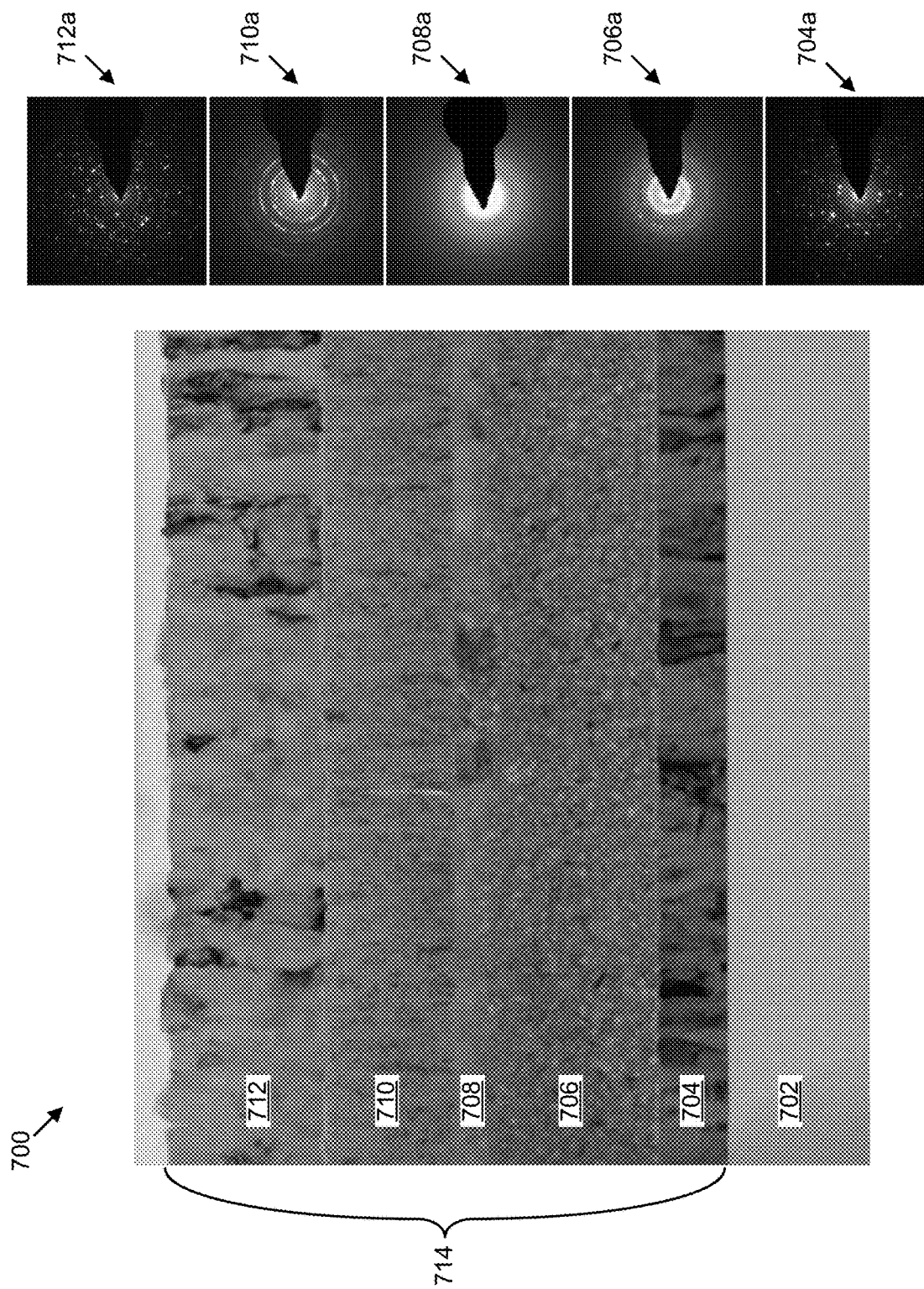
FIGS. 7 and 8A-8C are actual cross-sections of electrochromic devices made using methods in accord with embodiments described herein.

FIG. 7 shows a cross section TEM of an electrochromic device 700 fabricated using methods described herein, consistent with the protocol as described in relation to FIG. 6. Device 700 has a glass substrate 702 upon which an electrochromic stack, 714, is formed. Substrate 702 has an ITO layer, 704, which serves as the first TCO. A tungsten oxide EC layer, 706, is deposited on TCO 704. Layer 706 was formed at a thickness of about 550 nm, that is, $WO_3$ formed via sputtering tungsten with oxygen and argon as described above in relation to FIG. 6. To the EC layer was added lithium. Then a CE layer, 710, of NiWO, about 230 nm thick, was added followed by addition of lithium to bleach and then about 10% excess. Finally an indium tin oxide layer, 712, was deposited and the stack was subjected to multistep thermochemical conditioning as described above in relation to FIG. 4A. After the MSTCC, this TEM was taken. As seen, a new region, 708, which is ion conducting electronically-insulating, was formed.

FIG. 7 also shows five selected area electron diffraction (SAED) patterns for the various layers. First, 704a, indicates that the ITO layer is highly crystalline. Pattern 706a shows that the EC layer is polycrystalline. Pattern 708a shows that the IC layer is substantially amorphous. Pattern 710a shows that the CE layer is polycrystalline. Finally, pattern 712a shows that the indium tin oxide TCO layer is highly crystalline.

Figure 8A:
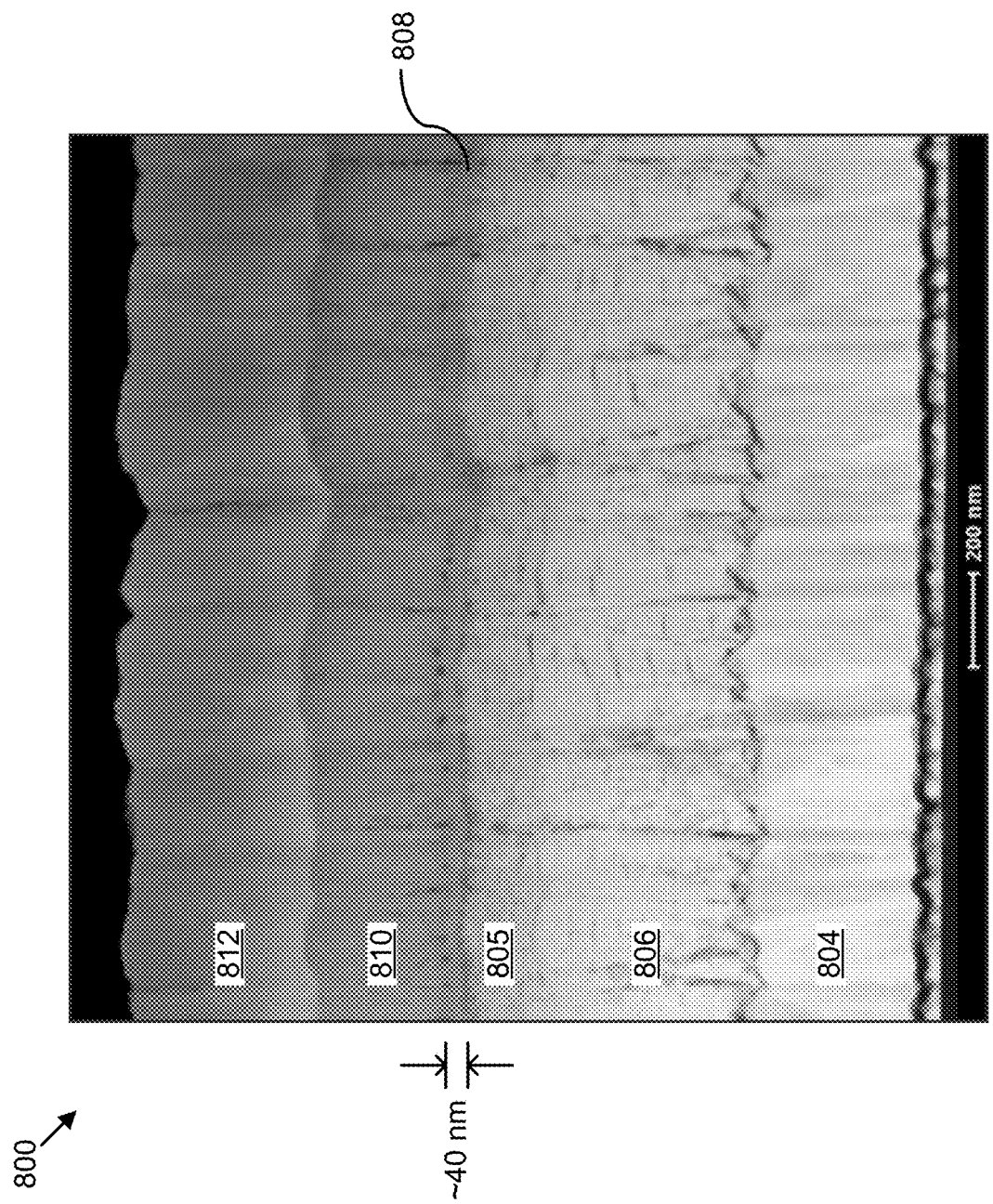

FIG. 8A is a cross section of a device, 800, analyzed by scanning transmission electron microscopy (STEM). In this example, device 800 was fabricated using methods described herein, consistent with the protocol as described in relation to FIG. 4B. Device 800 is an electrochromic stack formed on a glass substrate (not labeled). On the glass substrate is a fluorinated tin oxide layer, 804, which serves as the first TCO (sometimes called a "TEC" layer, for transparent electronic conductor"). A tungsten oxide EC layer, 806, was deposited on TCO 804. In this example, layer 806 was formed at a thickness of about 400 nm, that is, $WO_3$ formed via sputtering tungsten with oxygen and argon as described above in relation to FIG. 6, then an oxygen rich precursor layer, 805, was deposited to a thickness of about 150 nm. To layer 805 was added lithium. Then a CE layer, 810, of NiWO, about 230 nm thick, was added followed by addition of lithium to bleach and then about 10% excess. Finally an indium tin oxide layer, 812, was deposited and the stack was subjected to multistep thermochemical conditioning as described above in relation to FIG. 4B. After the MSTCC, this STEM was taken. As seen, a new region, 808, which is ion conducting electronically-insulating, was formed. The difference between this example and the embodiment described in relation to FIG. 4B, is that here the oxygen rich layer 805, unlike analogous layer 405 in FIG. 4B, was only partially converted to the interfacial region 808. In this case only about 40 nm of the 150 nm of oxygen rich precursor layer 405 was converted to the region serving as the ion conducting layer.

Figure 8C:
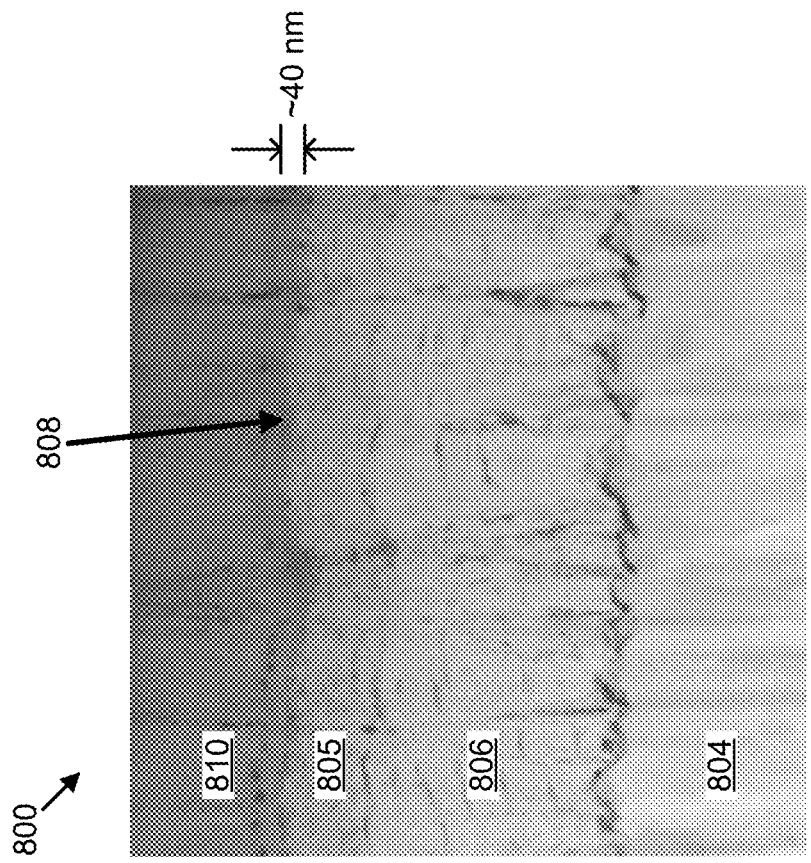
Figure 8B:
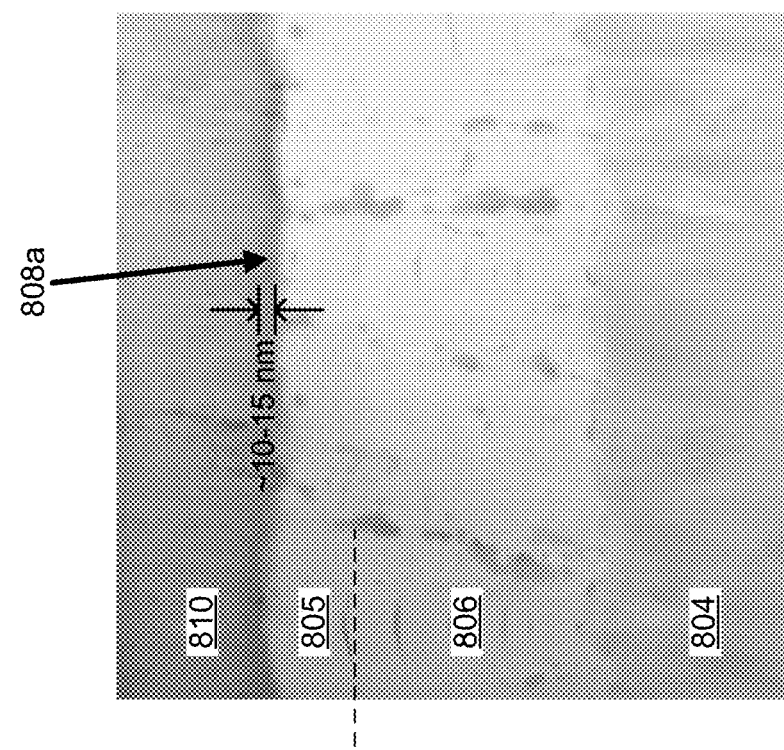

FIGS. 8B and 8C show a "before and after" comparison of device, 800, (FIG. 8C) and the device precursor (FIG. 8B) before multistep thermochemical conditioning as analyzed by STEM. In this example, only layers 804-810, EC through CE, are depicted. The layers are numbered the same as in FIG. 8A, with a few exceptions. The dotted line in FIG. 8B is used to approximately demark the interface of EC layer 806 and oxygen rich layer 805 (this is more apparent in FIG. 8C). Referring again to FIG. 8B, it appears that at least there is lithium, as indicated by 808a, concentrated (approximately 10-15 nm thick region) at the interface of oxygen rich layer 805 and CE layer 810. After MTCC, FIG. 8C, it is clear that interfacial region 808 has formed.

Although the foregoing has been described in some detail to facilitate understanding, the described embodiments are to be considered illustrative and not limiting. It will be apparent to one of ordinary skill in the art that certain changes and modifications can be practiced within the scope of the appended claims.

What is claimed is:

1. A method of fabricating an electrochromic device, the method comprising:
    (a) forming a cathodically coloring layer comprising a cathodically coloring electrochromic material;
    (b) forming an anodically coloring layer comprising an anodically coloring electrochromic material and one or more additives, wherein the cathodically coloring layer and the anodically coloring layer are in contact with one another to form a stack;
    (c) exposing the stack to lithium; and
    (d) heating the stack to form an ionically conducting and electrically insulating material at an interface between the cathodically coloring layer and the anodically coloring layer.

2. The method of claim 1, wherein (a) comprises forming a superstoichiometric oxygenated form of the cathodically coloring electrochromic material.

3. The method of claim 1, wherein the cathodically coloring electrochromic material comprises at least one metal oxide selected from the group consisting of: tungsten oxide, molybdenum oxide, niobium oxide, titanium oxide, vanadium oxide, and combinations thereof.

4. The method of claim 3, wherein the cathodically coloring electrochromic material comprises tungsten oxide mixed with at least one metal oxide selected from the group consisting of: molybdenum oxide, titanium oxide, and vanadium oxide.

5. The method of claim 4, wherein the cathodically coloring electrochromic material comprises tungsten oxide mixed with molybdenum oxide and titanium oxide.

6. The method of claim 1, wherein (a) comprises forming a superstoichiometric oxygenated form of the anodically coloring electrochromic material.

7. The method of claim 1, wherein the anodically coloring electrochromic material comprises at least one metal oxide selected from the group consisting of: cobalt oxide, chromium oxide, iron oxide, iridium oxide, manganese oxide, nickel oxide, rhodium oxide, ruthenium oxide, vanadium oxide, and combinations thereof.

8. The method of claim 7, wherein the anodically coloring electrochromic material comprises nickel oxide, and wherein the additives comprise tungsten and tantalum.

9. The method of claim 7, wherein the anodically coloring electrochromic material comprises nickel oxide, and wherein the additives comprise tungsten and niobium.

* * * * *